United States Patent
Verma et al.

(10) Patent No.: US 7,970,979 B1
(45) Date of Patent: Jun. 28, 2011

(54) SYSTEM AND METHOD OF CONFIGURABLE BUS-BASED DEDICATED CONNECTION CIRCUITS

(75) Inventors: Hare Krishna Verma, Cupertino, CA (US); Manoj Gunwani, San Jose, CA (US); Ravi Sunkavalli, Milpitas, CA (US)

(73) Assignee: Agate Logic, Inc., Cupertino, CA (US)

( * ) Notice: Subject to any disclaimer, the term of this patent is extended or adjusted under 35 U.S.C. 154(b) by 223 days.

(21) Appl. No.: 11/857,661

(22) Filed: Sep. 19, 2007

(51) Int. Cl.
| G06F 13/00 | (2006.01) |
| G06F 13/12 | (2006.01) |
| G06F 13/38 | (2006.01) |
| G06F 13/40 | (2006.01) |
| G06F 7/38  | (2006.01) |
| H03K 19/173 | (2006.01) |
| H03K 19/177 | (2006.01) |

(52) U.S. Cl. ............ 710/316; 710/66; 710/307; 326/37; 326/38; 326/39

(58) Field of Classification Search .................... 710/66, 710/307, 316, 317; 326/37–39
See application file for complete search history.

(56) References Cited

U.S. PATENT DOCUMENTS

| 4,440,058 A * | 4/1984 | Bass et al. .................. 84/607 |
| 4,598,400 A * | 7/1986 | Hillis ............................ 370/400 |
| 5,016,163 A * | 5/1991 | Jesshope et al. ............. 710/316 |
| 5,274,763 A * | 12/1993 | Banks ........................... 710/316 |
| 5,287,345 A * | 2/1994 | Osmon et al. ..................... 700/2 |
| 5,485,627 A * | 1/1996 | Hillis ............................ 712/13 |
| 5,530,813 A * | 6/1996 | Paulsen et al. ................ 710/317 |
| 5,729,756 A * | 3/1998 | Hayashi ......................... 712/15 |
| 5,787,007 A * | 7/1998 | Bauer .......................... 716/117 |
| 5,828,858 A * | 10/1998 | Athanas et al. .............. 710/317 |
| 5,847,578 A * | 12/1998 | Noakes et al. ................. 326/39 |
| 5,940,085 A * | 8/1999 | Chandavarker et al. ...... 345/471 |
| 5,991,817 A * | 11/1999 | Rowett et al. ................. 709/250 |
| 6,020,760 A * | 2/2000 | Sample et al. .................. 326/41 |
| 6,026,227 A * | 2/2000 | Furtek et al. ................... 326/40 |
| 6,046,603 A * | 4/2000 | New ............................... 326/38 |
| 6,081,129 A * | 6/2000 | Apland et al. .................. 326/41 |
| 6,085,275 A * | 7/2000 | Gallup et al. ................. 710/316 |
| 6,094,066 A * | 7/2000 | Mavis ............................. 326/41 |

(Continued)

FOREIGN PATENT DOCUMENTS

EP          1063529 A1 * 12/2000

(Continued)

OTHER PUBLICATIONS

"NN9007117: Diagnostic Scan Design and Operational Self-Healing with Programmable Logic Cell Arrays", Jul. 1, 1990, IBM, IBM Technical Disclosure Bulletin, vol. 33, Iss. 2, pp. 117-120.*

(Continued)

Primary Examiner — Faisal M Zaman
(74) Attorney, Agent, or Firm — Radlo & Su LLP

(57) ABSTRACT

A high performance field programmable gate array is described with one or more signal processing engines coupled to a programmable logic fabric. Each signal processing engine includes a signal processing unit for performing specifying tasks and a bus-based configurable connection box for routing a bus-based input to a bus-based output. The signal processing unit has a floating point unit (FPU)/multiply accumulate (MAC) for computation and register files for storing information. The programmable logic fabric is coupled to the one or more signal processing engines for routing of information between the signal processing engines.

16 Claims, 16 Drawing Sheets

U.S. PATENT DOCUMENTS

| | | | |
|---|---|---|---|
| 6,101,565 A * | 8/2000 | Nishtala et al. | 710/307 |
| 6,204,689 B1 * | 3/2001 | Percey et al. | 326/41 |
| 6,289,494 B1 * | 9/2001 | Sample et al. | 716/104 |
| 6,462,578 B2 * | 10/2002 | Ting | 326/41 |
| 6,662,313 B1 * | 12/2003 | Swanson et al. | 714/39 |
| 6,691,198 B1 * | 2/2004 | Hamlin | 710/305 |
| 6,693,456 B2 * | 2/2004 | Wong | 326/41 |
| 6,781,407 B2 * | 8/2004 | Schultz | 326/41 |
| 7,028,281 B1 * | 4/2006 | Agrawal et al. | 326/41 |
| 7,032,038 B1 * | 4/2006 | Squires | 710/8 |
| 7,155,557 B2 * | 12/2006 | Meier | 710/316 |
| 7,176,717 B2 * | 2/2007 | Sunkavalli et al. | 326/41 |
| 7,185,174 B2 * | 2/2007 | Stewart et al. | 712/11 |
| 7,193,437 B2 * | 3/2007 | Cappelli et al. | 326/41 |
| 7,355,443 B2 * | 4/2008 | Leijten-Nowak et al. | 326/41 |
| 7,358,765 B2 | 4/2008 | Verma et al. | |
| 7,368,941 B2 | 5/2008 | Verma et al. | |
| 7,408,383 B1 * | 8/2008 | Feng et al. | 326/41 |
| 7,414,431 B2 | 8/2008 | Verma et al. | |
| 7,414,432 B2 | 8/2008 | Verma et al. | |
| 7,417,456 B2 | 8/2008 | Verma et al. | |
| 7,430,697 B1 * | 9/2008 | Pabari | 714/724 |
| 7,439,768 B2 | 10/2008 | Verma et al. | |
| 7,486,111 B2 * | 2/2009 | Madurawe | 326/38 |
| 7,605,605 B2 | 10/2009 | Verma et al. | |
| 7,728,623 B2 | 6/2010 | Verma et al. | |
| 2006/0158219 A1 * | 7/2006 | Sunkavalli et al. | 326/41 |
| 2007/0008763 A1 * | 1/2007 | Choi | 365/63 |
| 2007/0085565 A1 | 4/2007 | Verma et al. | |

FOREIGN PATENT DOCUMENTS

| | | | |
|---|---|---|---|
| EP | 1271783 A2 * | 1/2003 | |
| JP | 07319925 A * | 12/1995 | |
| JP | 09064188 A * | 3/1997 | |
| JP | 10070193 A * | 3/1998 | |
| JP | 2003324344 A * | 11/2003 | |
| WO | WO 2006076276 A2 * | 7/2006 | |

OTHER PUBLICATIONS

Anderson, J.H.; Najm, F.N.; , "Low-Power Programmable FPGA Routing Circuitry," Very Large Scale Integration (VLSI) Systems, IEEE Transactions on , vol. 17, No. 8, pp. 1048-1060, Aug. 2009.*

Wu, Y.-L.; Marek-Sadowska, M.; , "Graph based analysis of FPGA routing," Design Automation Conference, 1993, with EURO-VHDL '93. Proceedings EURO-DAC '93. European , pp. 104-109, Sep. 20-24, 1993.*

Alexander, M.J.; Robins, G.; , "New performance-driven FPGA routing algorithms," Computer-Aided Design of Integrated Circuits and Systems, IEEE Transactions on , vol. 15, No. 12, pp. 1505-1517, Dec. 1996.*

U.S. Appl. No. 11/344,694, Unpublished, (filed Feb. 1, 2006) (Hare K. Verma et al., applicant).

* cited by examiner

|     | ILRC | OLRC | ILRC | OLRC | ILRC | OLRC | ILRC | OLRC |     |
|-----|------|------|------|------|------|------|------|------|-----|
|     | ⋮ | ⋮ | ⋮ | ⋮ | | | | | |

|  | | | | |
|---|---|---|---|---|
| | 266 DLC | 276 DLC | 286 DLC | 296 DLC | |
| | 266-1 LRC | 276-1 LRC | 286-1 LRC | 296-1 LRC | 256 |
| 253 LRB | 266-2 LRC | 276-2 LRC | 286-2 LRC | 296-2 LRC | LRB |
| | 265 DLC | 275 DLC | 285 DLC | 295 DLC | |
| | 265-1 LRC | 275-1 LRC | 285-1 LRC | 295-1 LRC | |
| | 265-2 LRC | 275-2 LRC | 285-2 LRC | 295-2 LRC | |
| | 264 DLC | 274 DLC | 284 DLC | 294 DLC | |
| | 264-1 LRC | 274-1 LRC | 284-1 LRC | 294-1 LRC | 255 |
| 252 LRB | 264-2 LRC | 274-2 LRC | 284-2 LRC | 294-2 LRC | LRB |
| | 263 DLC | 273 DLC | 283 DLC | 293 DLC | |
| | 263-1 LRC | 273-1 LRC | 283-1 LRC | 293-1 LRC | |
| | 263-2 LRC | 273-2 LRC | 283-2 LRC | 293-2 LRC | |
| | 262 DLC | 272 DLC | 282 DLC | 292 DLC | |
| | 262-1 LRC | 272-1 LRC | 282-1 LRC | 292-1 LRC | 254 |
| 251 LRB | 262-2 LRC | 272-2 LRC | 282-2LRC | 292-2 LRC | LRB |
| | 261 DLC | 271 DLC | 281 DLC | 291 DLC | |
| | 261-1 LRC | 271-1 LRC | 281-1 LRC | 291-1 LRC | |
| | 261-2 LRC | 271-2 LRC | 281-1 LRC | 291-1 LRC | |
| | 260 level 0 (first column) | 270 level 1 (second column) | 280 level 2 (third column) | 290 level 3 (fourth column) | | levels of DLC

SYSTEM AND METHOD OF CONFIGURABLE BUS-BASED DEDICATED CONNECTION CIRCUITS

CROSS REFERENCE TO RELATED APPLICATIONS

This application relates to a concurrently filed and co-pending U.S. patent application Ser. No. 11/857,858, filed on 19 Sep. 2007, entitled "System and Method of Signal Processing Engines with Programmable Logic Fabric" by Hare K. Verma et al., owned by the assignee of this application and incorporated herein by reference.

COPYRIGHT NOTICE

A portion of the disclosure of this patent document contains material that is subject to copyright protection. The copyright owner has no objection to the reproduction of the patent document or the patent disclosure in exactly the form it appears in the Patent and Trademark Office patent file or records, but otherwise reserves all copyright rights whatsoever.

BACKGROUND INFORMATION

1. Field of the Invention

The present invention relates generally to programmable integrated circuits (ICs), and more particularly to signal processing in field programmable gate arrays (FPGAs).

2. Description of Related Art

Field programmable gate arrays are often selected by design engineers to provide a flexible approach in programming and re-programming integrated circuits in order to accommodate a system specification, correct errors in the system, or make improvements to the system by reprogramming the FPGA. One conventional field programmable gate array architecture is implemented using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switchbox. The look-up table outputs are directly fed to other look-up tables as well as the elements within the look-up tables, but the connections to other look-up tables' inputs are made through the switchbox.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box.

Efforts have been mounted to improve the overall performance of field programmable gate arrays. It is desirable to have a method that improves the performance of programmable integrated circuits for use with innovative hardware solutions.

SUMMARY OF THE INVENTION

A high performance field programmable gate array is described with one or more signal processing engines coupled to a programmable logic fabric. Each signal processing engine includes a signal processing unit for performing specifying tasks and a bus-based configurable connection box for routing a bus-based input to a bus-based output. The programmable logic fabric is coupled to the one or more signal processing engines for routing of information between the signal processing engines. The signal processing engines can operate collectively in a serial chain of a complex function like a finite impulse response. The signal processing engines can also operate as a combination of serial and parallel processing of a complex function such as infinite impulse response.

Embodiments of a signal processing unit comprise one or more floating point units (FPUs)/multiply accumulate (MAC), one or more register files, and one or more dual port memories. Each floating point unit and multiply accumulate performs a computational operation. Each register file stores information in the signal processing unit. Each dual port memory has an independent read or write port so that each port can be independently configured with a desirable width.

The bus-based configurable connection box receives a bus-based input from any direction and routes the bus-based input to any output direction. The routing of a bus-based input to a bus-based output is conducted through a multiplexer in the bus-based configurable connection box. For example, if the bus-based configurable connection box is articulated as having four compass directions, a North compass direction, a South compass direction, a West compass direction and an East compass direction. Each compass direction in the North, South, West and East compass directions have bus-based inputs and bus-based outputs. In the North compass direction, there are a plurality of bus-based inputs from the North direction and a plurality of bus-based outputs to the North direction. In the South compass direction, there are a plurality of bus-based inputs from the South direction and a plurality of bus-based outputs to the South direction. In the West compass direction, there are a plurality of bus-based inputs from the West direction and a plurality of bus-based outputs to the West direction. In the East compass direction, there are a plurality of bus-based inputs from the East direction and a plurality of bus-based outputs to the East direction.

The bus-based configurable connection box also has additional bus-based inputs and bus-based outputs coupled to the programmable logic fabric. In one embodiment, the programmable logic fabric couples to bus-based inputs in the West compass direction, and couples to bus-based outputs in the West compass direction. The programmable logic fabric further couples to bus-based inputs in the East compass direction, and couples to bus-based outputs in the East compass direction. Optionally, the programmable logic fabric also couples to bus-based inputs in the North compass direction and couples to bus-based outputs in the North compass direction, as well as couples to bus-based inputs in the South compass direction, and couples to bus-based outputs in the South compass direction.

Widths of the bus-based inputs and bus-based outputs can vary depending on a selected design. The bus-based inputs and bus-based outputs can also have buses of the same size or different sizes. In one embodiment, the bus-based inputs and bus-based outputs are implemented with a combination of a wide bus, e.g. 48-bit bus, and a narrow bus, 24-bit bus. Two 24-bit input buses can be combined to generate a single 48-bit output to a 48-bit output bus. In another embodiment, each of the bus-based inputs and bus-based outputs in the bus-based configurable connection box is 48 bits wide. In such a scenario, each 48-bit input bus can receive a single wide bus, e.g. 48 bits, or two narrow buses, e.g. two 24-bit buses.

The multiplexer in the bus-based configurable connection box receives a plurality of bus-based inputs from any compass direction, and routes a selected bus-based input to a bus-based output of any compass direction. Selection bits in the multiplexer provide control signals as to which one of the bus-base inputs is selected for routing to the bus-based output. The multiplexer comprises $2^N$ number of bus-based inputs, N number of selection bits, and an output. The flexibility of the bus-based configurable connection box to route from bus-based inputs to bus-based outputs determines the $2^N$ number of bus-based inputs and N number of selection bits.

Broadly stated, a field programmable gate array (FPGA) integrated circuit comprising a logic and routing block having a plurality of dedicated logic cells, each dedicated logic cell having a first logic and routing cell and a second logic and routing cell; a plurality of configurable dedicated connection circuits, the plurality of configurable dedicated connection circuits being interconnected with one another through bus-based connections to form a bus architecture, each configurable dedicated connection circuit having a plurality of bus-based inputs, a plurality of bus-based outputs, and a multiplexer, the multiplexer having configuration bits for routing a first bus-based input in the plurality of bus-based inputs via a first bus to a first bus-based output in the plurality of bus-based outputs; one or more first dedicated lines connecting from the first logic and routing cell in a dedicated logic cell of the logic and routing block to the first bus-based input in a first configurable dedicated connection circuit; and one or more second dedicated lines connecting from the first bus-based output in the first configurable dedicated connection circuit to the first logic and routing cell in the dedicated logic cell of the logic and routing block.

The structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

BRIEF DESCRIPTION OF THE DRAWINGS

The invention will be described with respect to specific embodiments thereof, and reference will be made to the drawings, in which:

FIG. 3 is a block diagram illustrating a programmable logic chip constructed with multiple levels of dedicated logic cells in accordance with the present invention.

DETAILED DESCRIPTION

Figure 1:
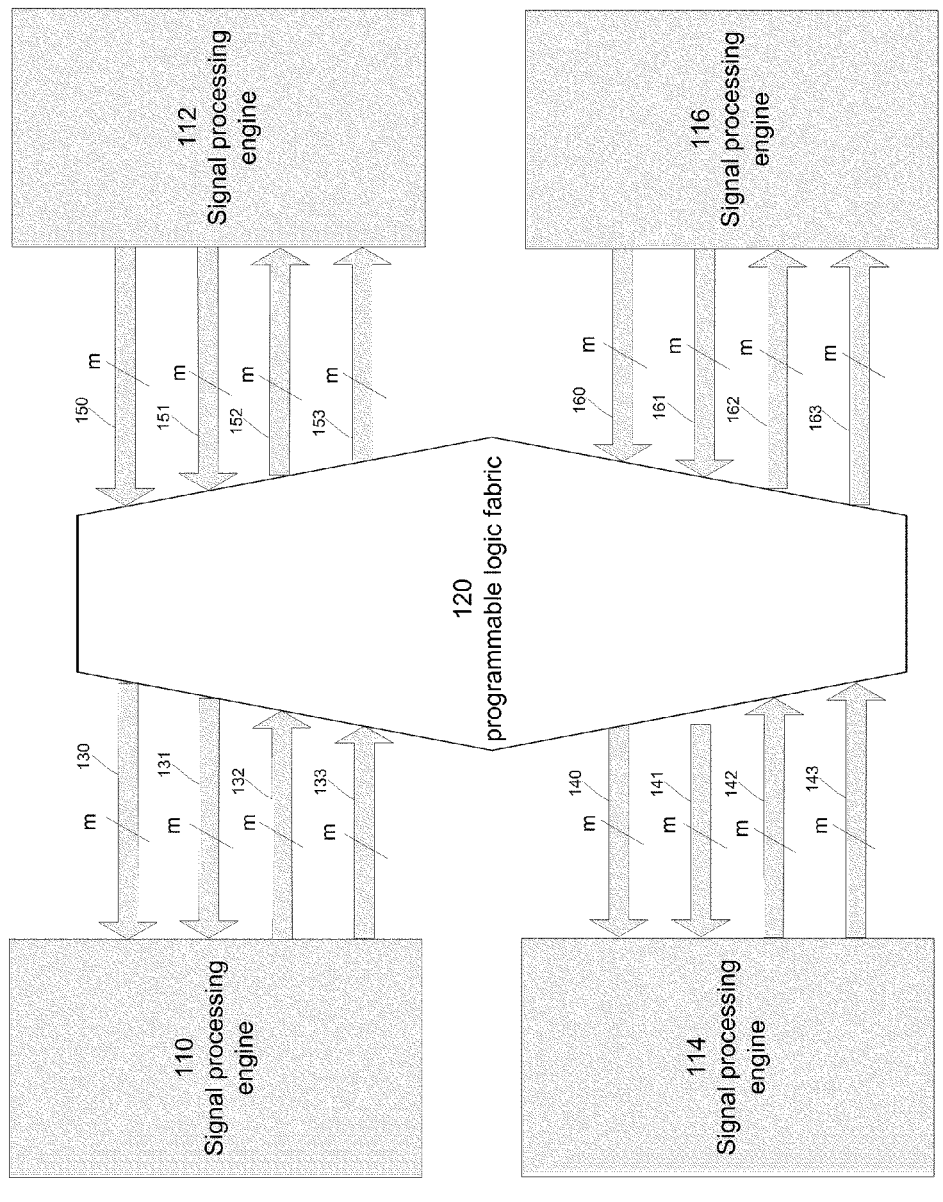
FIG. 1 is a simplified architectural diagram illustrating a programmable integrated circuit chip that includes multiple signal processing engines and multiple program logic fabrics in accordance with the present invention.

A description of structural embodiments and methods of the present invention is provided with reference to FIGS. 1-12. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a general architectural diagram illustrating a programmable integrated circuit chip 100 that includes multiple signal processing engines (SPEs) 110, 112, 114, 116 coupled to programmable logic fabric 120 through buses 130-133, 140-143, 150-153, 160-163, where each bus is m-bit wide. Alternatively, some of the buses may be divided to have multiple buses, such as a bus that is m-bit wide can be replaced by two buses that is n-bit wide, where m=2n. Each of the signal processing engines 110, 112, 114, 116 performs one or more computational tasks. Each of the signal processing engines 110, 112, 114, 116 can be applied to a wide variety of computational intensive tasks including Finite Impulse Response (FIR), Infinite Impulse Response (IIR), Fast Fourier Transform (FFT), complex multiply-add function, serial computations and others.

The programmable logic fabric 120 includes control signals for data flow and control signals for the signal processing engines 110, 112, 114, 116. The term "programmable logic fabric" refers to dedicated logic cells, programmable logic and routing blocks, dedicated logic cells, dedicated lines, local connections, or other forms of logic connections.

Figure 2:
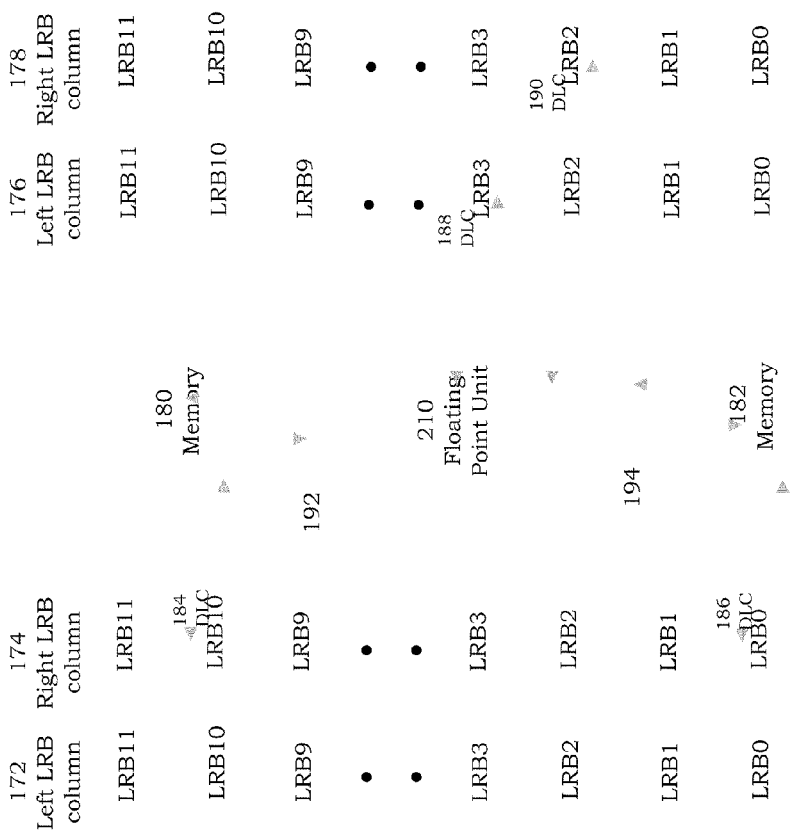
FIG. 2 is an architectural diagram illustrating a programmable system that comprises a configurable floating point unit operating with programmable logic and routing blocks and memories in accordance with the present invention.

As shown in FIG. 2, there is an architectural diagram illustrating a programmable system 170 that comprises a configurable floating point unit 210 operating with programmable logic and routing blocks and memories. The floating point unit 210 is coupled to two columns of logic and routing blocks 172 and 174 on the left side, and is coupled to two columns of logic and routing blocks 176 and 178 on the right side. The floating point unit 210 is further coupled to a memory 180 on top and a memory 182 on the bottom. In this embodiment, each column of the logic and routing blocks 172, 174, 176 and 178 has twelve logic and routing blocks, which is further described below with respect to FIG. 3. Each logic and routing block comprises four dedicated logic and routing blocks, as described below with respect to FIG. 4.

A DLC in a logic and routing block provides a connection between a floating point unit and a logic and routing block, or provides a connection between a memory and a logic and routing block. For Example, a DLC 188 in the column of the logic and routing block 176 is coupled to the floating point unit 210 for communication between the dedicated logic cell 188 and the floating point unit 210. Similarly, a DLC 190 in the column of the logic and routing block 178 is coupled to the floating point unit 210 for communication between the dedicated logic cell 190 and the floating point unit 210. A DLC 184 in the column of logic and routing block 220 is connected to the memory 180 for communication between the dedicated logic cell 184 and the memory 180. A DLC 186 in the column of the logic and routing block 174 is connected to the memory 182 for communication between the dedicated logic cell 186 and the memory 182. Each memory in the memories 180 and 182 can have two ports, port A and port B, for use with two different types of addresses. In the programmable system 170, the memory 180 has one or more direct connections 192 to the floating point unit 210. The memory 182 also has one or more direct connections 194 to the floating point unit 182. Although the above connections are shown individually to flow unidirectionally, these connections can also flow bidirectionally.

In the embodiment shown above with respect to FIG. 2, two columns of the logic and routing blocks, either to the right side of the floating point unit 210 or the left side of the floating point unit 210, may be sufficient to provide the required connectivity for FPU pins. One of ordinary skill in the art should recognize that additional logic and routing blocks can be provided to add additional connectivity to the pins of the floating point unit 210. Addresses and data buses are preferably arranged so that local connectivity can be made for fraction and exponent bits separately.

In FIG. 3, there is shown a logic diagram illustrating a programmable logic chip 250 constructed with multiple levels (or columns) of DLCs 260, 270, 280, and 290. One column of dedicated logic cells comprises a plurality of dedicated logic cells and connection lines to implement a logic function, such as an adder, a subtractor, an add-subtractor with add-sub control, an accumulator, registers, and multiplexers. The programmable logic chip 250 comprises a first logic and routing block 251, a second logic and routing block 252, a third logic and routing block 253, a fourth logic and routing block 254, a fifth logic and routing block 255, and a sixth logic and routing block 256. Each of the logic and routing blocks comprises four dedicated logic cells arranged in a square format. The first logic and routing block 251 comprises a first dedicated logic cell 261, a second dedicated logic cell 262, a third dedicated logic cell 271, and a fourth dedicated logic cell 272. Each dedicated logic cell comprises two logic and routing cells. The first dedicated logic cell 261 has a first logic and routing cell 261-1 and a second logic and routing cell 261-2, the second dedicated logic cell 262 has a first logic and routing cell 262-1 and a second logic and routing cell 262-2, the third dedicated logic cell 271 has a first logic and routing cell 271-1 and a second logic and routing cell 271-2, and the fourth dedicated logic cell 272 has a first logic and routing cell 272-1 and a second logic and routing cell 272-2.

The second logic and routing block 252 comprises a first dedicated logic cell 263, a second dedicated logic cell 264, a third dedicated logic cell 273, and a fourth dedicated logic cell 274. The first dedicated logic cell 263 has a first logic and routing cell 263-1 and a second logic and routing cell 263-2, the second dedicated logic cell 264 has a first logic and routing cell 264-1 and a second logic and routing cell 264-2, the third dedicated logic cell 273 has a first logic and routing cell 273-1 and a second logic and routing cell 273-2, and the fourth dedicated logic cell 274 has a first logic and routing cell 274-1 and a second logic and routing cell 274-2.

The third logic and routing block 253 comprises a first dedicated logic cell 265, a second dedicated logic cell 266, a third dedicated logic cell 275, and a fourth dedicated logic cell 276. The first dedicated logic cell 265 has a first logic and routing cell 265-1 and a second logic and routing cell 265-2, the second dedicated logic cell 266 has a first logic and routing cell 266-1 and a second logic and routing cell 266-2, the third dedicated logic cell 275 has a first logic and routing cell 275-1 and a second logic and routing cell 275-2, and the fourth dedicated logic cell 276 has a first logic and routing cell 276-1 and a second logic and routing cell 276-2.

The fourth logic and routing block 254 comprises a first dedicated logic cell 281, a second dedicated logic cell 282, a third dedicated logic cell 291, and a fourth dedicated logic cell 292. The first dedicated logic cell 281 has a first logic and routing cell 281-1 and a second logic and routing cell 281-2, the second dedicated logic cell 282 has a first logic and routing cell 282-1 and a second logic and routing cell 282-2, the third dedicated logic cell 291 has a first logic and routing cell 291-1 and a second logic and routing cell 291-2, and the fourth dedicated logic cell 292 has a first logic and routing cell 292-1 and a second logic and routing cell 292-2.

The fifth logic and routing block 255 comprises a first dedicated logic cell 281, a second dedicated logic cell 282, a third dedicated logic cell 293, and a fourth dedicated logic cell 294. The first dedicated logic cell 283 has a first logic and routing cell 283-1 and a second logic and routing cell 283-2, the second dedicated logic cell 284 has a first logic and routing cell 284-1 and a second logic and routing cell 284-2, the third dedicated logic cell 293 has a first logic and routing cell 293-1 and a second logic and routing cell 293-2, and the fourth dedicated logic cell 294 has a first logic and routing cell 294-1 and a second logic and routing cell 294-2.

The sixth logic and routing block 256 comprises a first dedicated logic cell 285, a second dedicated logic cell 286, a third dedicated logic cell 295, and a fourth dedicated logic cell 296. The first dedicated logic cell 285 has a first logic and routing cell 285-1 and a second logic and routing cell 285-2, the second dedicated logic cell 286 has a first logic and routing cell 286-1 and a second logic and routing cell 286-2, the third dedicated logic cell 295 has a first logic and routing cell 295-1 and a second logic and routing cell 295-2, and the fourth dedicated logic cell 296 has a first logic and routing cell 296-1 and a second logic and routing cell 296-2.

The first column (or level 0) of logic and routing block 260 comprises the first dedicated logic cell 261, the second dedicated logic cell 262, the third dedicated logic cell 263, the fourth dedicated logic cell 264, the fifth dedicated logic cell 265, and the sixth dedicated logic cell 266. The second column (or level 1) of logic and routing block 270 is positioned adjacent to the right side of the first column of logic and routing block 260. The second column of logic and routing block 270 comprises the first dedicated logic cell 271, the second dedicated logic cell 272, the third dedicated logic cell 273, the fourth dedicated logic cell 274, the fifth dedicated logic cell 275, and the sixth dedicated logic cell 276. The third column (or level 2) of logic and routing block 280 is positioned adjacent to the right side of the second column of logic and routing block 270. The third column of logic and routing block 280 comprises the first dedicated logic cell 281, the second dedicated logic cell 282, the third dedicated logic cell 283, the fourth dedicated logic cell 284, the fifth dedicated logic cell 285, and the sixth dedicated logic cell 286. The fourth column (or level 3) of logic and routing block 290 is positioned adjacent to the right side of the third column of logic and routing block 280. The fourth column of logic and routing block 290 comprises the first dedicated logic cell 291, the second dedicated logic cell 292, a third dedicated logic cell 293, the fourth dedicated logic cell 294, the fifth dedicated logic cell 295, and the sixth dedicated logic cell 296.

Figure 4:
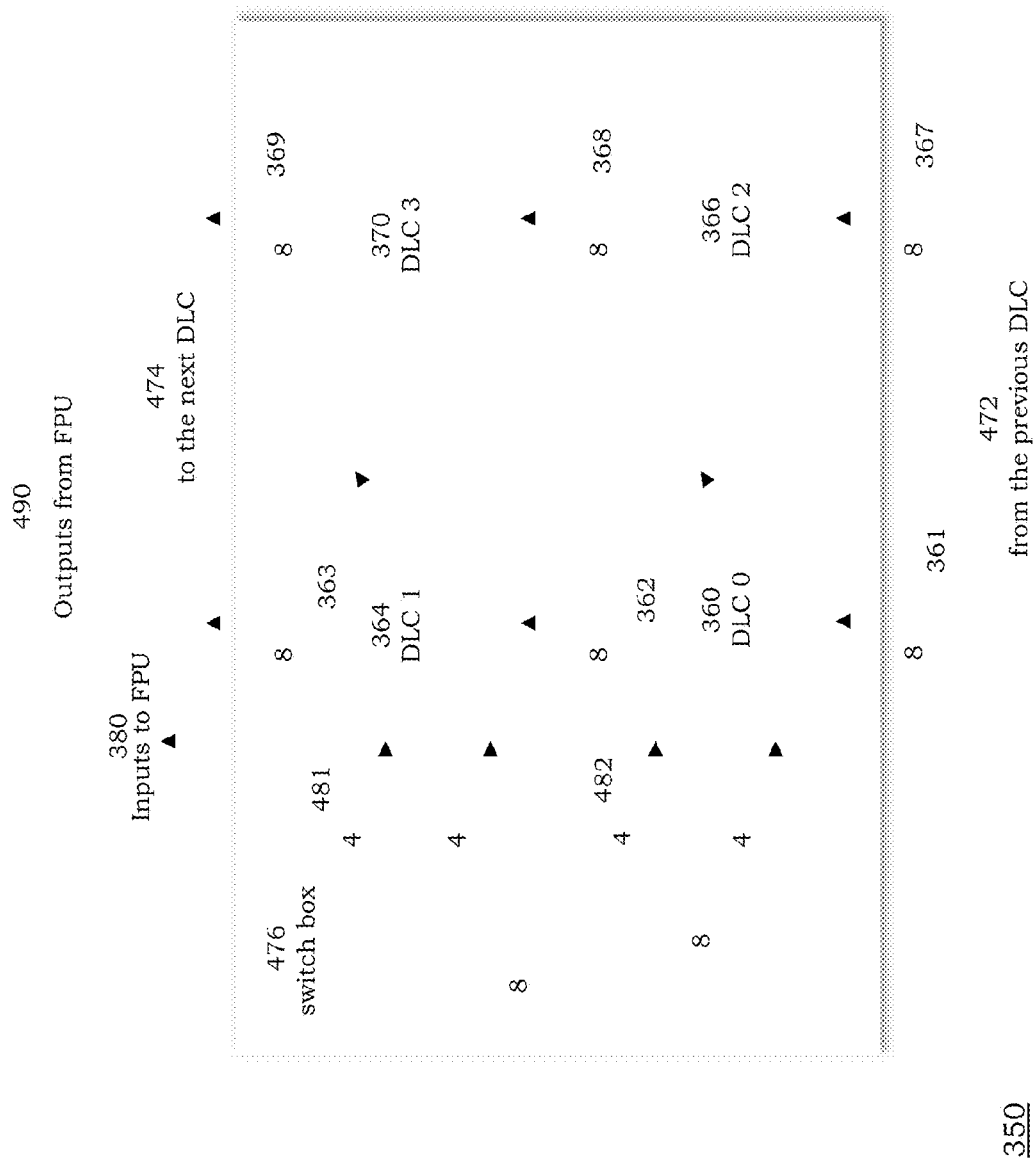
FIG. 4 is a block diagram illustrating a logic and routing block comprising a first dedicated logic cell, a second dedicated logic cell, a third dedicated logic cell, a fourth dedicated logic cell and a switch box for providing programmable switch matrices in accordance with the present invention.

In FIG. 4, there is shown a block diagram illustrating a logic and routing block 350 comprising a first dedicated logic cell (DLC0) 360, a second dedicated logic cell (DLC1) 364, a third dedicated logic cell (DLC2) 366, a fourth dedicated logic cell (DLC3) 370 and a switch box 376 for providing programmable switch matrices. A set of dedicated lines is used to interconnect between adjacent dedicated logic cells, either for connects to adjacent dedicated logic cells within the logic and routing block, adjacent dedicated logic cells between the logic and routing block 350 and a previous logic and routing block, or connecting to adjacent dedicated logic cells between the logic routing block 350 and a next logic and routing block. A first set of eight dedicated lines 361 is connected from a previous dedicated logic cell 460 (not shown) to the first dedicated logic cell 360. A second set of eight dedicated lines 362 is connected from the first dedicated logic cell DLC0 360 to the second dedicated cell DLC1 364. A third set of dedicated lines 363 is connected from the second dedicated cell 364 to the next dedicated local cell 374 (not shown). A fourth set of eight dedicated lines 367 is connected from the previous dedicated logic cell 460 (not shown) to the third dedicated logic cell 366. A fifth set of eight dedicated lines 368 is connected from the third dedicated logic cell 366 to the fourth dedicated logic cell 370. A sixth set of eight dedicated lines 369 is connected from the fourth dedicated logic cell 370 to the next dedicated logic cell 374 (not shown). The switchbox 376 functions as a source for feeding control of data signals to any one of the dedicated lines 361, 362, 363, 367, 368, or 369. While the first set of eight dedicated lines 361 and the fourth set of eight dedicated lines 367 are connected from the previous logic and cell block 460, (not shown) the third set of eight dedicated lines 363 and the sixth set of eight dedicated lines 369 are connected to the next logic and cell block 374 (not shown). The switchbox 376 has various 4-bit connections to the DLC0 360 and DLC1 364 for generating signals to FPU to serve as inputs. In this illustrative diagram, a 4-bit line 471 in the DLC1 364 and a 4-bit line 472 in the DLC0 360 are connected to inputs to FPU 380. Outputs from the FPU 390 are connected to lines 363 in the DLC1 364 and lines 362 in the DLC0 360.

The one or more dedicated lines can be driven by the previous corresponding one or more dedicated lines as well as driving the next corresponding one or more dedicated lines, which would extend the distance of the dedicated lines. In effect, one set of dedicated lines can be connected ("stitched") to another set of dedicated lines, as may be called for by a particular programmable logic device, for concatenating different sets of dedicated lines together that extend across different logic and routing blocks.

For additional information on the circuit and operation of the programmable logic fabric, see U.S. patent application Ser. No. 11/344,694 entitled "Programmable Logic Systems and Methods Employing Configurable Floating Point Units", filed on 1 Feb. 2006, now U.S. Patent No. 7,814,136; U.S. patent application Ser. No. 11/036,109 entitled "Programmable Logic and Routing Blocks with Dedicated lines", filed on 14 Jan. 2005, now U.S. Pat. No. 7,176,717; U.S. patent application Ser. No. 11/044,386 entitled "Programmable Logic Cells with Local Connections", filed on 27 Jan. 2005, now U.S. Pat. Nos. 7,605,605, 7,728,623; U.S. patent application Ser. No. 11/066,336 entitled "Dedicated Logic Cells Employing Configurable Logic and Dedicated Logic Functions", filed on 23 Feb. 2005, now U.S. Pat. Nos. 7,358,765, 7,439,768, 7,414,431; and U.S. patent application Ser. No. 11/065,019 entitled "Dedicated Logic Cells Employing Sequential Logic and Control Logic Functions", filed on 23 Feb. 2005, now U.S. Pat. Nos. 7,368,941, 7,417,456, 7,414, 432; all owned by the assignee of this application and incorporated by reference as if fully set forth herein.

Figure 5:
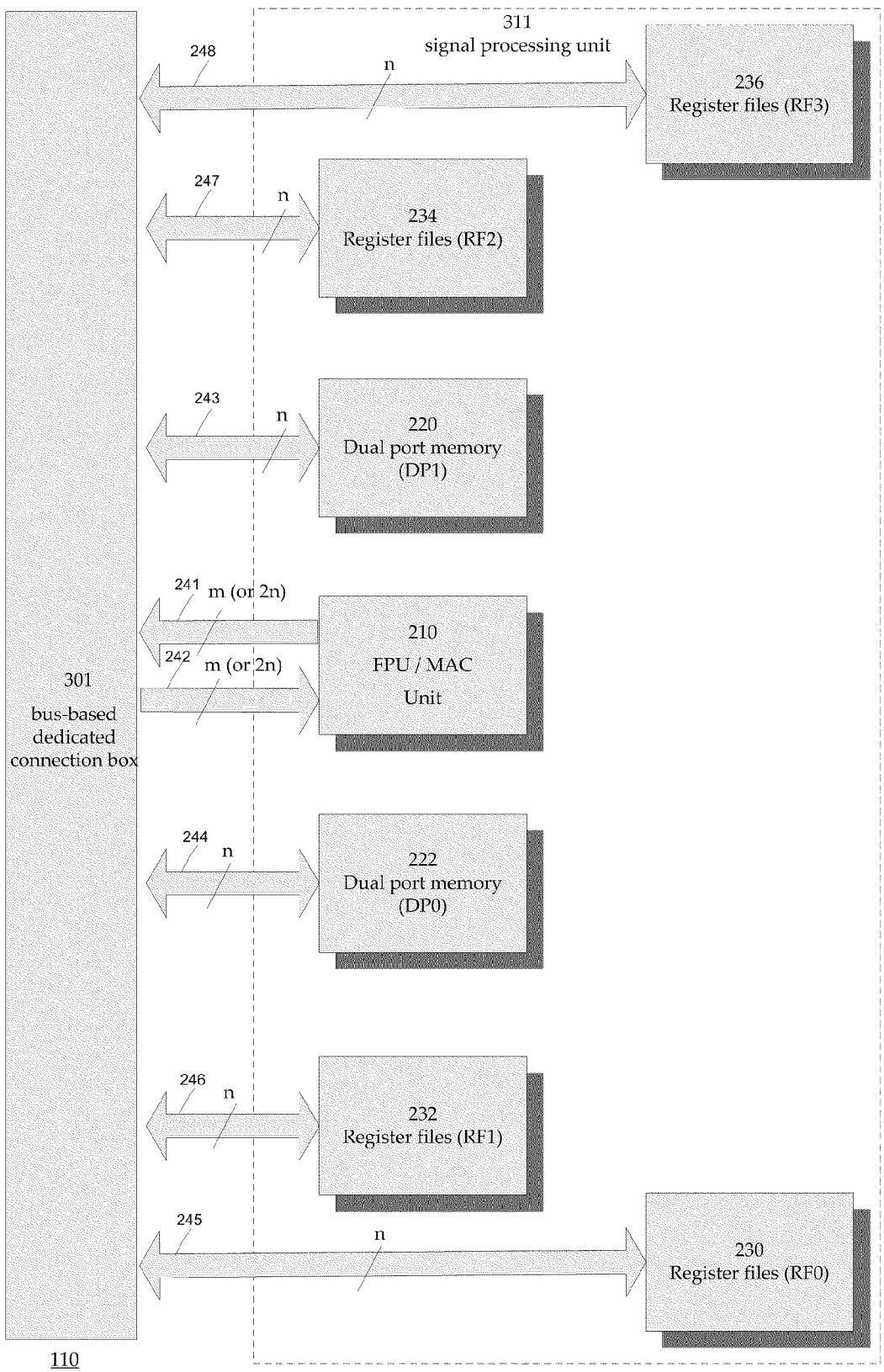
FIG. 5 is an architectural diagram illustrating a signal processing engine (SPE) including a signal processing unit (SPU) coupled to a bus-based dedicated connection box in accordance with the present invention.

FIG. 5 is an architectural diagram illustrating the signal processing engine 110 comprising a signal processing unit (SPU) 311 coupled to a bus-based dedicated connection box 301. The signal processing unit 311 includes a floating point unit/multiplier/accumulator unit (FPU/MAC unit) 210, dual port random access memories (RAM) 220, 222, and multiple register files RF0 230, RF1 232, RF2 234 and RF3 236. The FPU/MAC unit 210 is coupled to the bus-based dedicated connection box 301 via a first bus 241 from the FPU/MAC unit 311 to the bus-based dedicated connection box 301 and a bus 242 from the bus-based dedicated connection box 301 to the FPU/MAC unit 210. Each of the first bus 241 and the second bus 242 is m-bit wide, for example, 48 bits, or 2n-bit wide, where n is equal to 24. The dual port memories 220, 222 are coupled to the bus-based dedicated connection box 301 via a bus 243 and a bus 244, respectively. The register files RF0 230 are coupled to the bus-based dedicated connection box 301 via a bus 245, the register files RF1 232 are coupled to the bus-based dedicated connection box 301 via a bus 246, the register files RF2 234 are coupled to the bus-based dedicated connection box 301 via a bus 247, and the register files RF3 236 are coupled to the bus-based dedicated connection box 301 via a bus 248. Each of the buses 243-248 is n-bit wide, for example, 24 bits.

Two general types of bus widths are utilized in transferring information between the signal processing unit 311 and the bus-based dedicated connection box 301. The communication between the FPU/MAC unit 210 and the bus-based dedicated connection box 310 has an m-bit wide bus, which is also referred to as a wide bus. The wide bus of the buses 241, 242 is a 42-bit bus in this embodiment. The communication between dual port memories 220, 222, the register files RF0 230, RF1 232, RF2 234, RF3 236 and the bus-based dedicated connection box 301 has a n-bit wide bus, which is also referred to as a narrow bus. The narrow bus of the buses 243-248 is a 24-bit bus in this embodiment.

The signal processing element 110 incorporates the FPU/MAC unit 210 for computation, dual port memories 220, 222 and the bus-based dedicated connection box 311 for performing digital signal processing operations of various widths. The FPU/MAC unit 210 operates as a computation unit in the signal processing unit 311. The register files RF0 230, RF1 232, RF2 234, RF3 236 function as storage units in the signal processing unit 311. Each of the dual port memories 220, 222 can be implemented as a random access memory or other type of suitable memory.

Embodiments of the FPU/MAC 210 can be configured to perform a wide variety of operations including an extended single precision floating point unit, a 36-bit integer multiply accumulate (MAC), two 18-bit integer MACs, or four 9×9 multiplies. Unsigned and signed multiplies for 32 and 16 bit operations can be performed using the programmable logic fabric 120 and one or more dedicated connection boxes. Each of the dual port memories (or RAM) 220, 222 includes, for example, a 24 kilobit dual port block memory. Each dual port memory 220 or 222 has an independent read or write port, where each port can be independently configured from x4 widths to x24 widths. Byte-wide read and write enable signals are provided for the memory data ports. A suitable 24 kilobit dual port memory mapping pinout is shown in Table 1.

TABLE 1

| | |
|---|---|
| IJ_CA[23:0] | RAM control signals |
| IJ_CA[23:0] | Data pins for port A |
| ZJ_A[23:0] | Data pins for port A |
| IJ_CLKA | Clock for port A |
| IJ_CB[23:0] | RAM control signals |
| IJ_B[23:0] | Data pins for port A |
| ZA_B[23:0] | Data pins for port B |
| IJ_CLKB | Clock for port B |
| IJ_ACLR | Asynchronous Clear |

The pins from the dual port memory 220 or 222 connect to, for example, two columns of logic and routing blocks in the programmable logic fabric 120. The pins are connected in such a way that the data and address pins are able to access internal local connections efficiently. Table 2 illustrates an example of the various modes of operations for dual port memory pinout and pin mappings.

TABLE 2

| RAM Pinout | Port A Mapping | | | | | | | | Port A - Write Port |
|---|---|---|---|---|---|---|---|---|---|
| | 4K × 4 | 4K × 6 | 2K × 8 | 2K × 9 | 2K × 12 | 1K × 16 | 1K × 18 | 1K × 24 | FIFO |
| U_CA[23:16] | CEA,WEA, NC,WEMB | CEA,WEA, NC,WEMA | CEA,WEA, NC,WEMA | CEA,WEA, NC,WEMA | CEA,WEA, NC,WEMA | CEA,WEA, NC,WEMA | CEA,WEA, WEMA[1:0] | CEA,WEA, WEMA[2:1] | |
| I1_CB[15:8] | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | {ZSEL_AAA[15]}, {RST_S_AAA[14]}, {SWT_AAA[13]}; | |
| | AB[12:8] | AA[12:8] | AA[12:8] | AA[12:8] | AA[12:8] | AA[12:8] | AA[12:8] | AA[12:8] | |
| I1_CA[7:0] | AA[7:0] | FA[7:0] | AA[7:0] | AA[7:0] | AA[7:0] | AA[7:0] | AA[7:0] | AA[7:0] | NC,NC,NC,NC NC,NC,RST_SRD_EN |
| I1_A[23:16] | | | | | | | | DA[23:16] | DI[23:16] |
| I1_A[15:8] | | | | | DA[11:8] | DA[15:8] | DA[17:16] | DA[15:8] | DA[15:8] |
| I1_A[7:0] | DA[3:0] | DA[5:0] | DA[7:0] | DA[8] DA[7:0] | DA[11:8] DA[7:0] | DA[15:8] DA[7:0] | DA[17:16] DA[7:0] | DA[7:0] | DI[7:0] |
| ZJ_A[23:16] | | | | | | | | QA[23:16] | WR_WORD_CNT[7:0] |
| ZJ_A[15:8] | | | | | | | QA[17:16] | QA[15:8] | RD_WORD_CNT[7:0] |
| +5SOVEL,UDFL, | | | | | | | QA[15:8] | | {OVFL,UDFL, |
| ZJ_A[7:0] | QA[3:0] | QA[5:0] | QA[7:0] | QA[8] QA[7:0] | QA[11:8] QA[7:0] | QA[15:8] QA[7:0] | QA[7:0] | QA[7:0] | WR_ACKVALID, PROG_EMPTY,EMPTY PROG_FULL,FULL,I |

| RAM Pinout | Port B Mapping | | | | | | | | Port B - Read Port |
|---|---|---|---|---|---|---|---|---|---|
| | 4K × 4 | 4K × 6 | 2K × 8 | 2K × 9 | 2K × 12 | 1K × 16 | 1K × 18 | 1K × 24 | |
| U_CB[23:16] | CEB,WEB, NC,WEMB | CEB,WEB, NC,WEMB | CEB,WEB, NC,WEMB | CEB,WEB, NC,WEMB | CEB,WEB, NC,WEMB | CEB,WEB, WEMB[1:0] | CEB,WEB, WEMB[1:0] | CEB,WEB, WEMB[3:2] | |
| I1_CB[15:8] | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | {ZSEL_BAB[15]}, {RST_S_BAB[14]}, {SWT_BAB[13]}; | |
| | AB[12:8] | AB[12:8] | AB[12:8] | AB[12:8] | AB[12:8] | AB[12:8] | AB[12:8] | AB[12:8] | |
| I1_CB[7:0] | AB[7:0] | AB[7:0] | AB[7:0] | AB[7:0] | AB[7:0] | AB[7:0] | AB[7:0] | AB[7:0] | NC,NC,NC,NC NC,NC,NC,WR_EN |
| I1_B[23:16] | | | | | | | | DB[23:16] | |
| I1_B[15:8] | | | | | DB[11:8] | DB[15:8] | DB[17:16] | DB[15:8] | |
| I1_B[7:0] | DB[3:0] | DB[5:0] | DB[7:0] | DB[8] DB[7:0] | DB[11:8] DB[7:0] | DB[15:8] DB[7:0] | DB[17:16] DB[7:0] | DB[7:0] | |
| ZJ_B[23:16] | | | | | | | | QB[23:16] | DO[23:16] |
| ZJ_B[15:8] | | | | | | | QB[17:16] | QB[15:8] | DO[15:8] |
| ZJ_B[7:0] | QB[3:0] | QB[5:0] | QB[7:0] | QB[8] QB[7:0] | QB[11:8] QB[7:0] | QB[15:8] QB[7:0] | QB[7:0] | QB[7:0] | DO[7:0] |

Embodiments of the register files 230, 232, 234, 236 include a 768-bits 2-port register file that has an independent read and write port. Each port can be independently configured from x8 widths to x24 widths. Byte-wide read and write enable signals are provided for the memory data ports. An exemplary RAM pinout of general mapping is shown in Table 3.

TABLE 3

| | |
|---|---|
| IR_C[23:0] | RAM Control Signals |
| IR[23:0] | Write Data Inputs |
| IR_CLKA | Write Clock A |
| ZR[23:0] | Data Output Pins |
| IR_CLKB | Read Clock B |
| IR_ACLR | Asynchronous Clear |

The RAM pins are connected to Logic and Routing Blocks (LRBs) in such a way that the data and address pins are able to access the internal local connections efficiently. The following tables explain the different modes of register files.

The pins from the 2-port register files 230, 232, 234, 236 connect to, for example, logic and routing blocks in the programmable logic fabric 120 in such a way that the data and address pins are able to access internal local connections efficiently. Table 4 illustrates an example of the various modes of operation for dual port memory pinout and pin mappings.

the signal processing units 311-316 is connected to a respective one of the bus-based dedicated connection boxes 301-306.

The first bus-based dedicated connection 301 receives a first bus-base input from the bus 321, a second bus-base input via the bus 325 from to the fourth bus-based dedicated connection box 304, a third bus-base input via the bus 354 from the second bus-based dedicated connection box, and generates a first bus-based output via the bus 322 to the fourth bus-based dedicated connection box 304, a second bus-based output via the bus 326, and a third bus-based output via the bus 351 to the second bus-based dedicated connection box 302. The first signal processing unit 311 is coupled to the first bus-based dedicated connection box 301 via a bus 307. The bus coupling between the signal processing unit 311 and the bus-based dedicated connection box 301 can be implemented with a single bus or multiple number of buses.

The second bus-based dedicated connection 302 receives a first bus-based input via the bus 351 from the first bus-based dedicated connection box 301, a second bus-based input via the bus 331, a third bus-based input via the bus 353 from the third bus-based dedicated connection box 303, a fourth bus-based input via the bus 355 from the fifth bus-based dedicated connection box 305, and generates a first bus-based output via the bus 352 to the third bus-based dedicated connection box 303, a second bus-based output via the bus 332 to the fifth bus-based dedicated connection box 305, a third bus-based

TABLE 4

Register Fie Modes- Read & Wite Port Mapping (Independently Configurable)

| | FF0 | 32 × 24 | 32 × 18 | 32 × 16 | 64 × 12 | 64 × 9 | 64 × 8 |
|---|---|---|---|---|---|---|---|
| Read Data Mapping | | | | | | | |
| IR[23:16] | | DI[23:16] | DI[23:16] | DI[17:16] | | | |
| IR[15:8] | | DIP 5:8] | DI[5:8] | DI[5:8] | DI[5:8] | DI[11:8] | DI[8] | |
| IR[7: 0] | | DI[7:0] | DI[7:0] | DI[7:0] | DI[7:0] | DI[7:0] | DI[7:0] | DI[7:0] |
| ControlMapping | | | | | | | |
| IR_C[23:20] | | NC,WEM[2:0] | NC,WEM[1:0] | NC,WEM[1:0] | NC,NC,NC,WEM | NC,NC,NC,WEM | NC,NC,NC,WEM |
| IR_C[1 9:16] | | NC,NC,NC,WA[4] | NC,NC,NC,WA[4] | NC,NC,NC,WA[4] | NC,NC,WA[5:4] | NC,NC,WA[5:4] | NC,NC,WA[5:4] |
| IR_C[1 5:12] | | WA[3:0] | WA[3:0] | WA[3:0] | WA[3:0] | WA[3:0] | WA[3:0] |
| IR_C[11:8] | | WE,CEW,CER RST_S | WE,CEW,CER RST_S | WE,CEW,CER RST_S | WE,CEW,CER RST_S | WE,CEW,CER RST_S | WE,CEW,CER RST_S |
| IR_C [7:4] | | ZSEL_ANC, NC,RA[4] | ZSEL_ANC, NC,RA[4] | ZSEL_ANC, NC,RA[5:4] | ZSEL_ANC, NC,RA[5:4] | ZSEL_ANC, RA[5:4] | ZSEL_ANC, RA[5:4] |
| IR_C[3:0] | | RA[30] | RA[30] | RA[30] | RA[30] | RA[30] | RA[30] |
| WriteData Mapping | | | | | | | |
| | 32 × 24 | 32 × 18 | 32 × 16 | 64 × 12 | 64 × 9 | 64 × 8 | |
| ZR[23:16] | {DO[23], FULL}, {DO[22], EMPTY}, DO[21:16] | DO[23:16] | DO[17:16] | | | | |
| ZR [15:8] | DO[15:8] | DO[15:8] | DO[15:8] | DO[15:8] | DO[11:8] | DO[8] | |
| ZR[7:0] | DO[7:0] | DO[7:0] | DO[7:0] | DO[7:0] | DO[7:0] | DO[7:0] | DO[7:0] |

Figure 6:
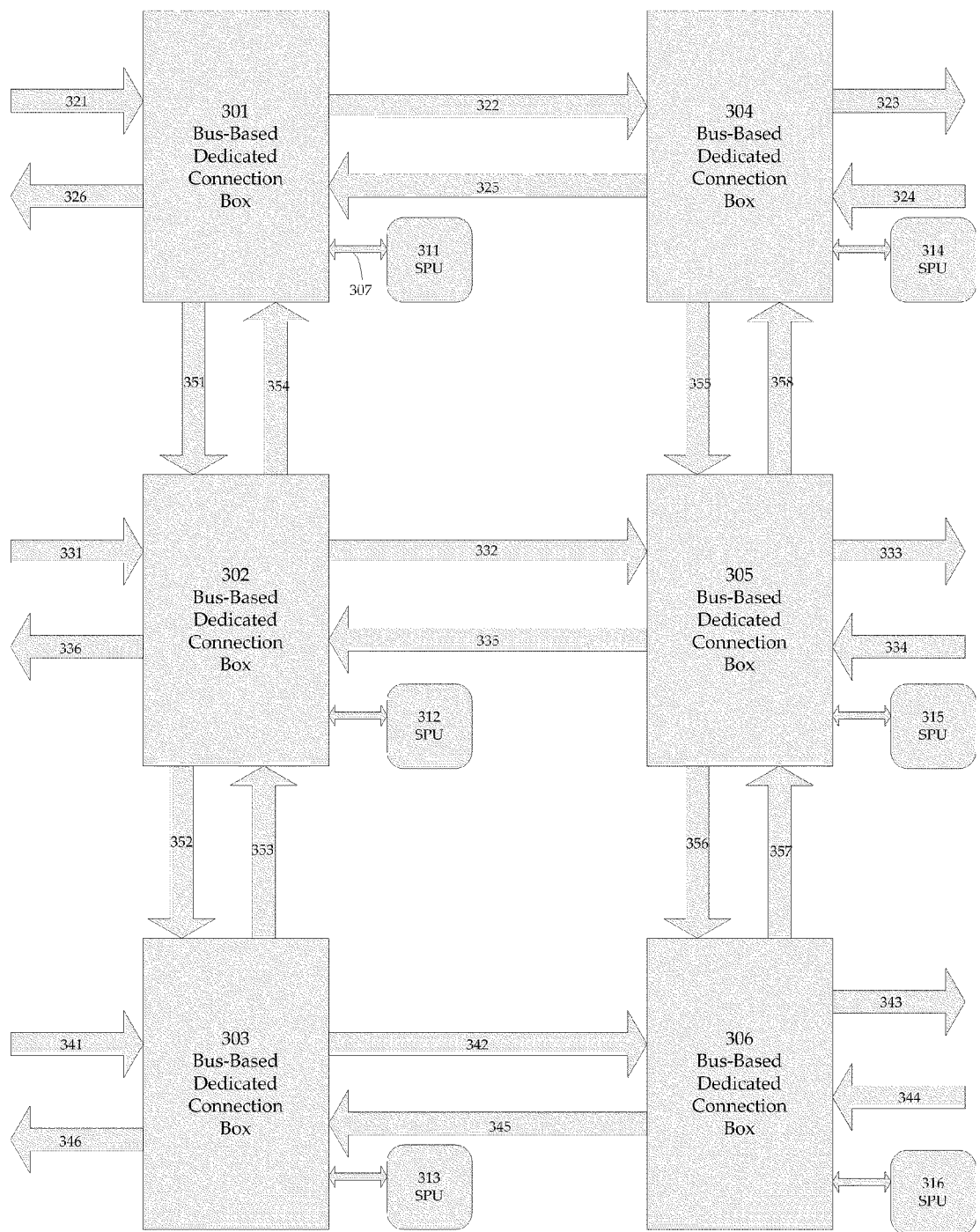
FIG. 6 is a block diagram illustrating a two-dimensional view of a bus architecture including multiple bus-based dedicated connection boxes and signal process units in accordance with the present invention.

FIG. 6 is a block diagram illustrating a two-dimensional view of a bus architecture 300 including multiple bus-based dedicated connection boxes 301-306 and signal process units 311-316 (SPUs). Each of the bas-based dedicated connection boxes 301-306 facilitate configurable connections between different buses that are inputs and outputs from a particular base-based dedicated connection box. The bus-based dedicated connection boxes 301-306 are interconnected with various buses 321-326, 331-336, 341-346 and 351-358. Each of output via the bus 354 to the first bus-based dedicated connection box 301, a fourth bus-based output via the bus 336. The second signal processing unit 312 is coupled to the second bus-based dedicated connection box 302.

The third bus-based dedicated connection 303 receives a first bus-based input via the bus 352 from the second bus-based dedicated connection box 302, a second bus-based input via the based 341, a third bus-based input via the bus 345 from the sixth bus-based dedicated connection box 306, and generates a first bus-based output via the bus 346, a second bus-based output via the bus 345 to the sixth bus-based dedicated connection box 306. The third signal processing unit 313 is coupled to the third bus-based dedicated connection box 303.

The fourth bus-based dedicated connection 304 receives a first bus-based input via the bus 322 from the first bus-based dedicated connection box 301, a second bus-based input via the bus 358 from the fifth bus-based dedicated connection box 305, a third bus-based input via the bus 324, and generates a first bus-based output via the bus 323, a second bus-based output via the bus 325. The fourth signal processing unit 314 is coupled to the fourth bus-based dedicated connection box 304.

The fifth bus-based dedicated connection 305 receives a first bus-based input via the bus 355 from the fourth bus-based dedicated connection box 304, a second bus-based input via the bus 332 from the bus-based dedicated connection box 302, a third bus-based input via the bus 357 from the sixth bus-based dedicated connection box 306, a fourth bus-based input via the bus 334, and generates a first bus-based output via the bus 355 to the sixth bus-based dedicated connection box 306, a second bus-based output via the bus 333, a third bus-based output via the bus 358 to the fourth bus-based dedicated connection box 304, a fourth bus-based output via the bus 335 to the second bus-based dedicated connection box 302. The fifth signal processing unit 315 is coupled to the fifth bus-based dedicated connection box 305.

The sixth bus-based dedicated connection 306 receives a first bus-based input via the bus 356 from the fifth bus-based dedicated connection box 305, a second bus-based input via the bus 342 from the third bus-based dedicated connection box 303, a third bus-based input via the bus 344, and generates a first bus-based output via the bus 343, a second bus-based output via the bus 345 to the third bus-based dedicated connection box 303. The sixth signal processing unit 316 is coupled to the sixth bus-based dedicated connection box 306.

Figure 7:
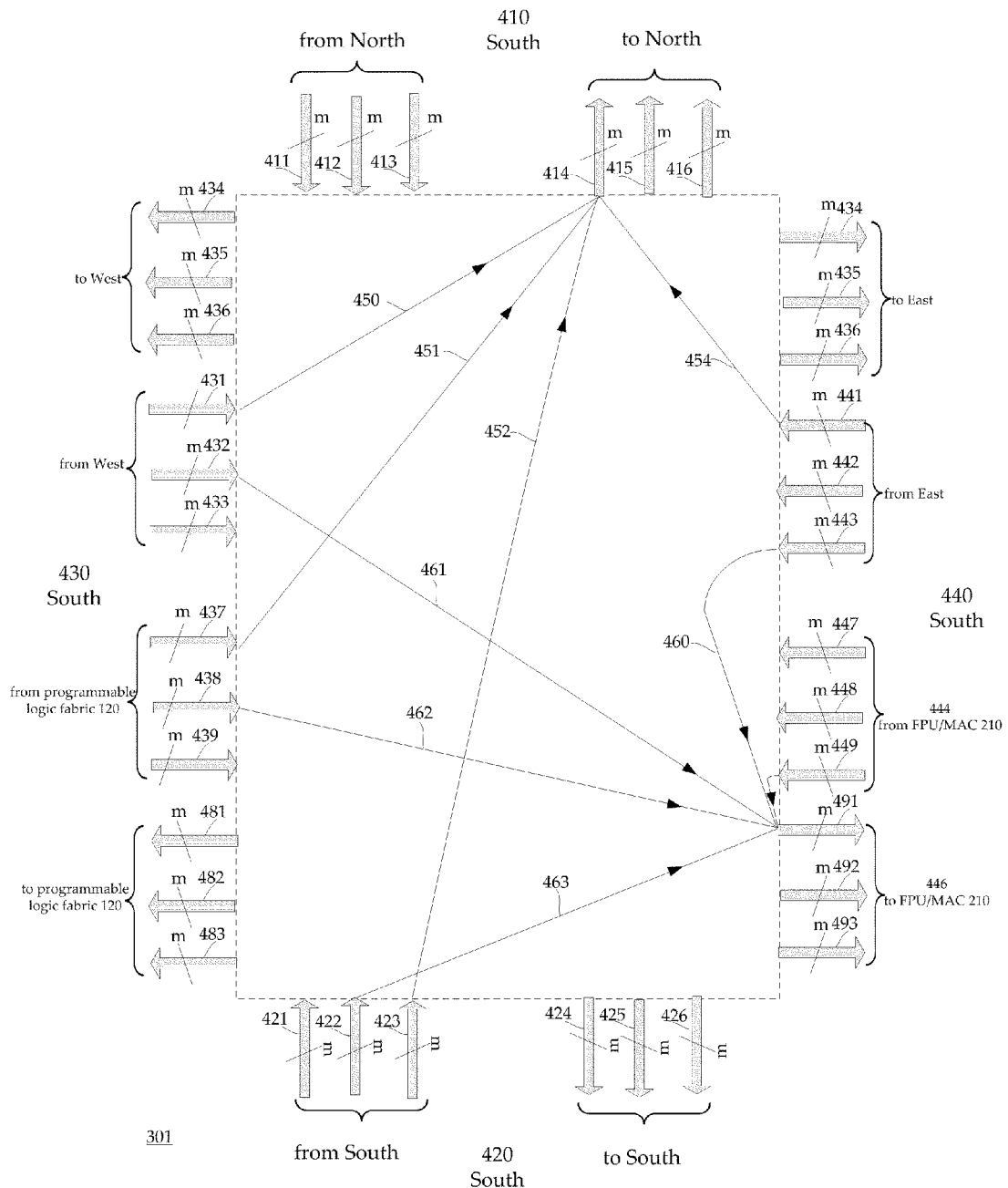
FIG. 7 is a block diagram illustrating a two-dimensional view of the bus-based dedicated connection box for routing one or more bus-based inputs to one or more bus-based outputs in accordance with the present invention.

FIG. 7 is a block diagram illustrating a two-dimensional view of the bus-based dedicated connection box 301 for routing one or more bus-based inputs to one or more bus-based outputs. The bus-based dedicated connection box 301 received one or more bus-based inputs and generates one or more bus-based outputs to one or more among the four compass directions, a north N compass direction 410, a south S compass direction 420, a west W compass direction 430 and an east E compass direction 440. Although the width of a bus in the bus-based dedicated connection box 301 is shown as m-bit, other bit numbers for a bus, or a combination of buses, can be selected for use in the bus-based dedicated connection box 301.

In the south compass direction 420, buses 421, 422, 423 are entering the bus-based connection box 430 from the south compass direction 420. Buses 424, 425, 426 are exiting the bus-based connection box 301 toward the south compass direction 420.

In the west compass direction 430, buses 431, 432, 433 are entering the bus-based connection box 301 from the west compass direction 430. Buses 434, 435, 436 are exiting the bus-based connection box 301 toward the west compass direction 430. Buses 437, 438, 439 are entering the bus-based connection box 301 from the programmable logic fabric 120. Buses 481, 482, 483 are exiting the bus-based connection box 301 toward the programmable fabric logic 120.

In the north compass direction 410, buses 411, 412, 413 are entering the bus-based connection box 410 from the north compass direction 410. Buses 414, 415, 416 are exiting the bus-based connection box 301 toward the north compass direction 410. The bus-based output 414 receives one of the possible bus-based inputs by transferring the bus-based input 431 through a bus 450 to the bus-based output 414, transferring the bus-based input 437 through a bus 451 to the bus-based output 414, transferring the bus-based input 423 through a bus 452 to the bus-based output 414, or transferring a bus-based input 441 through a bus 454 to the bus-based output 414.

In the east compass direction 440, buses 441, 442, 443 are entering the bus-based connection box 301 from the east compass direction 440. Buses 444, 445, 446 are exiting the bus-based connection box 301 toward the east compass direction 440. Buses 447, 448, 449 are entering the bus-based connection box 301 from the FPU/MAC 210. Buses 491, 492, 493 are exiting the bus-based connection box 301 toward the FPU/MAC 210.

The bus-based output 419 receives one of the possible bus-based inputs by transferring the bus-based input 443 through a bus 460 to the bus-based output 419, transferring the bus-based input 432 through a bus 461 to the bus-based output 419, transferring the bus-based input 462 through a bus 462 to the bus-based output 419, or transferring a bus-based input 422 through a bus 463 to the bus-based output 419.

Figure 8:
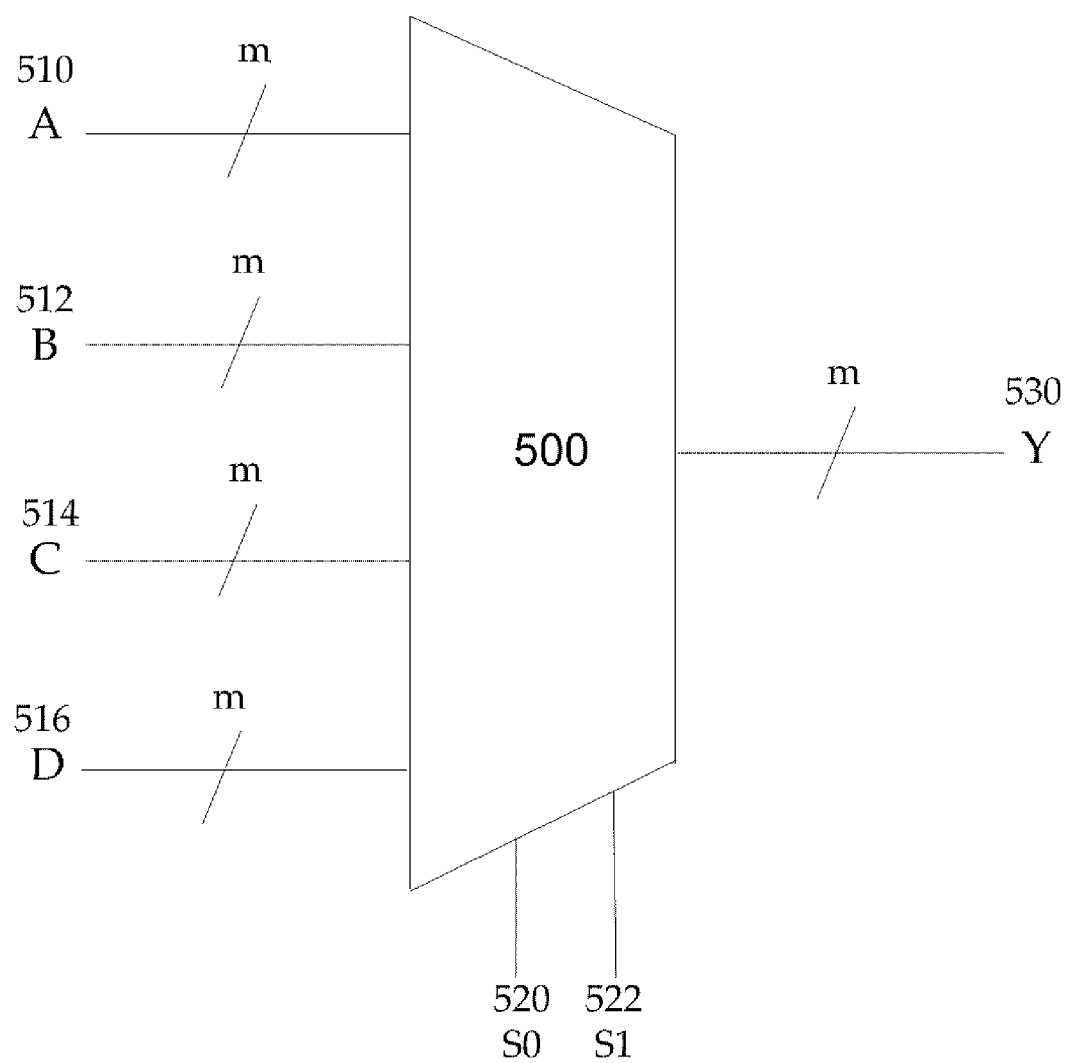
FIG. 8 is a circuit diagram illustrating a multiplexer for routing bus-based connections with selectable configurable bits in accordance with the present invention.

FIG. 8 is a circuit diagram illustrating a multiplexer 500 for routing bus-based connections with selectable configurable bits. The multiplexer 500 receives a plurality of bus-based inputs A 510, B 512, C 514 and D 516, each of which is a bus width of m, for example, 48 bits. The multiplexer 500 includes configuration bits S0 520, S1 522, which select which one of the bus-based inputs A 510, B 512, C 514 and D 516 to connect to an output Y 530, which has m-wide bus. For example, the multiplexer 500, disposed inside the bus-based dedicated connection 301, can be used to select from among one of the incoming bus-based inputs 431, 437, 423, 441 to the bus-based output 414, depending on the selection combination of the configuration bits S0 520, S1 522.

Figure 9:
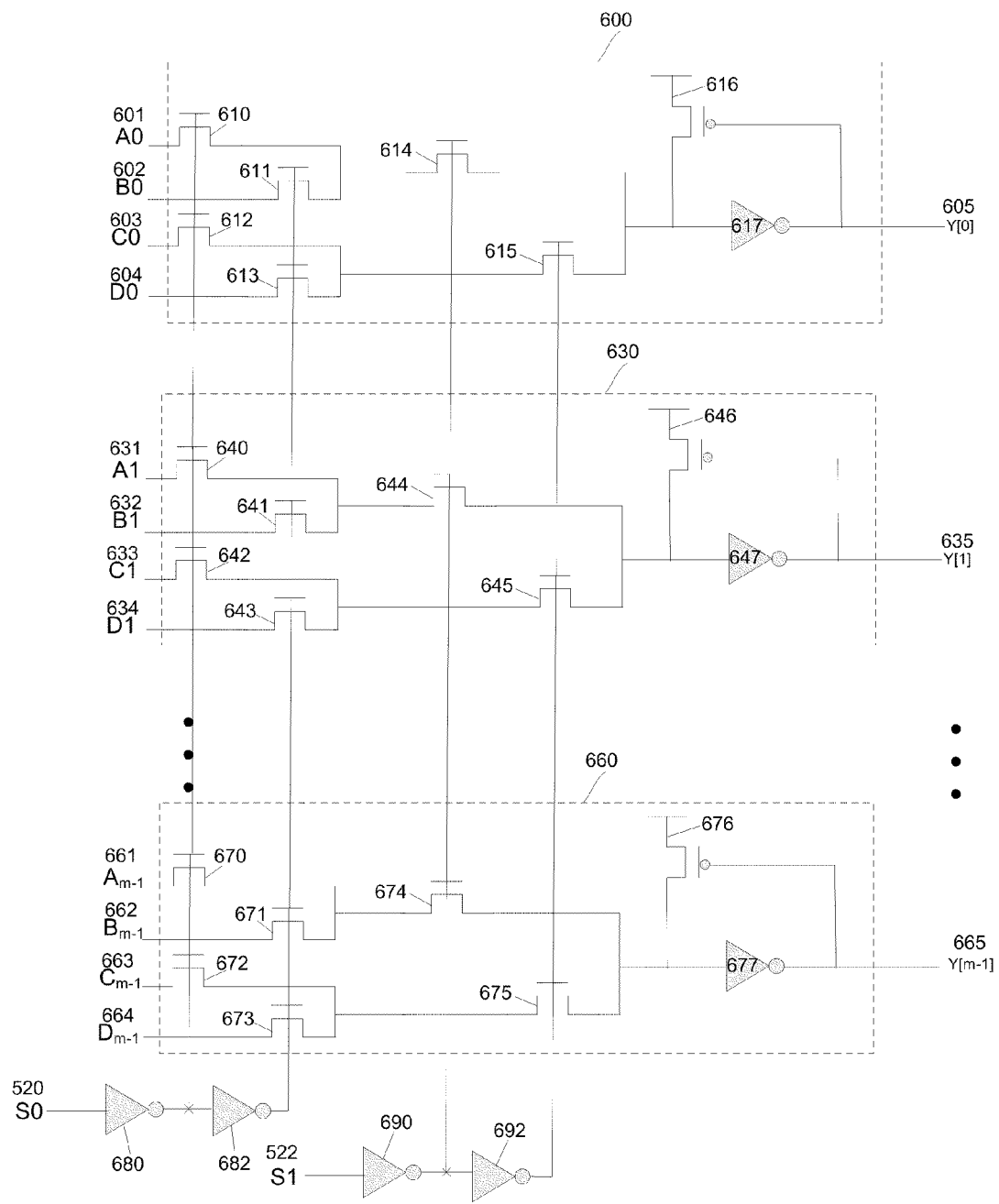
FIG. 9 is a block diagram illustrating an exploded view of bus-routing of a signal processing unit through the bus-based connection box in accordance with the present invention.

FIG. 9 is a simplified circuit diagram illustrating the bus-based dedicated connection box 301 that includes a multiple number of multipliers 600, 630, 660 for routing bus-based inputs to bus-based outputs with configuration bits 520, 522. The selection as to which bus input, such as bus A, bus B, bus C, or bus D is selected for routing to an output bus is determined by two select bits, S0 520 and S1 521. Table 5 below summarizes a truth table on the selection of select bits and a corresponding output bus.

TABLE 5

| S1 | S0 | Bus |
| --- | --- | --- |
| 0 | 0 | A |
| 0 | 1 | B |
| 1 | 0 | C |
| 1 | 1 | D |

Suppose the two selection bits S0 520 and S1 522 are set as follows: S0=0 and S1=0. The first selection bit S0 520 is equal to a logic 0 at an input of an inverter 680. The inverter 680 generates an output of 1. An inverter 682 receives an input of 1 from the inverter 680 and generates an output of 0. The second selection bit S1 522 is equal to a logic 0 at an input of an inverter 690. The inverter 690 generates an output of 1. An inverter 692 receives an input of 1 from the inverter 690 and generates an output of 0.

The inverter 680 generates an output of 1 for the selection bit S0 520, and triggers a transistor 610 to turn on in passing an input 601 A0. The inverter 690 generates an output of 1 for selection bit S1 522, and triggers a transistor 614 to turn on in passing the A0 through the transistor 614. An inverter 710 receives an input of A0 from the transistor 614 and generates an inverted output Y[0] to the bus A. If the value of A0 is a binary 0, then the output will be a binary 1. If the value of A0 is a binary 1, then the output will be a binary 0.

If selection bit S0 520 is equal to 0 and selection bit S1 522 is equal to 1, then input bus B will be selected. If selection bit S0 520 is equal to 1 and selection bit S1 522 is equal to 0, then input bus C will be selected. If selection bit S0 520 is equal to 1 and selection bit S1 522 is equal to 1, then input bus D will be selected.

Figure 10:
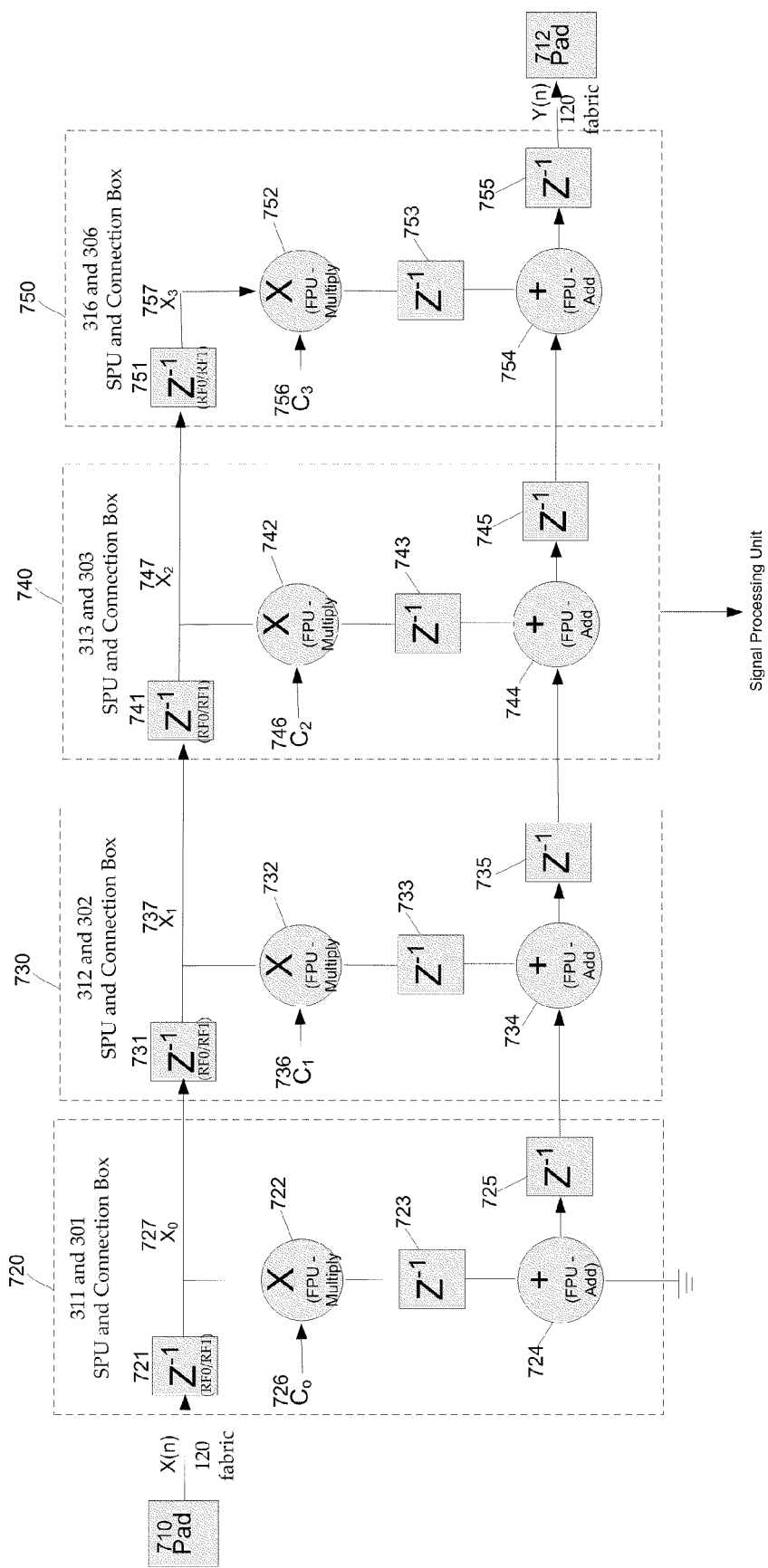
FIG. 10 is a block diagram illustrating a first exemplary application of the signal processing engine for processing a finite impulse response in accordance with the present invention.

FIG. 10 is a circuit diagram 700 illustrating an application of the signal processing engine for processing a finite impulse response (FIR) with single precision. The circuit 700 comprises a series of signal process engines cascaded in a delayed chain that are coupled to fabric 120, which is further coupled to pads 710, 712. The output of the final impulse response is represented by the symbol Y(n), and the input of the finite impulse response is represented by X(n).

Signal processing engines 720, 730, 740, 750 are cascaded in a delay chain. The first signal processing engine 720, which includes the signal processing unit 311 and the bus-based dedicated connection box 301, receives an input X(n) from the pad 710 through the fabric 120. The signal processing unit 311 has a first FPU/MADD 722 for performing a multiply operation and a second FPU/MAC 724 for performing an add operation. The first FPU/MAC 722 multiplies a constant value $C_0$ 726 with an input value $X_0$ 727. A first delay circuit 721 is disposed before a signal reaches the first FPU/MADD 722. A second delay circuit 723 is connected between the first FPU/MADD 722 and the second FPU/MADD 724. A third delay circuit 725 is disposed after the second FPU/MADD 725.

The second signal processing engine 730, which includes the signal processing unit 312 and the bus-based dedicated connection box 302, receives an input $X_0$ 727 from the first signal processing engine 720. The signal processing unit 312 has a first FPU/MADD 732 for performing a multiply operation and a second FPU/MADD 734 for performing an add operation. The first FPU/MADD 732 multiplies a constant value $C_1$ 736 with an input value $X_1$ 737. A first delay circuit 731 is disposed before a signal reaches the first FPU/MADD 732. A second delay circuit 733 is connected between the first FPU/MADD 732 and the second FPU/MADD 734. A third delay circuit 735 is disposed after the second FPU/MADD 735.

The third signal processing engine 740, which includes the signal processing unit 313 and the bus-based dedicated connection box 303, receives an input $X_1$ 737 from the second signal processing engine 730. The signal processing unit 313 has a first FPU/MADD 742 for performing a multiply operation and a second FPU/MADD 744 for performing an add operation. The first FPU/MADD 742 multiplies a constant value $C_2$ 746 with an input value $X_2$ 747. A first delay circuit 741 is disposed before a signal reaches the first FPU/MADD 742. A second delay circuit 743 is connected between the first FPU/MADD 742 and the second FPU/MADD 744. A third delay circuit 745 is disposed after the second FPU/MADD 745.

The fourth signal processing engine 750, which includes the signal processing unit 316 and the bus-based dedicated connection box 306, receives an input $X_2$ 747 from the third signal processing engine 740. The signal processing unit 316 has a first FPU/MADD 752 for performing a multiply operation and a second FPU/MADD 754 for performing an add operation. The first FPU/MADD 752 multiplies a constant value $C_i$ 756 with an input value $X_1$ 757. A first delay circuit 751 is disposed before a signal reaches the first FPU/MADD 752. A second delay circuit 753 is connected between the first FPU/MADD 752 and the second FPU/MADD 754. A third delay circuit 755 is disposed after the second FPU/MADD 755. The output for the finite impulse response can be represented by the following equation:

$$Y(n)=C_0X_0+C_1X_1+C_2X_2+C_3X_3$$

where each parameter $C_0$, $C_1$, $C_2$, $C_3$ represents a constant coefficient or pre-calculated constant value.

Figure 11:
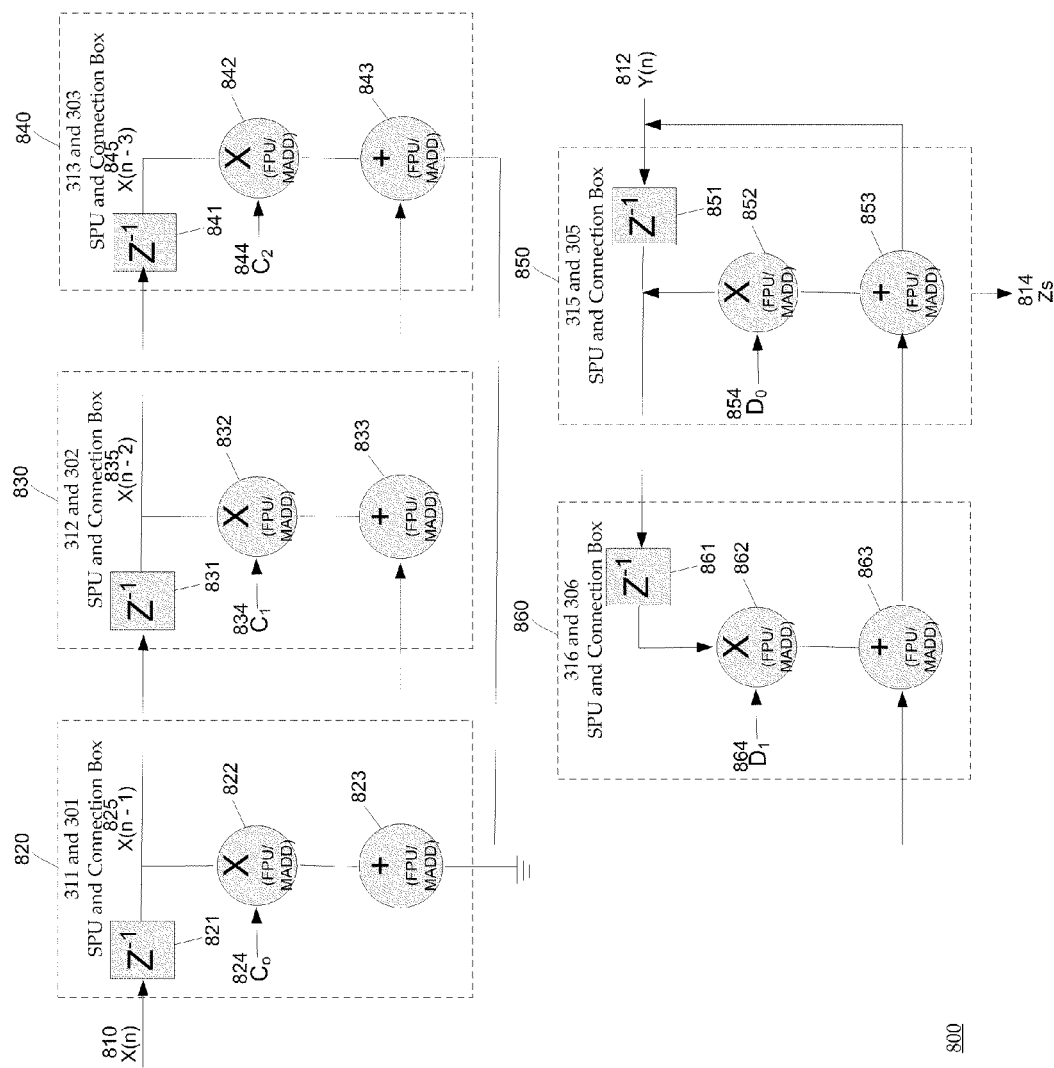
FIG. 11 is a block diagram illustrating a second exemplary application of the signal processing engine for processing an infinite impulse response in accordance with the present invention.

A second exemplary application of the signal processing engine for processing an infinite impulse response is shown in a circuit diagram 800 in FIG. 11.

Figure 12:
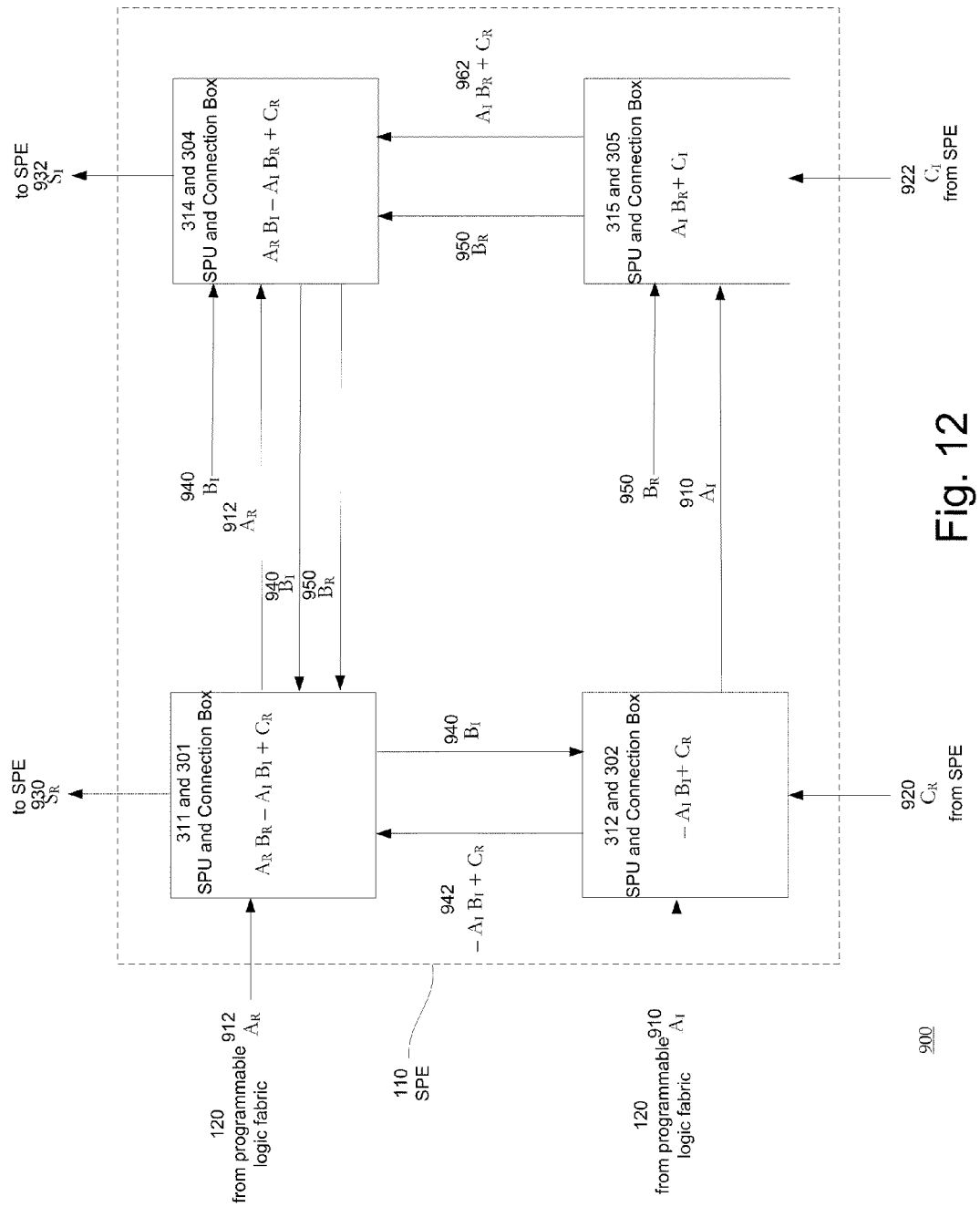
FIG. 12 is a block diagram illustrating a third exemplary application of the signal processing engine for processing a complex multiply-add function in accordance with the present invention.

FIG. 12 is a block diagram illustrating a third exemplary application of the signal processing engine for processing a complex multiply-add operation with a complex multiply-add logic 900, which can be implemented in a signal processing engine. In this example, the complex multiply-add logic 900 receives a signal $A_R$ 912 from the programmable logic fabric 120, a signal $A_I$ 910 from the programmable logic fabric 120, a signal $B_R$ 960, a signal $B_I$ 940, a signal $C_R$ 920 from a signal processing engine and a signal $C_I$ 922 from a signal processing engine. Each of the parameters $\overline{A}$, $\overline{B}$, $\overline{C}$ has a real component and an imaginary component, which can be represented mathematically in the following three equations:

$$\overline{A}=A_R+jA_I \qquad \text{Eq. (1)}$$

where the symbol $A_R$ denotes a real component, and the symbol $jA_I$ denotes an imaginary component. The parameter $\overline{B}$ is defined as follows:

$$\overline{B}=B_R+jB_I \qquad \text{Eq. (2)}$$

where the symbol $B_R$ denotes a real component, and the symbol $jB_I$ denotes an imaginary component. The parameter $\overline{C}$ is defined as follows:

$$\overline{C}=C_R+jC_I \qquad \text{Eq. (3)}$$

where the symbol $C_R$ denotes a real component, and the symbol $jC_I$ denotes an imaginary component.

The complex multiply-add circuit 900 performs a multiply operation and an add operation of the three parameters $\overline{A}$, $\overline{B}$, $\overline{C}$, as represented by the following equation:

$$\overline{\text{SUM}}=\overline{A}\times\overline{B}+\overline{C} \qquad \text{Eq. (4)}$$

The calculation of the multiply-operation for Equation 4 can be expanded as shown below:

$$\overline{\text{SUM}}=(A_R+jA_I)\times(B_R+jB_I)+(C_R+jC_I)=(A_R\times B_R-A_I\times B_I+C_R)+j(A_R\times B_I+A_I\times B_R+C_I)$$

The signal processing engine 110, which includes a signal processing unit and a bus-based connection box, performs the computations in the multiply-add operation of $\overline{A}$, $\overline{B}$, $\overline{C}$, to generate an output $\overline{\text{SUM}}$ of $S_R$ and $S_I$, which equates to $(A_R\times B_R-A_I\times B_I+C_R)$ for the parameter $S_R$ and $(A_R\times B_I+A_I\times B_R+C_I)$ for the parameter $S_I$.

In this embodiment, the complex multiply-add logic 900 comprises four signal processing units and bus-based dedicated connection boxes, the signal processing unit 312 and the bus-based dedicated connection box 302, the signal processing unit 311 and the bus-based dedicated connection box 301, the signal processing unit 315 and the bus-based dedicated connection box 305, and the signal processing unit 314 and the bus-based dedicated connection box 304. The signal processing unit 312 and the bus-based dedicated connection box 302 receive an input 910 $A_I$, an input $C_R$ 920 from a signal processing engine, and the input $B_I$ 940, computes a term of $-A_I B_I+C_R$, and generates an output term $-A_I B_I+C_R$ 942. The signal processing unit 315 and the bus-based dedicated connection box 305 receives an input $C_I$ 922 from a signal processing engine, an input of BR 950, an input $A_I$ 910 from the signal process unit 312 and the bus-based dedicated connection box 302, computes a term of $A_I B_R + C_I$, and generates an output of $A_I B_R + C_I$ 962 and an output $B_R$ 950. The signal processing unit 311 and the bus-based dedicated connection box 301 receives the input $A_R$ 912 from the programmable logic fabric 120, an input of $-A_I B_I + C_R$, an input $B_I$ 940, and an input $B_R$ 950, and computes a term of $A_R B_R - A_I B_I + C_R$ where an FPU serves as both a multiplier and an adder. The signal processing unit 311 and the bus-based dedicated connection box 301 generates an output $B_I$ 940, an output $A_R$ 912, and an output 930 to a signal processing engine. The signal processing unit 314 and the bus-based dedicated connection box 304 receive an input $B_I$ 970, an input $A_R$ 972, a $B_R$ 960, an input of $A_I B_R + C_R$ 962, and generates an output 932 to a signal processing engine.

The applications described above are intended as sample illustrations. The present invention is applicable to a wide array of high end signal processing applications including radar/sonar, medical imaging, synthetic aperture radar, professional video broadcast and encoding and high end image processing.

Figure 13A:
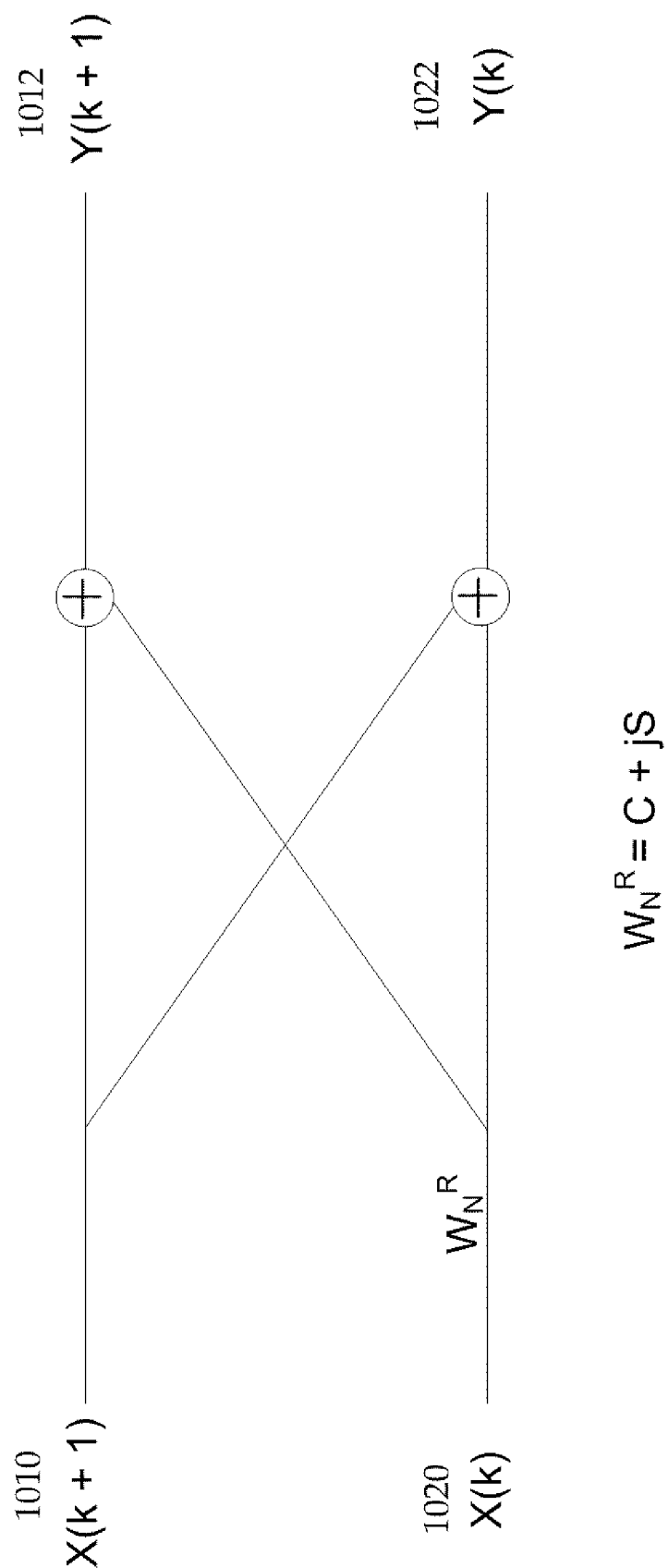
FIGS. 13A-13B are block diagrams illustrating a fourth exemplary application of the signal processing engine for processing a radix-2 butterfly in accordance with the present invention.
Figure 13B:
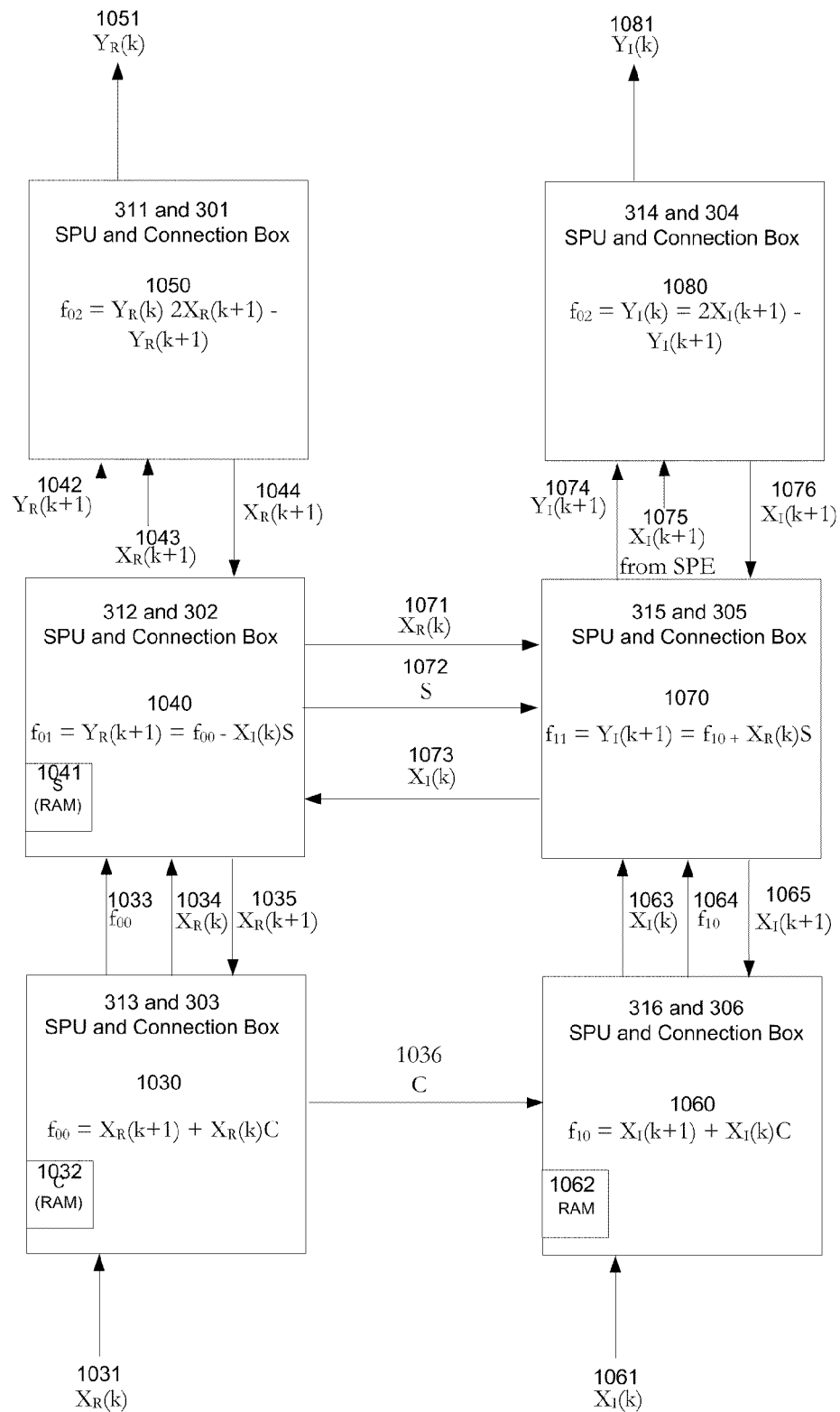

FIGS. 13A-13B are block diagrams illustrating a fourth exemplary application of the signal processing engine for processing a radix-2 butterfly. The inputs of X(k+1) 1010 and X(k) 1020 are represented in the following two equations.

$$X(k+1) = X_R(k+1) + jX_I(k+1)$$

$$X(k) = X_R(k) + jX_I(k)$$

The outputs of Y(k+1) 1012 and Y(k) 1022 of the radix 2-butterfly are shown in the following two equations.

$$Y(k+1) = Y_R(k+1) + jX_R(k+1)$$

$$Y(k) = Y_R(k) + jY_I(k)$$

Therefore, the computation of Y(k+1) is described below:

$$Y(k+1) = W_N^R \cdot X(k) + X(k+1) = (C+jS)\{X_R(k)+jX_I(k)\} + X_R(k+1)+jX_I(k+1)\} = \{CX_R(k)-SX_I(k)+X_R(k+1)/Y_R(k+1)\} + j\{CX_I(k)+SX_R(k)+X_I(k+1)/Y_I(k+1)\}$$

FIG. 13B is a block diagram illustrating a system 1000 of the fourth exemplary application of the signal processing engine for processing a radix-2 butterfly. The system 1000 includes the signal processing unit 313 and the bus-based dedicated connection box 303, the signal processing unit 312 and the connection box and the bus-based dedicated connection box 302, the signal processing unit 311 and the connection box and the bus-based dedicated connection box 301, the signal processing unit 316 and the connection box and the bus-based dedicated connection box 306, the signal processing unit 315 and the connection box and the bus-based dedicated connection box 305, and the signal processing unit 314 and the connection box and the bus-based dedicated connection box 304. The signal processing unit 313 and the bus-based dedicated connection box 303, which are coupled to a random access memory 1032 for storing a variable C, receive an input of $X_R(k)$ 1031, an input of $X_R(k+1)$ 1035 from the signal processing unit 312 and the bus-based dedicated connection box 302, compute the term of $f_{00}$ 1030=$X_R(k+1)+X_R(k)C$, and generate an output $f_{00}$ 1033 to the signal processing unit 312 and the bus-based dedicated connection box 302, an output of $X_R(k)$ 1034 to the signal processing unit 312 and the bus-based dedicated connection box 302, and an output of C 1036 to the signal processing unit 316 and the connection box and the bus-based dedicated connection box 306.

The signal processing unit 312 and the bus-based dedicated connection box 302, which are coupled to a random access memory 1032 for storing a variable C, receive an input of $f_{00}$ 1033, an input of $X_R(k)$ 1034, an input of $X_R(k+1)$ 1044 from the signal processing unit 311 and the connection box and the bus-based dedicated connection box 301, an input $X_I(k)$ 1073 from the signal processing unit 315 and the connection box and the bus-based dedicated connection box 305, compute the term of $f_{01}$ 1040=$Y_R(k+1)=f_{00}-X_I(k)S$, and generate an output of $Y_R(k+1)$ 1042 to the signal processing unit 311 and the connection box and the bus-based dedicated connection box 301, an output of $X_R(k)$ 1071 to the signal processing unit 315 and the connection box and the bus-based dedicated connection box 305, and an output S 1072 to the signal processing unit 315 and the connection box and the bus-based dedicated connection box 305.

The signal processing unit 311 and the bus-based dedicated connection box 301 receive an input of $Y_R(k+1)$ 1042 from the signal processing unit 312 and the connection box and the bus-based dedicated connection box 302, an input of $X_R(k+1)$ 1043 from the signal processing unit 312 and the connection box and the bus-based dedicated connection box 302, computes the term of $f_{02}$ 1050=$Y_R(k)$ $2X_R(k+1)-Y_R(k+1)$, and generates an output of $Y_R(k)$ 1051.

The signal processing unit 316 and the bus-based dedicated connection box 306, which are coupled to a random access memory 1062, receive an input of $X_I(k)$ 1061, an input of C 1036 from the signal processing unit 313 and the bus-based dedicated connection box 303, an input of $X_I(k+1)$ 1065 from the signal processing unit 315 and the bus-based dedicated connection box 305, compute the term of $f_{10}$ 1060=$X_I(k+1)+X_I(k)C$, and generate an output of $X_I(k)$ 1063 to the signal processing unit 315 and the bus-based dedicated connection box 305, and an output of $f_{10}$ 1064 to the signal processing unit 315 and the bus-based dedicated connection box 305.

The signal processing unit 315 and the bus-based dedicated connection box 305 receive an input of $X_I(k)$ 1063 from the signal processing unit 316 and the bus-based dedicated connection box 306, an input of $f_{10}$ 1063 from the signal processing unit 316 and the bus-based dedicated connection box 306, an input of S 1072 from the signal processing unit 312 and the bus-based dedicated connection box 302, an input of $X_I(k)$ 1073 from the signal processing unit 315 and the bus-based dedicated connection box 305, an input of $X_I(k+1)$ 314 from the signal processing unit 316 and the bus-based dedicated connection box 304, compute the term of $f_{11}$ 1070=$Y_I(k+1)=f_{10}++X_R(k)S$, and generate an output of $X_I(k+1)$ 1065 to the signal processing unit 316 and the bus-based dedicated connection box 306, an output of $X_I(k)$ 073 to the signal processing unit 312 and the bus-based dedicated connection box 302, and an output of $Y_I(k+1)$ 1074 to the signal processing unit 314 and the bus-based dedicated connection box 304.

The signal processing unit 314 and the bus-based dedicated connection box 304 receive an input of $Y_I(k+1)$ 1074 from the signal processing unit 315 and the bus-based dedicated connection box 305, an input of $X_I(k+1)$ 1075, compute the term $f_{02}$ 1080=$Y_I(k)=2X_I(k+1)-Y_I(k+1)$, generate an output of $X_I(k+1)$ 1076 to the signal processing unit 315 and the bus-based dedicated connection box 305, and generate an output of $Y_I(k)$ 1081.

Figure 14:
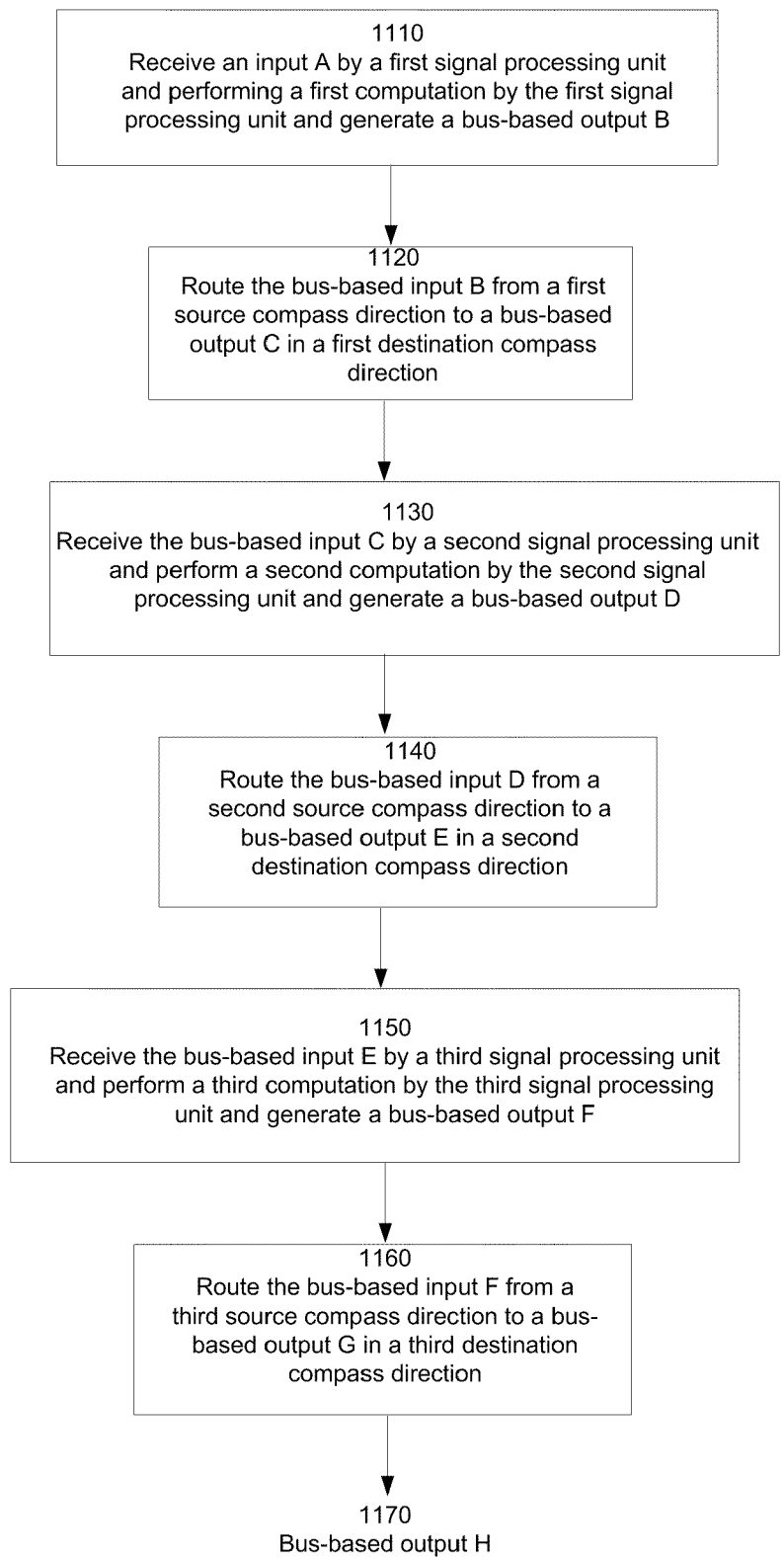
FIG. 14 is a flow diagram illustrating the process executed in a configurable integrated circuit employing signal processing engines for serial computations in accordance with the present invention.

FIG. 14 is a flow diagram illustrating the process 1100 executed in a configurable integrated circuit employing signal processing engines for serial computations. At step 1110, the first signal processing unit 311 receives an input A and performs a first computation to generate a bus-based output B. The bus-based dedicated connection box 301 routes 1120 the bus-based input B from a first source compass direction to a bus-based output C in a first destination compass direction. At step 1130, the second signal processing unit 312 receives the input C and performs a second computation to generate a bus-based output D. The bus-based dedicated connection box 302 routes 1140 the bus-based input D from a second source compass direction to a bus-based output E in a second destination compass direction. At step 1150, the third signal processing unit 313 receives the input E and performs a third computation to generate a bus-based output F. The bus-based dedicated connection box 303 routes 1160 the bus-based input F from a third source compass direction to a bus-based output G in a third destination compass direction to generate a bus-based output H. The first, second, third source compass directions, and the first, second, third destination compass directions can be any compass direction including a north compass direction, a south compass direction, a west compass direction and an east compass direction.

Figure 15:
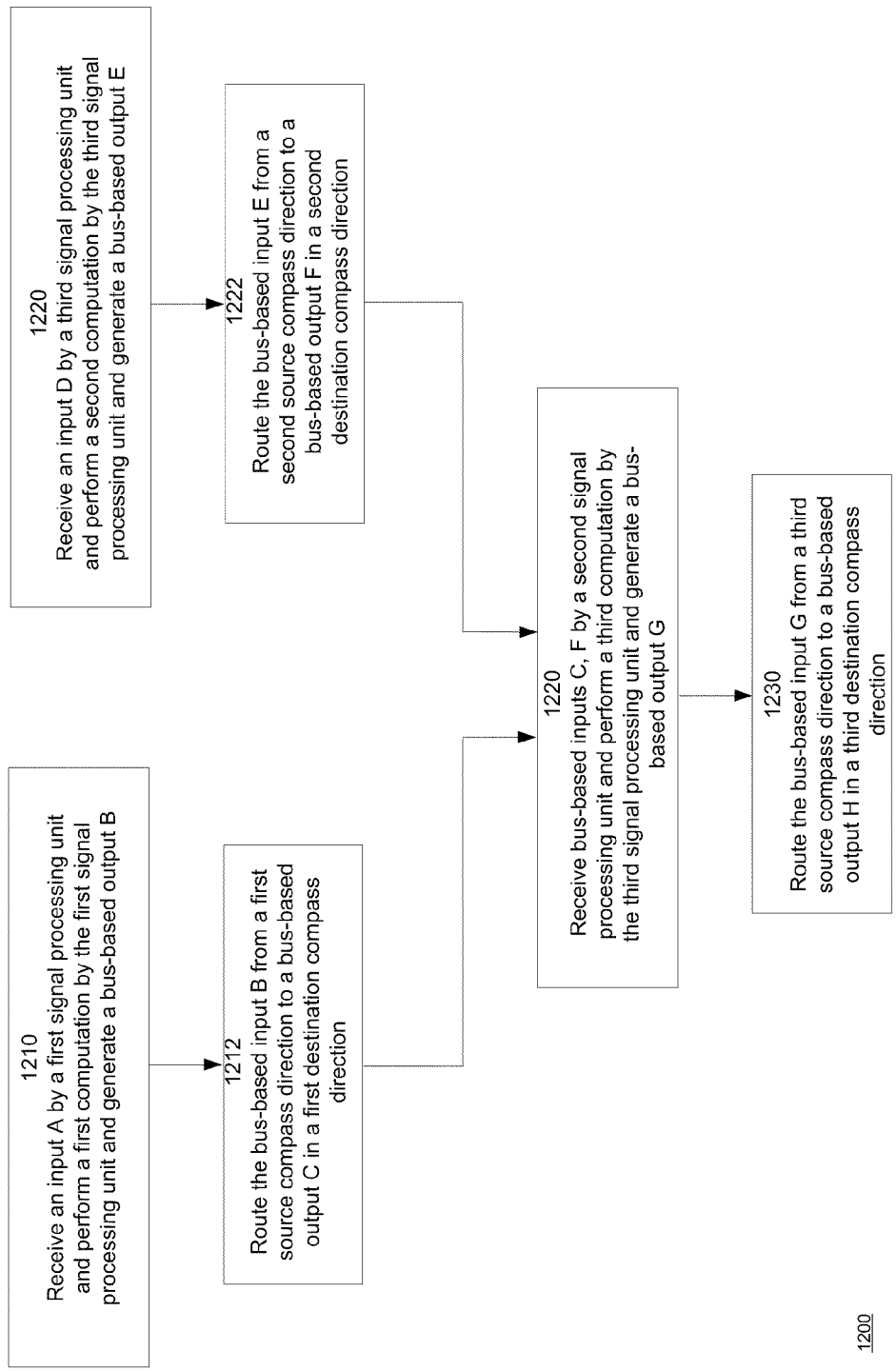
FIG. 15 is a flow diagram illustrating the process executed in a configurable integrated circuit employing signal processing engines for parallel computations in accordance with the present invention.
Figure 1:
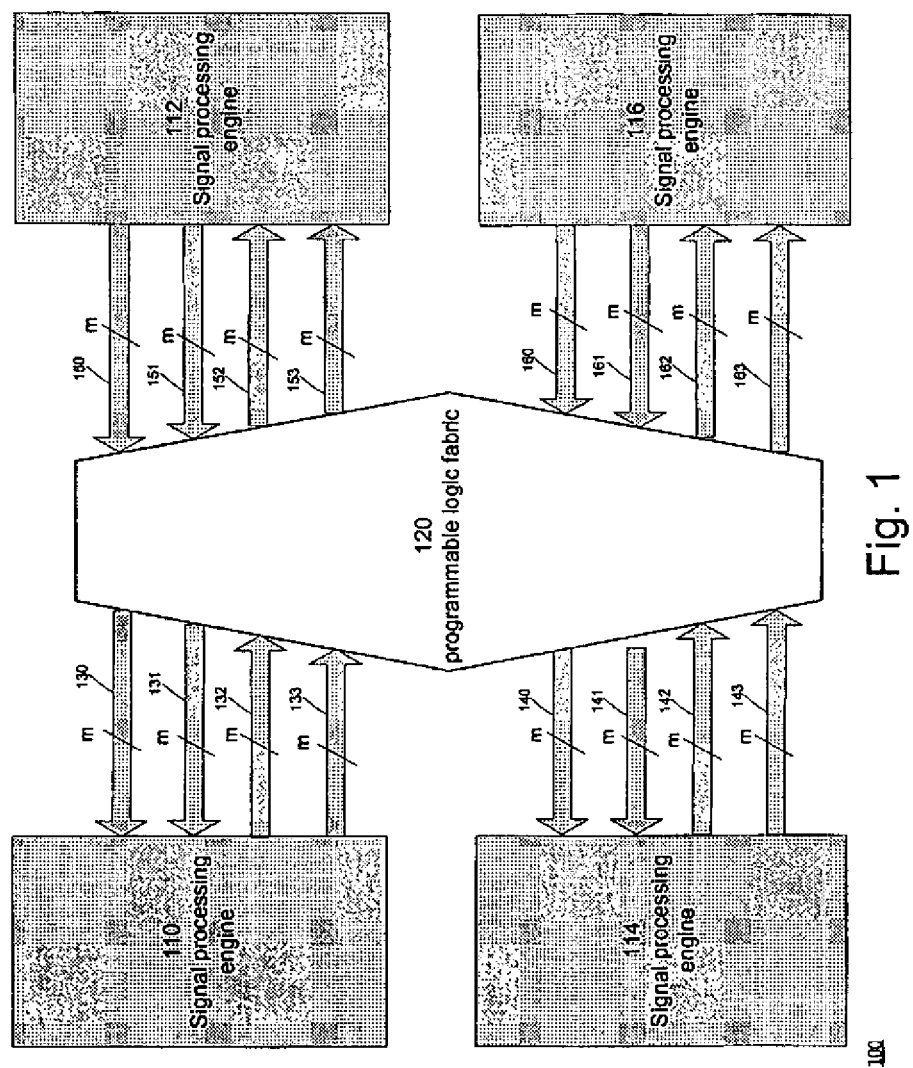
Figure 2:
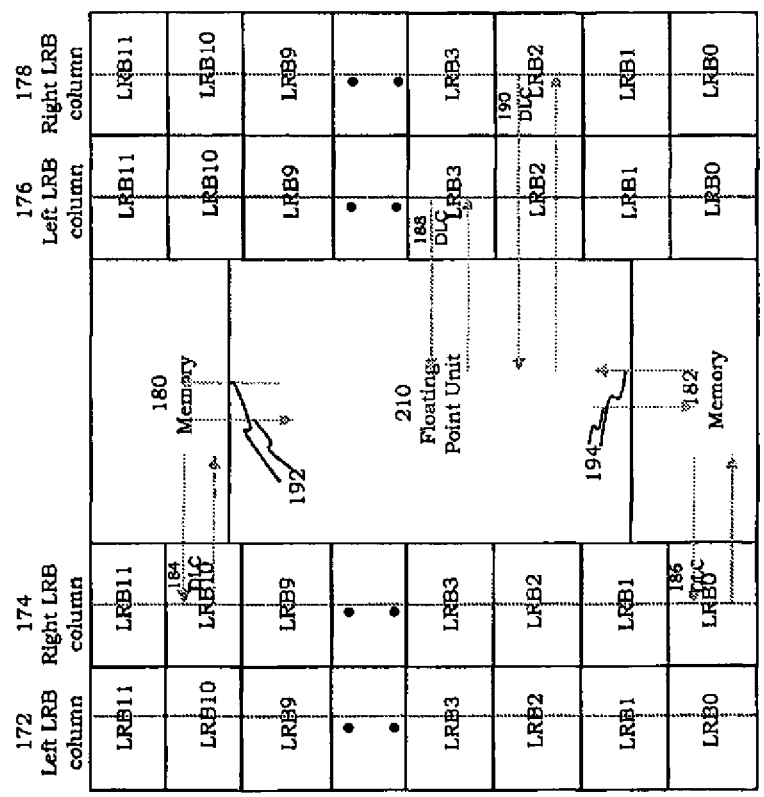
Figure 4:
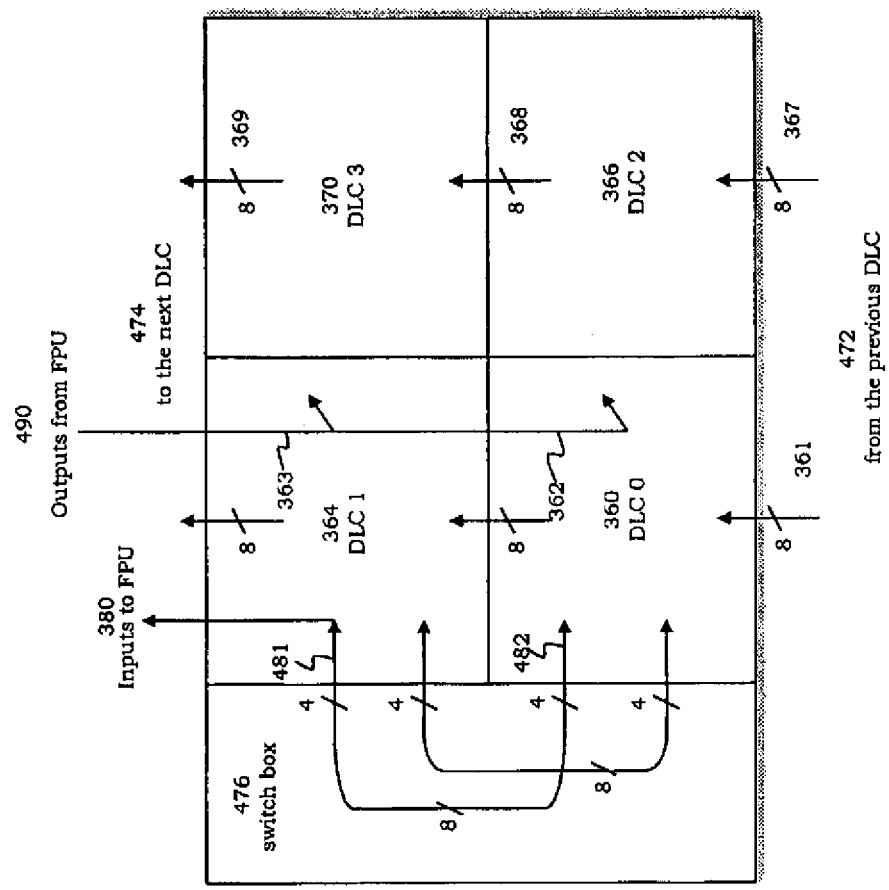
Figure 5:
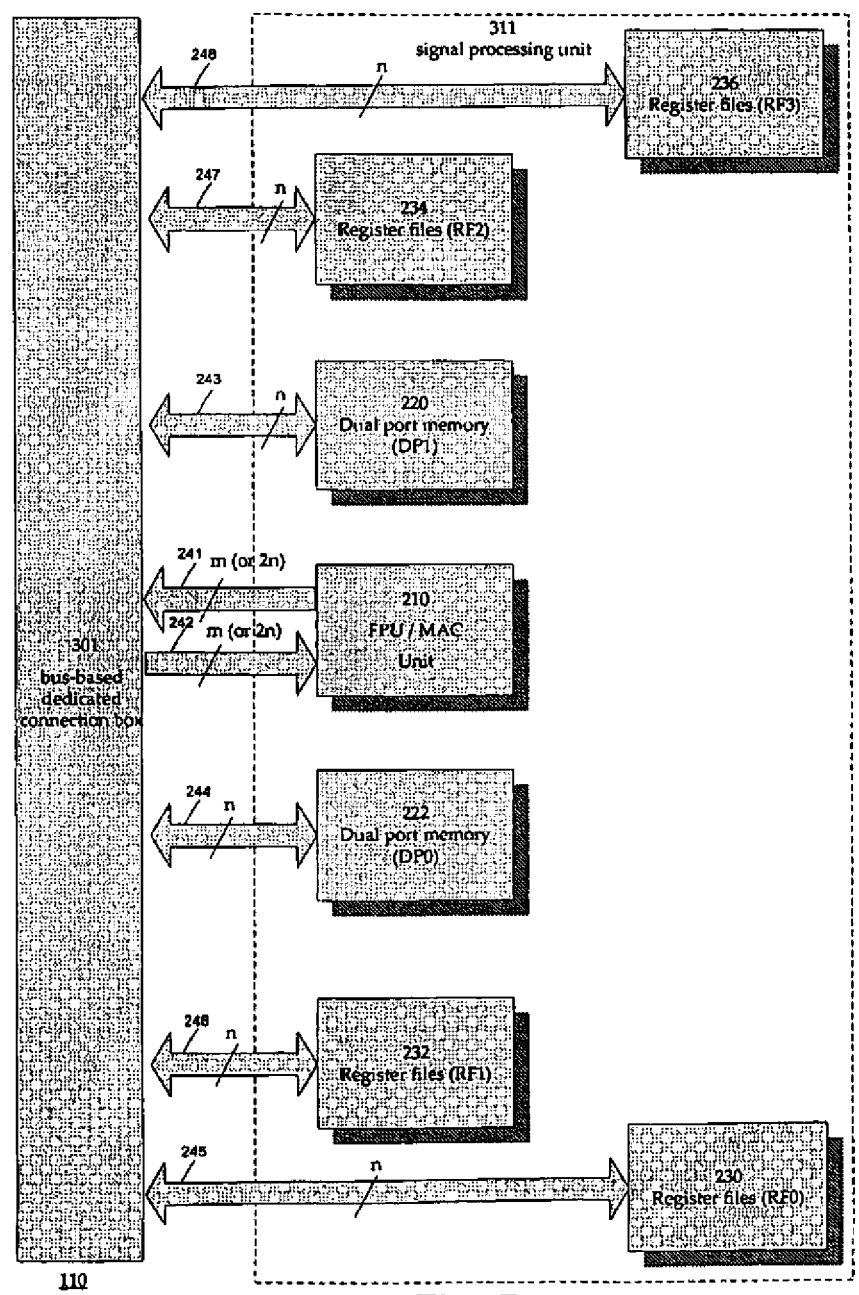
Figure 6:
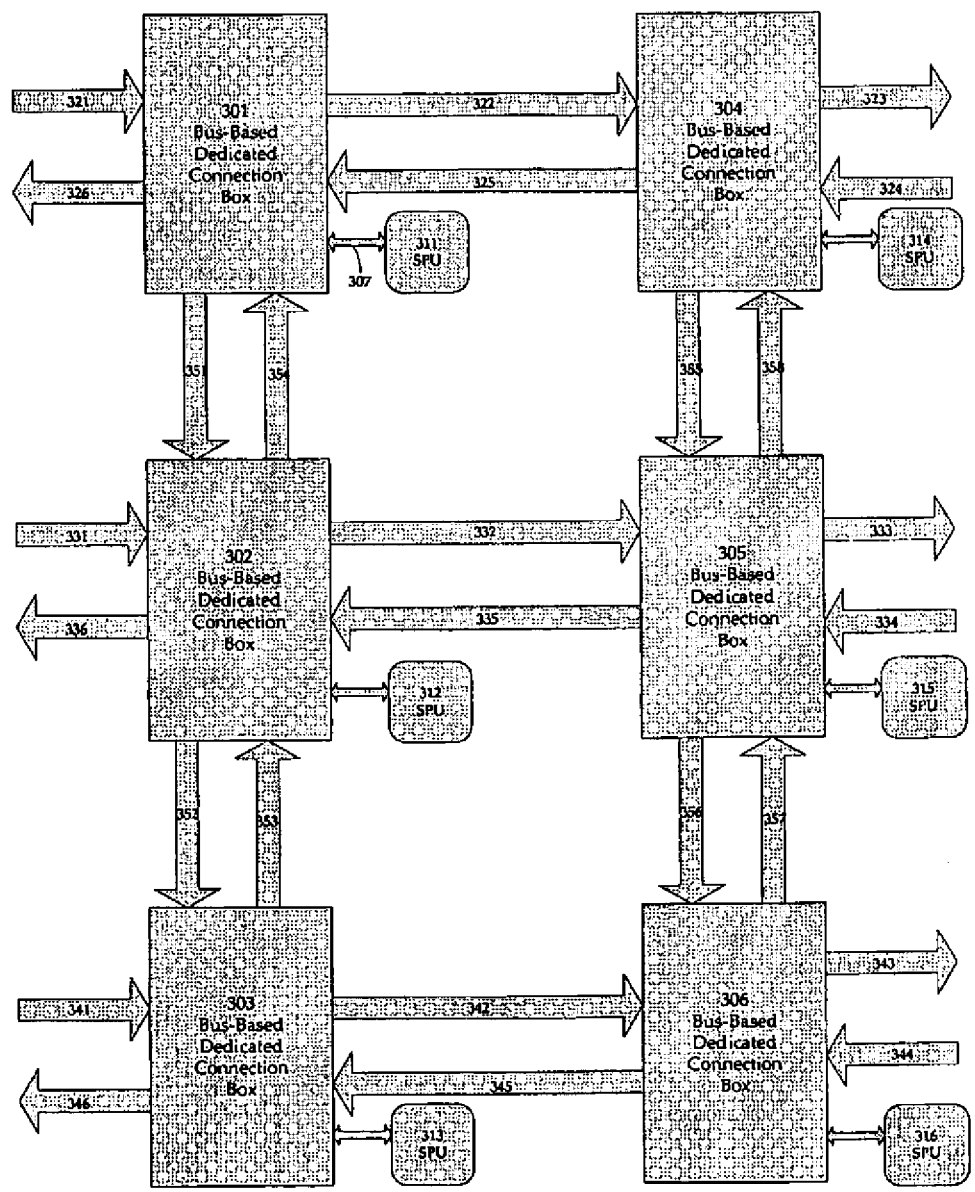
Figure 7:
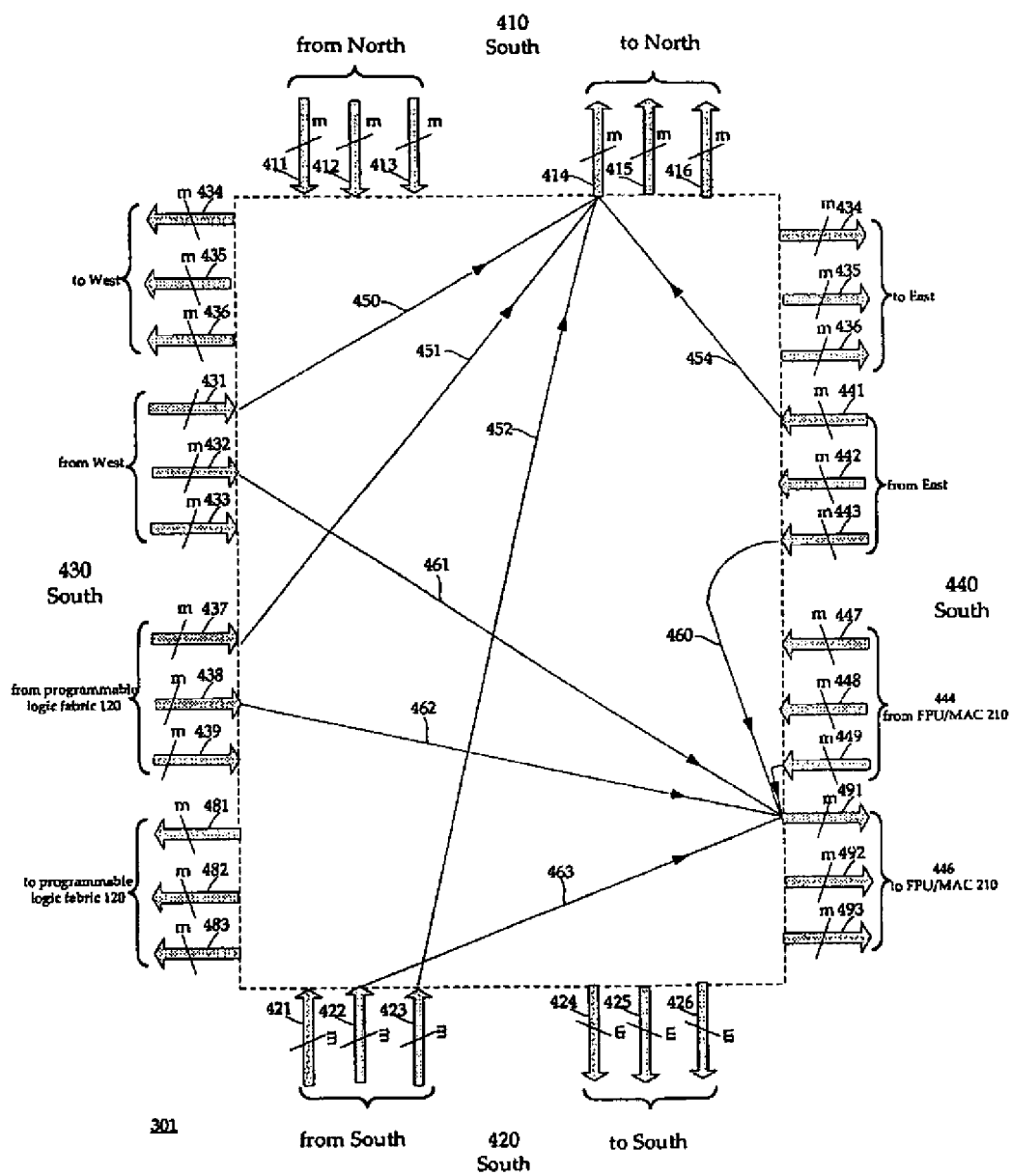
Figure 8:
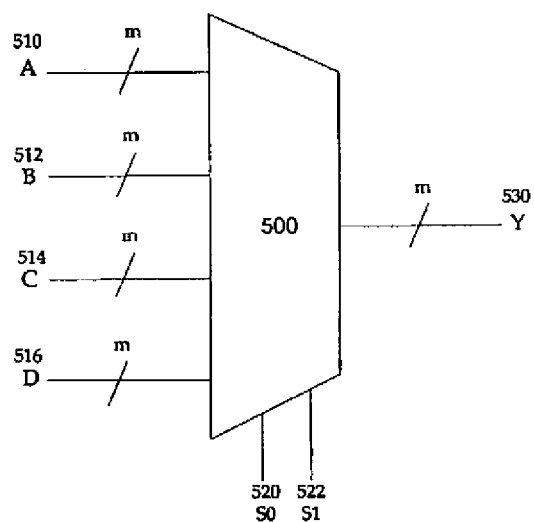
Figure 9:
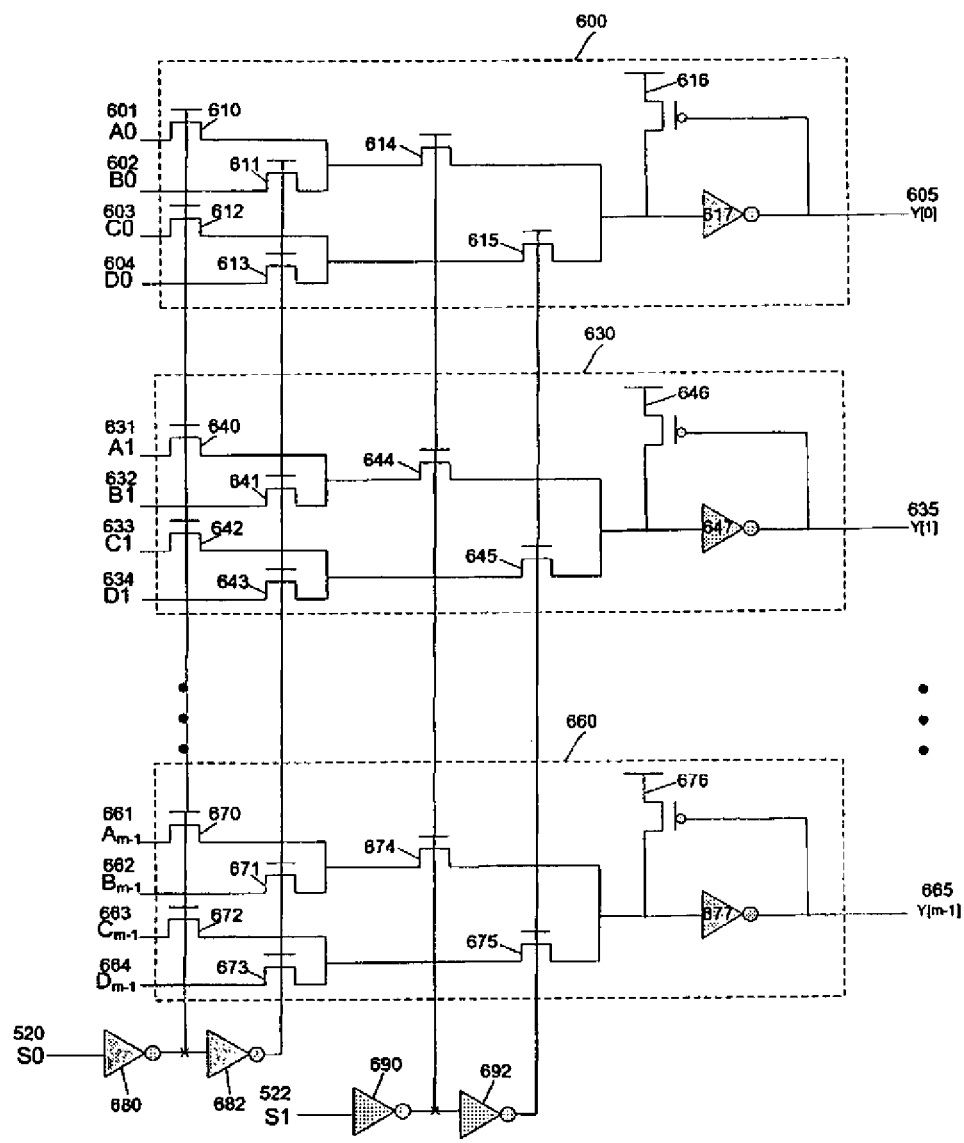
Figure 10:
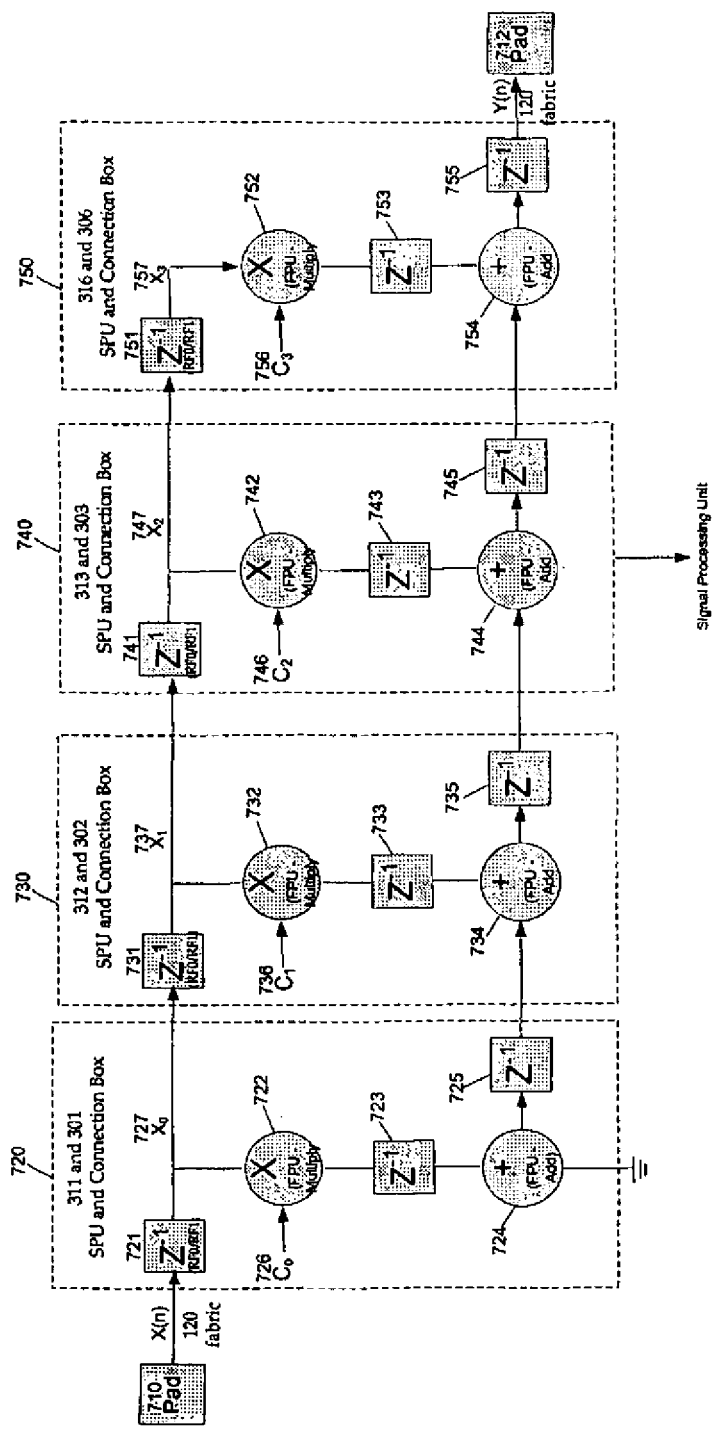
Figure 11:
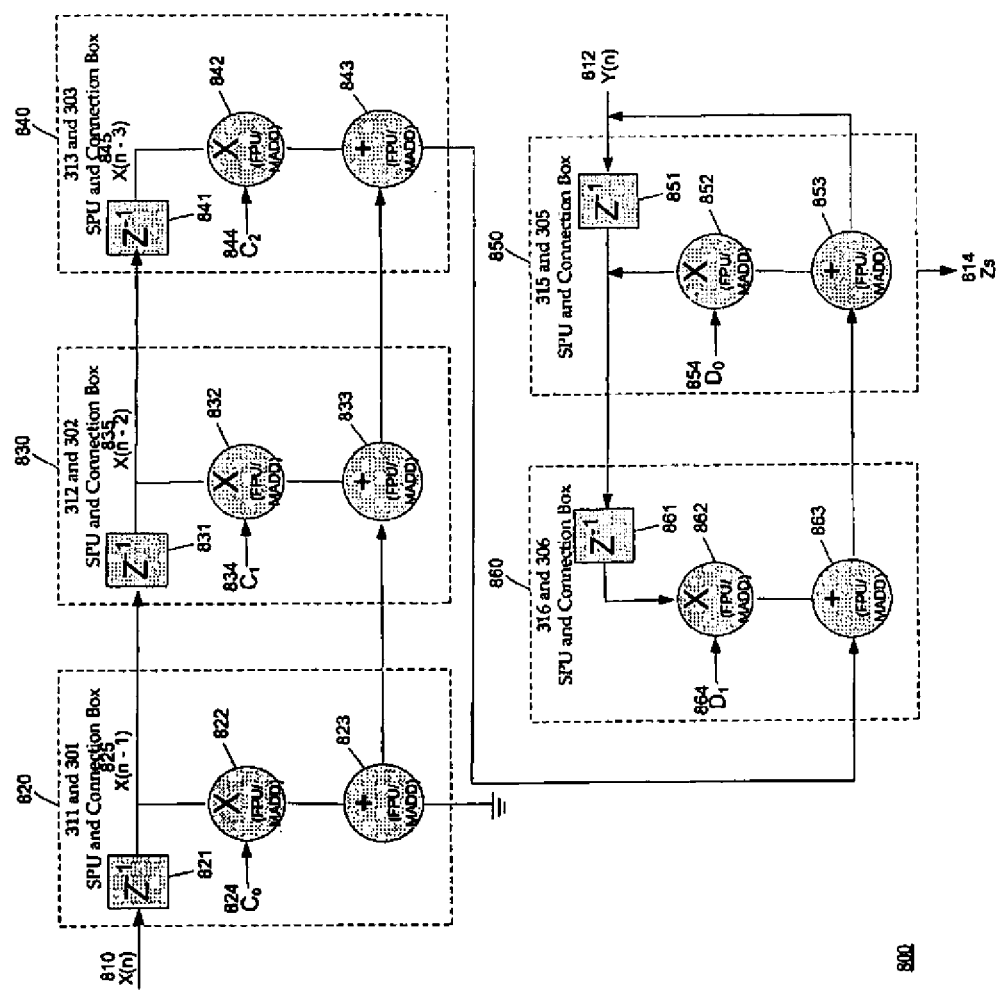
Figure 12:
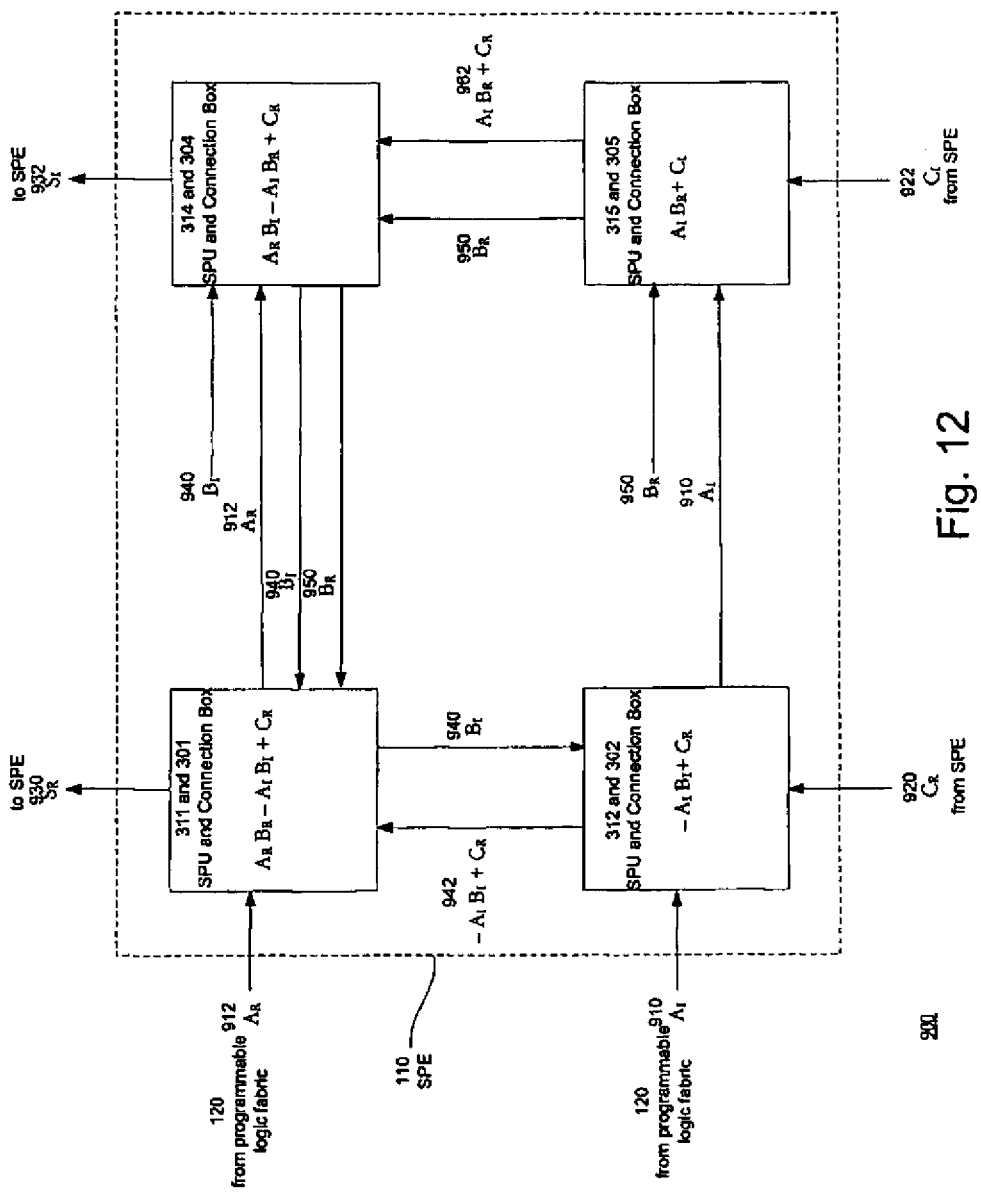
Figure 13B:
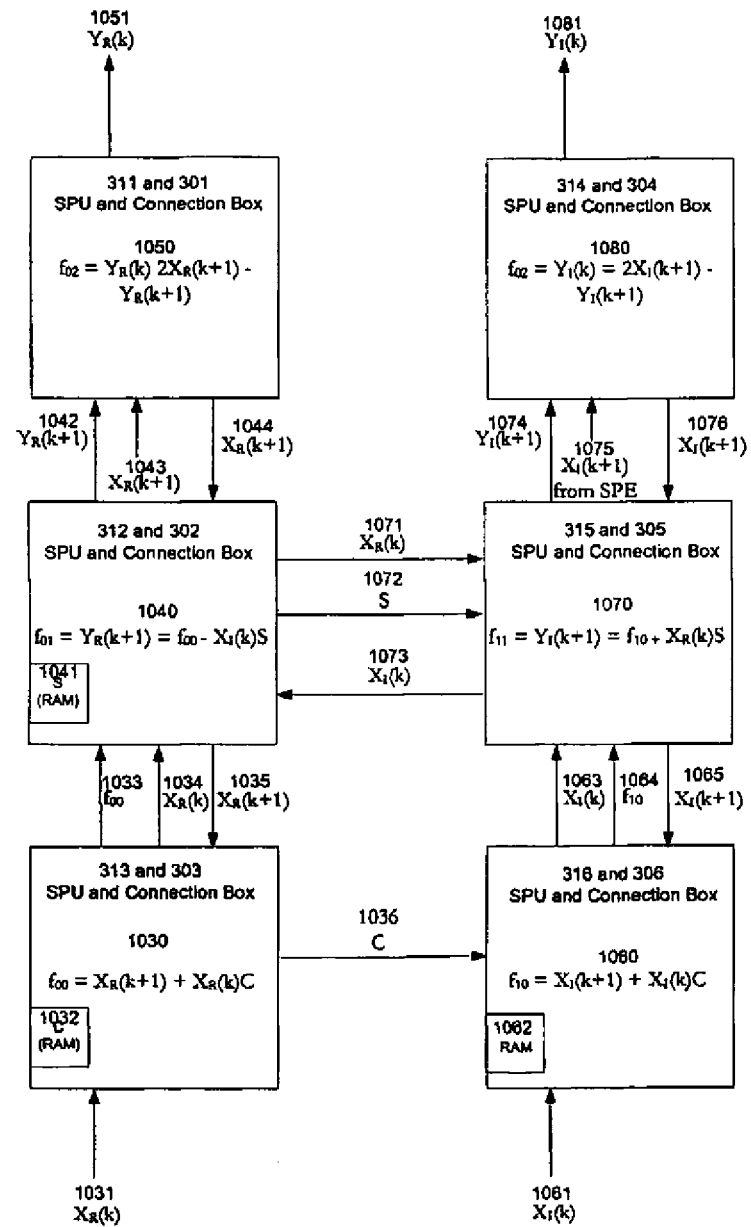
Figure 14:
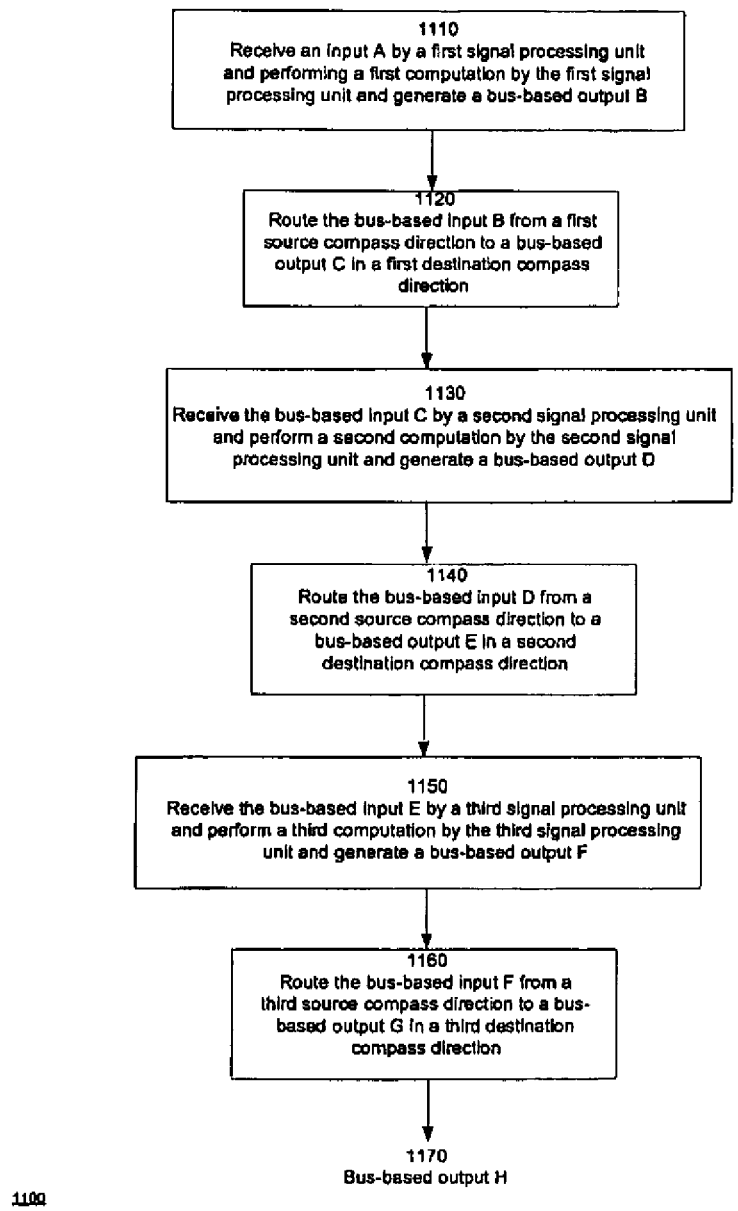
Figure 15:
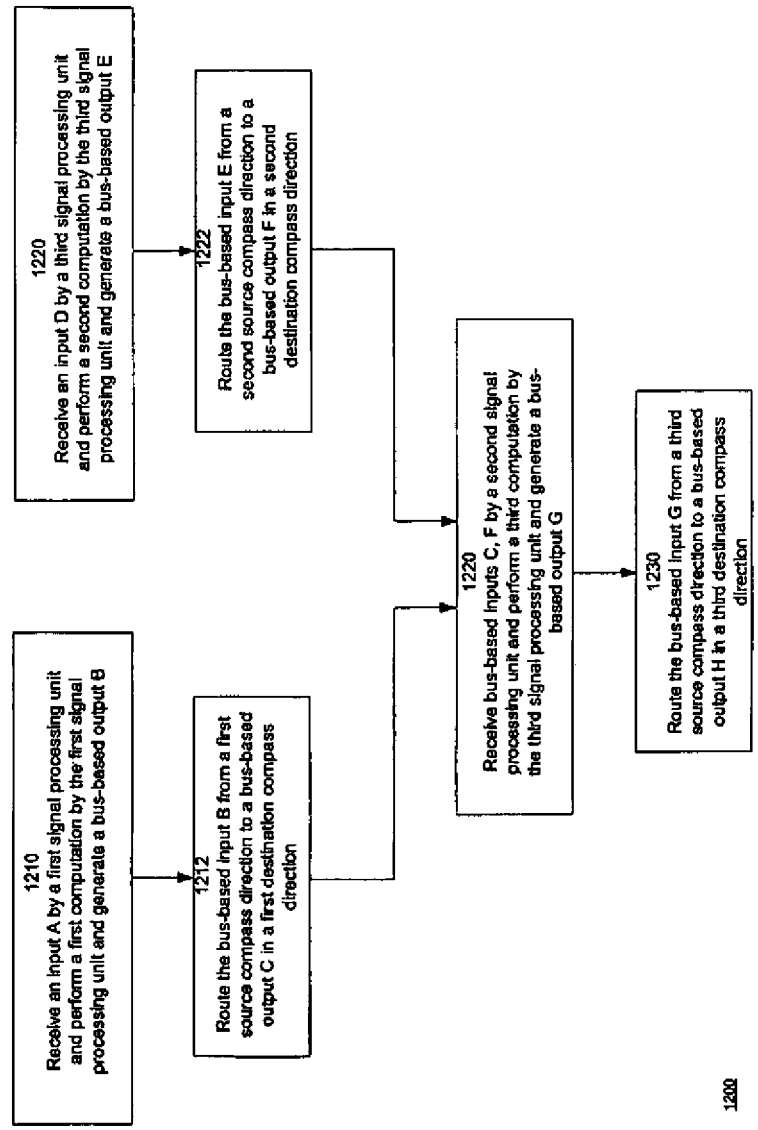

FIG. 15 is a flow diagram illustrating the process 1200 executed in a configurable integrated circuit employing signal processing engines for parallel computations. Steps 1210, 1212 occur in parallel with steps 1220, 1222. At step 1210, the first signal processing unit 311 receives an input A and performs a first computation to generate a bus-based output B. The first bus-based dedicated connection box 302 routes 1212 the bus-based input B from a first source compass direction to a bus-based output C in a first destination compass direction. At step 1230, the third signal processing unit 313 receives an input D and performs a second computation to generate a bus-based output E. The third bus-based dedicated connection box 313 routes 1222 the bus-based input E from a second source compass direction to a bus-based output F in a second destination compass direction. At step 1220, the second signal processing unit 312 receives two bus-based inputs C, F from the first and third signal process units 311, 313 and performs a third computation to generate bus-based output G. The second bus-based dedicated connection box 312 routes 1230 the bus-based input G from a third source compass direction to a bus-based output H in a third destination compass direction.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A field programmable gate array (FPGA) integrated circuit, comprising:
a logic and routing block having a plurality of dedicated logic cells, each dedicated logic cell having a first logic and routing cell and a second logic and routing cell;
a plurality of configurable dedicated connection circuits, the plurality of configurable dedicated connection circuits being interconnected with one another through bus-based connections to form a bus architecture, each configurable dedicated connection circuit having a plurality of bus-based inputs, a plurality of bus-based outputs, and a multiplexer, the multiplexer having configuration bits for routing a first bus-based input in the plurality of bus-based inputs via a first bus to a first bus-based output in the plurality of bus-based outputs, each configurable dedicated connection circuit being directly connected to only one signal processing unit;
one or more first dedicated lines connecting from the first logic and routing cell in a dedicated logic cell of the logic and routing block to the first bus-based input in a first configurable dedicated connection circuit; and
one or more second dedicated lines connecting from the first bus-based output in the first configurable dedicated connection circuit to the first logic and routing cell in the dedicated logic cell of the logic and routing block.

2. The integrated circuit as recited in claim 1, further comprising a second configurable dedicated connection circuit, coupled to the first configurable dedicated connection circuit, having a plurality of bus-based inputs, a plurality of bus-based outputs, and a multiplexer, the multiplexer having configuration bits for routing a first bus-based input in the plurality of dedicated bus-based inputs via a bus to a first bus-based output in the plurality of bus-based outputs.

3. The integrated circuit as recited in claim 2, further comprising a second signal processing unit, coupled to the second configurable dedicated connection circuit, for serving as a second functional computing circuit.

4. The integrated circuit as recited in claim 1, further comprising a first signal processing unit, coupled to the first configurable dedicated connection circuit, for serving as a first functional computing circuit.

5. The integrated circuit as recited in claim 1, wherein the first bus-based input in the plurality of bus-based inputs is coupled to the first bus-based output in the plurality of bus-based outputs via the first bus in a first compass direction.

6. The integrated circuit as recited in claim 5, wherein the first bus-based input in the plurality of bus-based inputs is coupled to a second bus-based output in the plurality of bus-based outputs via a second bus in a second compass direction.

7. The integrated circuit as recited in claim 5, wherein the first compass direction comprises a north compass direction, a south compass direction, an east compass direction, or a west compass direction.

8. The integrated circuit as recited in claim 6, wherein the second compass direction comprises a north compass direction, a south compass direction, an east compass direction, or a west compass direction.

9. The integrated circuit as recited in claim 6, wherein the first compass direction and the second compass direction are the same.

10. The integrated circuit as recited in claim 6, wherein the first compass direction and the second compass direction are different.

11. The integrated circuit as recited in claim 6, wherein the plurality of bus-based inputs having a bus-based input with a first bus width, the plurality of bus-based outputs having a bus-based output with a second bus width, the first bus width in the bus-based input being the same size width as the second bus width in the bus-based output.

12. The integrated circuit as recited in claim 6, wherein the first bus-based input having a first bus width and the first bus-based output having a second bus width, the first bus width in the first bus-based input being a different size width as the second bus width in the first bus-based output.

13. The integrated circuit as recited in claim 6, wherein the first bus-based input in the plurality of bus-based inputs having a bus width of 24-bit, 32-bit, 48-bit, or 64-bit.

14. The integrated circuit as recited in claim 6, wherein the first bus-based output in the plurality of bus-based outputs having a bus width of 24-bit, 32-bit, 48-bit, or 64-bit.

15. The integrated circuit of claim 6, wherein the plurality of input buses comprise a second bus-based input, the multiplexer routing both the first bus-based input via first bus and the second bus-based input buses via a second bus from the first compass direction to the first bus-based output in the second compass direction, each of the first and second bus-based inputs buses having a narrow bus width, the first bus-based output having a wide bus width.

16. The integrated circuit as recited in claim 15, wherein the narrow bus width in the first and second bus-based inputs is 24-bit wide, and the wide bus in the first bus-based output is 48-bit wide.

* * * * *

UNITED STATES PATENT AND TRADEMARK OFFICE
CERTIFICATE OF CORRECTION

| | | |
|---|---|---|
| PATENT NO. | : 7,970,979 B1 | |
| APPLICATION NO. | : 11/857661 | |
| DATED | : June 28, 2011 | |
| INVENTOR(S) | : Verma et al. | |

It is certified that error appears in the above-identified patent and that said Letters Patent is hereby corrected as shown below:

Please delete Patent 7,970,979 in its entirety and insert patent 7,970,979 B1 in its entirety as attached.

Signed and Sealed this
Seventh Day of August, 2012

David J. Kappos
*Director of the United States Patent and Trademark Office*

(12) United States Patent
Verma et al.

(10) Patent No.: US 7,970,979 B1
(45) Date of Patent: Jun. 28, 2011

(54) SYSTEM AND METHOD OF CONFIGURABLE BUS-BASED DEDICATED CONNECTION CIRCUITS

(75) Inventors: Hare Krishna Verma, Cupertino, CA (US); Manoj Gunwani, San Jose, CA (US); Ravi Sunkavalli, Milpitas, CA (US)

(73) Assignee: Agate Logic, Inc., Cupertino, CA (US)

( * ) Notice: Subject to any disclaimer, the term of this patent is extended or adjusted under 35 U.S.C. 154(b) by 223 days.

(21) Appl. No.: 11/857,661

(22) Filed: Sep. 19, 2007

(51) Int. Cl.
G06F 13/00 (2006.01)
G06F 13/12 (2006.01)
G06F 13/38 (2006.01)
G06F 13/40 (2006.01)
G06F 7/38 (2006.01)
H03K 19/173 (2006.01)
H03K 19/177 (2006.01)

(52) U.S. Cl. ......... 710/316; 710/66; 710/307; 326/37; 326/38; 326/39

(58) Field of Classification Search ............ 710/66, 710/307, 316, 317; 326/37-39
See application file for complete search history.

(56) References Cited

U.S. PATENT DOCUMENTS

| | | | | |
|---|---|---|---|---|
| 4,440,058 A | * | 4/1984 | Bass et al. | 84/607 |
| 4,598,400 A | * | 7/1986 | Hillis | 370/400 |
| 5,016,163 A | * | 5/1991 | Jesshope et al. | 710/316 |
| 5,274,763 A | * | 12/1993 | Banks | 710/316 |
| 5,287,345 A | * | 2/1994 | Osmon et al. | 700/2 |
| 5,485,627 A | * | 1/1996 | Hillis | 712/13 |
| 5,530,813 A | * | 6/1996 | Paulsen et al. | 710/317 |
| 5,729,756 A | * | 3/1998 | Hayashi | 712/15 |
| 5,787,007 A | * | 7/1998 | Bauer | 716/117 |
| 5,828,858 A | * | 10/1998 | Athanas et al. | 710/317 |
| 5,847,578 A | * | 12/1998 | Noakes et al. | 326/39 |
| 5,940,085 A | * | 8/1999 | Chandavarker et al. | 345/471 |
| 5,991,817 A | * | 11/1999 | Rowett et al. | 709/250 |

(Continued)

FOREIGN PATENT DOCUMENTS

EP 1063529 A1 * 12/2000

(Continued)

OTHER PUBLICATIONS

"NN9007117: Diagnostic Scan Design and Operational Self-Healing with Programmable Logic Cell Arrays", Jul. 1, 1990, IBM, IBM Technical Disclosure Bulletin, vol. 33, Iss. 2, pp. 117-120.*

(Continued)

*Primary Examiner* — Faisal M Zaman
(74) *Attorney, Agent, or Firm* — Radlo & Su LLP

(57) ABSTRACT

A high performance field programmable gate array is described with one or more signal processing engines coupled to a programmable logic fabric. Each signal processing engine includes a signal processing unit for performing specifying tasks and a bus-based configurable connection box for routing a bus-based input to a bus-based output. The signal processing unit has a floating point unit (FPU)/multiply accumulate (MAC) for computation and register files for storing information. The programmable logic fabric is coupled to the one or more signal processing engines for routing of information between the signal processing engines.

16 Claims, 16 Drawing Sheets

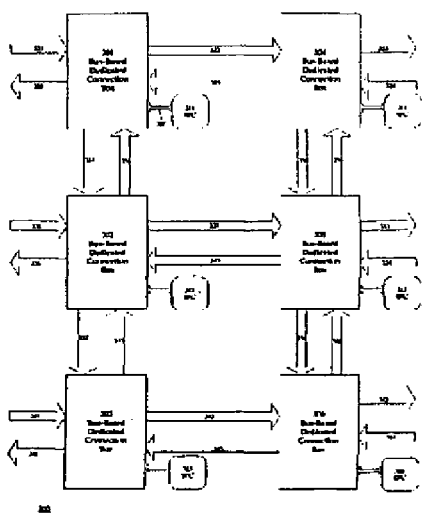

U.S. PATENT DOCUMENTS

| | | | | |
|---|---|---|---|---|
| 6,020,760 | A | * | 2/2000 | Sample et al. ............ 326/41 |
| 6,026,227 | A | * | 2/2000 | Furtek et al. ............ 326/40 |
| 6,046,603 | A | * | 4/2000 | New ............ 326/38 |
| 6,081,129 | A | * | 6/2000 | Apland et al. ............ 326/41 |
| 6,085,275 | A | * | 7/2000 | Gallup et al. ............ 710/316 |
| 6,094,066 | A | * | 7/2000 | Mavis ............ 326/41 |
| 6,101,565 | A | * | 8/2000 | Nishtala et al. ............ 710/307 |
| 6,204,689 | B1 | * | 3/2001 | Percey et al. ............ 326/41 |
| 6,289,494 | B1 | * | 9/2001 | Sample et al. ............ 716/104 |
| 6,462,578 | B2 | * | 10/2002 | Ting ............ 326/41 |
| 6,662,313 | B1 | * | 12/2003 | Swanson et al. ............ 714/39 |
| 6,691,198 | B1 | * | 2/2004 | Hamlin ............ 710/305 |
| 6,693,456 | B2 | * | 2/2004 | Wong ............ 326/41 |
| 6,781,407 | B2 | * | 8/2004 | Schultz ............ 326/41 |
| 7,028,281 | B1 | * | 4/2006 | Agrawal et al. ............ 326/41 |
| 7,032,038 | B1 | * | 4/2006 | Squires ............ 710/8 |
| 7,155,557 | B2 | * | 12/2006 | Meier ............ 710/316 |
| 7,176,717 | B2 | * | 2/2007 | Sunkavalli et al. ............ 326/41 |
| 7,185,174 | B2 | * | 2/2007 | Stewart et al. ............ 712/11 |
| 7,193,437 | B2 | * | 3/2007 | Cappelli et al. ............ 326/41 |
| 7,355,443 | B2 | * | 4/2008 | Leijten-Nowak et al. ...... 326/41 |
| 7,358,765 | B2 | | 4/2008 | Verma et al. |
| 7,368,941 | B2 | | 5/2008 | Verma et al. |
| 7,408,383 | B1 | * | 8/2008 | Feng et al. ............ 326/41 |
| 7,414,431 | B2 | | 8/2008 | Verma et al. |
| 7,414,432 | B2 | | 8/2008 | Verma et al. |
| 7,417,456 | B2 | | 8/2008 | Verma et al. |
| 7,430,697 | B1 | * | 9/2008 | Pabari ............ 714/724 |
| 7,439,768 | B2 | | 10/2008 | Verma et al. |
| 7,486,111 | B2 | * | 2/2009 | Madurawe ............ 326/38 |
| 7,605,605 | B2 | | 10/2009 | Verma et al. |
| 7,728,623 | B2 | | 6/2010 | Verma et al. |
| 2006/0158219 | A1 | * | 7/2006 | Sunkavalli et al. ............ 326/41 |
| 2007/0008763 | A1 | * | 1/2007 | Choi ............ 365/63 |
| 2007/0085565 | A1 | | 4/2007 | Verma et al. |

FOREIGN PATENT DOCUMENTS

| | | | |
|---|---|---|---|
| EP | 1271783 A2 | * | 1/2003 |
| JP | 07319925 A | * | 12/1995 |
| JP | 09064188 A | * | 3/1997 |
| JP | 10070193 A | * | 3/1998 |
| JP | 2003324344 A | * | 11/2003 |
| WO | WO 2006076276 A2 | * | 7/2006 |

OTHER PUBLICATIONS

Anderson, J.H.; Najm, F.N.; , "Low-Power Programmable FPGA Routing Circuitry," Very Large Scale Integration (VLSI) Systems, IEEE Transactions on , vol. 17, No. 8, pp. 1048-1060, Aug. 2009.*

Wu, Y.-L.; Marek-Sadowska, M.; , "Graph based analysis of FPGA routing," Design Automation Conference, 1993, with EURO-VHDL '93. Proceedings EURO-DAC '93. European , pp. 104-109, Sep. 20-24, 1993.*

Alexander, M.J.; Robins, G.; , "New performance-driven FPGA routing algorithms," Computer-Aided Design of Integrated Circuits and Systems, IEEE Transactions on , vol. 15, No. 12, pp. 1505-1517, Dec. 1996.*

U.S. Appl. No. 11/344,694, Unpublished, (filed Feb. 1, 2006) (Hare K. Verma et al., applicant).

* cited by examiner

| | ILRC | OLRC | ILRC | OLRC | ILRC | OLRC | ILRC | OLRC | |
|---|---|---|---|---|---|---|---|---|---|
| | 266 DLC | | 276 DLC | | 286 DLC | | 296 DLC | | |
| | 266-1 LRC | | 276-1 LRC | | 286-1 LRC | | 296-1 LRC | | 256 LRB |
| 253 LRB | 266-2 LRC | | 276-2 LRC | | 286-2 LRC | | 296-2 LRC | | |
| | 265 DLC 265-1 LRC | | 275 DLC 275-1 LRC | | 285 DLC 285-1 LRC | | 295 DLC 295-1 LRC | | |
| | 265-2 LRC | | 275-2 LRC | | 285-2 LRC | | 295-2 LRC | | |
| | 264 DLC | | 274 DLC | | 284 DLC | | 294 DLC | | |
| | 264-1 LRC | | 274-1 LRC | | 284-1 LRC | | 294-1 LRC | | 255 LRB |
| 252 LRB | 264-2 LRC | | 274-2 LRC | | 284-2 LRC | | 294-2 LRC | | |
| | 263 DLC 263-1 LRC | | 273 DLC 273-1 LRC | | 283 DLC 283-1 LRC | | 293 DLC 293-1 LRC | | |
| | 263-2 LRC | | 273-2 LRC | | 283-2 LRC | | 293-2 LRC | | |
| | 262 DLC | | 272 DLC | | 282 DLC | | 292 DLC | | |
| | 262-1 LRC | | 272-1 LRC | | 282-1 LRC | | 292-1 LRC | | 254 LRB |
| 251 LRB | 262-2 LRC | | 272-2 LRC | | 282-2LRC | | 292-2 LRC | | |
| | 261 DLC 261-1 LRC | | 271 DLC 271-1 LRC | | 281 DLC 281-1 LRC | | 291 DLC 291-1 LRC | | |
| | 261-2 LRC | | 271-2 LRC | | 281-1 LRC | | 291-1 LRC | | |
| | 260 level 0 (first column) | | 270 level 1 (second column) | | 280 level 2 (third column) | | 290 level 3 (fourth column) | | | levels of DLC

250

FIG. 3

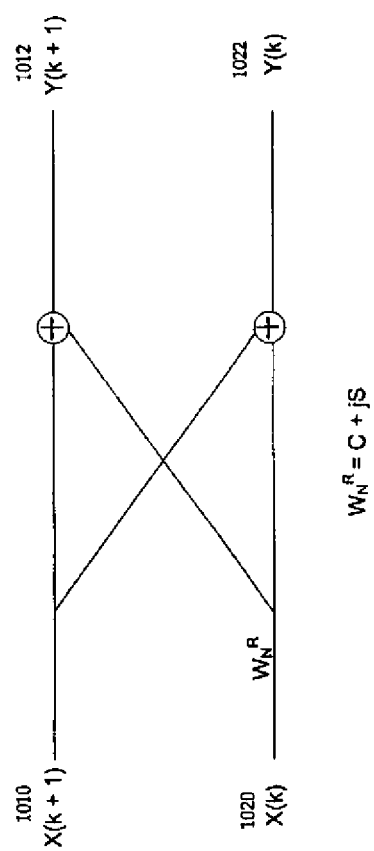

SYSTEM AND METHOD OF CONFIGURABLE BUS-BASED DEDICATED CONNECTION CIRCUITS

CROSS REFERENCE TO RELATED APPLICATIONS

This application relates to a concurrently filed and co-pending U.S. patent application Ser. No. 11/857,858, filed on 19 Sep. 2007, entitled "System and Method of Signal Processing Engines with Programmable Logic Fabric" by Hare K. Verma et al., owned by the assignee of this application and incorporated herein by reference.

COPYRIGHT NOTICE

A portion of the disclosure of this patent document contains material that is subject to copyright protection. The copyright owner has no objection to the reproduction of the patent document or the patent disclosure in exactly the form it appears in the Patent and Trademark Office patent file or records, but otherwise reserves all copyright rights whatsoever.

BACKGROUND INFORMATION

1. Field of the Invention

The present invention relates generally to programmable integrated circuits (ICs), and more particularly to signal processing in field programmable gate arrays (FPGAs).

2. Description of Related Art

Field programmable gate arrays are often selected by design engineers to provide a flexible approach in programming and re-programming integrated circuits in order to accommodate a system specification, correct errors in the system, or make improvements to the system by reprogramming the FPGA. One conventional field programmable gate array architecture is implemented using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switchbox. The look-up table outputs are directly fed to other look-up tables as well as the elements within the look-up tables, but the connections to other look-up tables' inputs are made through the switchbox.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box.

Efforts have been mounted to improve the overall performance of field programmable gate arrays. It is desirable to have a method that improves the performance of programmable integrated circuits for use with innovative hardware solutions.

SUMMARY OF THE INVENTION

A high performance field programmable gate array is described with one or more signal processing engines coupled to a programmable logic fabric. Each signal processing engine includes a signal processing unit for performing specifying tasks and a bus-based configurable connection box for routing a bus-based input to a bus-based output. The programmable logic fabric is coupled to the one or more signal processing engines for routing of information between the signal processing engines. The signal processing engines can operate collectively in a serial chain of a complex function like a finite impulse response. The signal processing engines can also operate as a combination of serial and parallel processing of a complex function such as infinite impulse response.

Embodiments of a signal processing unit comprise one or more floating point units (FPUs)/multiply accumulate (MAC), one or more register files, and one or more dual port memories. Each floating point unit and multiply accumulate performs a computational operation. Each register file stores information in the signal processing unit. Each dual port memory has an independent read or write port so that each port can be independently configured with a desirable width.

The bus-based configurable connection box receives a bus-based input from any direction and routes the bus-based input to any output direction. The routing of a bus-based input to a bus-based output is conducted through a multiplexer in the bus-based configurable connection box. For example, if the bus-based configurable connection box is articulated as having four compass directions, a North compass direction, a South compass direction, a West compass direction and an East compass direction. Each compass direction in the North, South, West and East compass directions have bus-based inputs and bus-based outputs. In the North compass direction, there are a plurality of bus-based inputs from the North direction and a plurality of bus-based outputs to the North direction. In the South compass direction, there are a plurality of bus-based inputs from the South direction and a plurality of bus-based outputs to the South direction. In the West compass direction, there are a plurality of bus-based inputs from the West direction and a plurality of bus-based outputs to the West direction. In the East compass direction, there are a plurality of bus-based inputs from the East direction and a plurality of bus-based outputs to the East direction.

The bus-based configurable connection box also has additional bus-based inputs and bus-based outputs coupled to the programmable logic fabric. In one embodiment, the programmable logic fabric couples to bus-based inputs in the West compass direction, and couples to bus-based outputs in the West compass direction. The programmable logic fabric further couples to bus-based inputs in the East compass direction, and couples to bus-based outputs in the East compass direction. Optionally, the programmable logic fabric also couples to bus-based inputs in the North compass direction and couples to bus-based outputs in the North compass direction, as well as couples to bus-based inputs in the South compass direction, and couples to bus-based outputs in the South compass direction.

Widths of the bus-based inputs and bus-based outputs can vary depending on a selected design. The bus-based inputs and bus-based outputs can also have buses of the same size or different sizes. In one embodiment, the bus-based inputs and bus-based outputs are implemented with a combination of a wide bus, e.g. 48-bit bus, and a narrow bus, 24-bit bus. Two 24-bit input buses can be combined to generate a single 48-bit output to a 48-bit output bus. In another embodiment, each of the bus-based inputs and bus-based outputs in the bus-based configurable connection box is 48 bits wide. In such a scenario, each 48-bit input bus can receive a single wide bus, e.g. 48 bits, or two narrow buses, e.g. two 24-bit buses.

The multiplexer in the bus-based configurable connection box receives a plurality of bus-based inputs from any compass direction, and routes a selected bus-based input to a bus-based output of any compass direction. Selection bits in the multiplexer provide control signals as to which one of the bus-base inputs is selected for routing to the bus-based output. The multiplexer comprises $2^N$ number of bus-based inputs, N number of selection bits, and an output. The flexibility of the bus-based configurable connection box to route from bus-based inputs to bus-based outputs determines the $2^N$ number of bus-based inputs and N number of selection bits.

Broadly stated, a field programmable gate array (FPGA) integrated circuit comprising a logic and routing block having a plurality of dedicated logic cells, each dedicated logic cell having a first logic and routing cell and a second logic and routing cell; a plurality of configurable dedicated connection circuits, the plurality of configurable dedicated connection circuits being interconnected with one another through bus-based connections to form a bus architecture, each configurable dedicated connection circuit having a plurality of bus-based inputs, a plurality of bus-based outputs, and a multiplexer, the multiplexer having configuration bits for routing a first bus-based input in the plurality of bus-based inputs via a first bus to a first bus-based output in the plurality of bus-based outputs; one or more first dedicated lines connecting from the first logic and routing cell in a dedicated logic cell of the logic and routing block to the first bus-based input in a first configurable dedicated connection circuit; and one or more second dedicated lines connecting from the first bus-based output in the first configurable dedicated connection circuit to the first logic and routing cell in the dedicated logic cell of the logic and routing block.

The structures and methods of the present invention are disclosed in the detailed description below. This summary does not purport to define the invention. The invention is defined by the claims. These and other embodiments, features, aspects, and advantages of the invention will become better understood with reference to the following description, appended claims and accompanying drawings.

BRIEF DESCRIPTION OF THE DRAWINGS

The invention will be described with respect to specific embodiments thereof, and reference will be made to the drawings, in which:

FIG. 1 is a simplified architectural diagram illustrating a programmable integrated circuit chip that includes multiple signal processing engines and multiple program logic fabrics in accordance with the present invention.

FIG. 2 is an architectural diagram illustrating a programmable system that comprises a configurable floating point unit operating with programmable logic and routing blocks and memories in accordance with the present invention.

FIG. 3 is a block diagram illustrating a programmable logic chip constructed with multiple levels of dedicated logic cells in accordance with the present invention.

FIG. 4 is a block diagram illustrating a logic and routing block comprising a first dedicated logic cell, a second dedicated logic cell, a third dedicated logic cell, a fourth dedicated logic cell and a switch box for providing programmable switch matrices in accordance with the present invention.

FIG. 5 is an architectural diagram illustrating a signal processing engine (SPE) including a signal processing unit (SPU) coupled to a bus-based dedicated connection box in accordance with the present invention.

FIG. 6 is a block diagram illustrating a two-dimensional view of a bus architecture including multiple bus-based dedicated connection boxes and signal process units in accordance with the present invention.

FIG. 7 is a block diagram illustrating a two-dimensional view of the bus-based dedicated connection box for routing one or more bus-based inputs to one or more bus-based outputs in accordance with the present invention.

FIG. 8 is a circuit diagram illustrating a multiplexer for routing bus-based connections with selectable configurable bits in accordance with the present invention.

FIG. 9 is a block diagram illustrating an exploded view of bus-routing of a signal processing unit through the bus-based connection box in accordance with the present invention.

FIG. 10 is a block diagram illustrating a first exemplary application of the signal processing engine for processing a finite impulse response in accordance with the present invention.

FIG. 11 is a block diagram illustrating a second exemplary application of the signal processing engine for processing an infinite impulse response in accordance with the present invention.

FIG. 12 is a block diagram illustrating a third exemplary application of the signal processing engine for processing a complex multiply-add function in accordance with the present invention.

FIGS. 13A-13B are block diagrams illustrating a fourth exemplary application of the signal processing engine for processing a radix-2 butterfly in accordance with the present invention.

FIG. 14 is a flow diagram illustrating the process executed in a configurable integrated circuit employing signal processing engines for serial computations in accordance with the present invention.

FIG. 15 is a flow diagram illustrating the process executed in a configurable integrated circuit employing signal processing engines for parallel computations in accordance with the present invention.

DETAILED DESCRIPTION

A description of structural embodiments and methods of the present invention is provided with reference to FIGS. 1-12. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a general architectural diagram illustrating a programmable integrated circuit chip 100 that includes multiple signal processing engines (SPEs) 110, 112, 114, 116 coupled to programmable logic fabric 120 through buses 130-133, 140-143, 150-153, 160-163, where each bus is m-bit wide. Alternatively, some of the buses may be divided to have multiple buses, such as a bus that is m-bit wide can be replaced by two buses that is n-bit wide, where m=2n. Each of the signal processing engines 110, 112, 114, 116 performs one or more computational tasks. Each of the signal processing engines 110, 112, 114, 116 can be applied to a wide variety of computational intensive tasks including Finite Impulse Response (FIR), Infinite Impulse Response (IIR), Fast Fourier Transform (FFT), complex multiply-add function, serial computations and others.

The programmable logic fabric 120 includes control signals for data flow and control signals for the signal processing engines 110, 112, 114, 116. The term "programmable logic fabric" refers to dedicated logic cells, programmable logic and routing blocks, dedicated logic cells, dedicated lines, local connections, or other forms of logic connections.

As shown in FIG. 2, there is an architectural diagram illustrating a programmable system 170 that comprises a configurable floating point unit 210 operating with programmable logic and routing blocks and memories. The floating point unit 210 is coupled to two columns of logic and routing blocks 172 and 174 on the left side, and is coupled to two columns of logic and routing blocks 176 and 178 on the right side. The floating point unit 210 is further coupled to a memory 180 on top and a memory 182 on the bottom. In this embodiment, each column of the logic and routing blocks 172, 174, 176 and 178 has twelve logic and routing blocks, which is further described below with respect to FIG. 3. Each logic and routing block comprises four dedicated logic and routing blocks, as described below with respect to FIG. 4.

A DLC in a logic and routing block provides a connection between a floating point unit and a logic and routing block, or provides a connection between a memory and a logic and routing block. For Example, a DLC 188 in the column of the logic and routing block 176 is coupled to the floating point unit 210 for communication between the dedicated logic cell 188 and the floating point unit 210. Similarly, a DLC 190 in the column of the logic and routing block 178 is coupled to the floating point unit 210 for communication between the dedicated logic cell 190 and the floating point unit 210. A DLC 184 in the column of logic and routing block 220 is connected to the memory 180 for communication between the dedicated logic cell 184 and the memory 180. A DLC 186 in the column of the logic and routing block 174 is connected to the memory 182 for communication between the dedicated logic cell 186 and the memory 182. Each memory in the memories 180 and 182 can have two ports, port A and port B, for use with two different types of addresses. In the programmable system 170, the memory 180 has one or more direct connections 192 to the floating point unit 210. The memory 182 also has one or more direct connections 194 to the floating point unit 182. Although the above connections are shown individually to flow unidirectionally, these connections can also flow bidirectionally.

In the embodiment shown above with respect to FIG. 2, two columns of the logic and routing blocks, either to the right side of the floating point unit 210 or the left side of the floating point unit 210, may be sufficient to provide the number of connectivity for FPU pins. One of ordinary skill in the art should recognize that additional logic and routing blocks can be provided to add additional connectivity to the pins of the floating point unit 210. Addresses and data buses are preferably arranged so that local connectivity can be made for fraction and exponent bits separately.

In FIG. 3, there is shown a logic diagram illustrating a programmable logic chip 250 constructed with multiple levels (or columns) of DLCs 260, 270, 280, and 290. One column of dedicated logic cells comprises a plurality of dedicated logic cells and connection lines to implement a logic function, such as an adder, a subtractor, an add-subtractor with add-sub control, an accumulator, registers, and multiplexers. The programmable logic chip 250 comprises a first logic and routing block 251, a second logic and routing block 252, a third logic and routing block 253, a fourth logic and routing block 254, a fifth logic and routing block 255, and a sixth logic and routing block 256. Each of the logic and routing blocks comprises four dedicated logic cells arranged in a square format. The first logic and routing block 251 comprises a first dedicated logic cell 261, a second dedicated logic cell 262, a third dedicated logic cell 271, and a fourth dedicated logic cell 272. Each dedicated logic cell comprises two logic and routing cells. The first dedicated logic cell 261 has a first logic and routing cell 261-1 and a second logic and routing cell 261-2, the second dedicated logic cell 262 has a first logic and routing cell 262-1 and a second logic and routing cell 262-2, the third dedicated logic cell 271 has a first logic and routing cell 271-1 and a second logic and routing cell 271-2, and the fourth dedicated logic cell 272 has a first logic and routing cell 272-1 and a second logic and routing cell 272-2.

The second logic and routing block 252 comprises a first dedicated logic cell 263, a second dedicated logic cell 264, a third dedicated logic cell 273, and a fourth dedicated logic cell 274. The first dedicated logic cell 263 has a first logic and routing cell 263-1 and a second logic and routing cell 263-2, the second dedicated logic cell 264 has a first logic and routing cell 264-1 and a second logic and routing cell 264-2, the third dedicated logic cell 273 has a first logic and routing cell 273-1 and a second logic and routing cell 273-2, and the fourth dedicated logic cell 274 has a first logic and routing cell 274-1 and a second logic and routing cell 274-2.

The third logic and routing block 253 comprises a first dedicated logic cell 265, a second dedicated logic cell 266, a third dedicated logic cell 275, and a fourth dedicated logic cell 276. The first dedicated logic cell 265 has a first logic and routing cell 265-1 and a second logic and routing cell 265-2, the second dedicated logic cell 266 has a first logic and routing cell 266-1 and a second logic and routing cell 266-2, the third dedicated logic cell 275 has a first logic and routing cell 275-1 and a second logic and routing cell 275-2, and the fourth dedicated logic cell 276 has a first logic and routing cell 276-1 and a second logic and routing cell 276-2.

The fourth logic and routing block 254 comprises a first dedicated logic cell 281, a second dedicated logic cell 282, a third dedicated logic cell 291, and a fourth dedicated logic cell 292. The first dedicated logic cell 281 has a first logic and routing cell 281-1 and a second logic and routing cell 281-2, the second dedicated logic cell 282 has a first logic and routing cell 282-1 and a second logic and routing cell 282-2, the third dedicated logic cell 291 has a first logic and routing cell 291-1 and a second logic and routing cell 291-2, and the fourth dedicated logic cell 292 has a first logic and routing cell 292-1 and a second logic and routing cell 292-2.

The fifth logic and routing block 255 comprises a first dedicated logic cell 281, a second dedicated logic cell 282, a third dedicated logic cell 293, and a fourth dedicated logic cell 294. The first dedicated logic cell 283 has a first logic and routing cell 283-1 and a second logic and routing cell 283-2, the second dedicated logic cell 284 has a first logic and routing cell 284-1 and a second logic and routing cell 284-2, the third dedicated logic cell 293 has a first logic and routing cell 293-1 and a second logic and routing cell 293-2, and the fourth dedicated logic cell 294 has a first logic and routing cell 294-1 and a second logic and routing cell 294-2.

The sixth logic and routing block 256 comprises a first dedicated logic cell 285, a second dedicated logic cell 286, a third dedicated logic cell 295, and a fourth dedicated logic cell 296. The first dedicated logic cell 285 has a first logic and routing cell 285-1 and a second logic and routing cell 285-2, the second dedicated logic cell 286 has a first logic and routing cell 286-1 and a second logic and routing cell 286-2, the third dedicated logic cell 295 has a first logic and routing cell 295-1 and a second logic and routing cell 295-2, and the fourth dedicated logic cell 296 has a first logic and routing cell 296-1 and a second logic and routing cell 296-2.

The first column (or level 0) of logic and routing block 260 comprises the first dedicated logic cell 261, the second dedicated logic cell 262, the third dedicated logic cell 263, the fourth dedicated logic cell 264, the fifth dedicated logic cell 265, and the sixth dedicated logic cell 266. The second column (or level 1) of logic and routing block 270 is positioned adjacent to the right side of the first column of logic and routing block 260. The second column of logic and routing block 270 comprises the first dedicated logic cell 271, the second dedicated logic cell 272, the third dedicated logic cell 273, the fourth dedicated logic cell 274, the fifth dedicated logic cell 275, and the sixth dedicated logic cell 276. The third column (or level 2) of logic and routing block 280 is positioned adjacent to the right side of the second column of logic and routing block 270. The third column of logic and routing block 280 comprises the first dedicated logic cell 281, the second dedicated logic cell 282, the third dedicated logic cell 283, the fourth dedicated logic cell 284, the fifth dedicated logic cell 285, and the sixth dedicated logic cell 286. The fourth column (or level 3) of logic and routing block 290 is positioned adjacent to the right side of the third column of logic and routing block 280. The fourth column of logic and routing block 290 comprises the first dedicated logic cell 291, the second dedicated logic cell 292, a third dedicated logic cell 293, the fourth dedicated logic cell 294, the fifth dedicated logic cell 295, and the sixth dedicated logic cell 296.

In FIG. 4, there is shown a block diagram illustrating a logic and routing block 350 comprising a first dedicated logic cell (DLC0) 360, a second dedicated logic cell (DLC1) 364, a third dedicated logic cell (DLC2) 366, a fourth dedicated logic cell (DLC3) 370 and a switch box 376 for providing programmable switch matrices. A set of dedicated lines is used to interconnect between adjacent dedicated logic cells, either for connects to adjacent dedicated logic cells within the logic and routing block, adjacent dedicated logic cells between the logic and routing block 350 and a previous logic and routing block, or connecting to adjacent dedicated logic cells between the logic routing block 350 and a next logic and routing block. A first set of eight dedicated lines 361 is connected from a previous dedicated logic cell 460 (not shown) to the first dedicated logic cell 360. A second set of eight dedicated lines 362 is connected from the first dedicated logic cell DLC0 360 to the second dedicated cell DLC1 364. A third set of dedicated lines 363 is connected from the second dedicated cell 364 to the next dedicated local cell 374 (not shown). A fourth set of eight dedicated lines 367 is connected from the previous dedicated logic cell 460 (not shown) to the third dedicated logic cell 366. A fifth set of eight dedicated lines 368 is connected from the third dedicated logic cell 366 to the fourth dedicated logic cell 370. A sixth set of eight dedicated lines 369 is connected from the fourth dedicated logic cell 370 to the next dedicated logic cell 374 (not shown). The switchbox 376 functions as a source for feeding control of data signals to any one of the dedicated lines 361, 362, 363, 367, 368, or 369. While the first set of eight dedicated lines 361 and the fourth set of eight dedicated lines 367 are connected from the previous logic and cell block 460, (not shown) the third set of eight dedicated lines 363 and the sixth set of eight dedicated lines 369 are connected to the next logic and cell block 374 (not shown). The switchbox 376 has various 4-bit connections to the DLC0 360 and DLC1 364 for generating signals to FPU to serve as inputs. In this illustrative diagram, a 4-bit line 471 in the DLC1 364 and a 4-bit line 472 in the DLC0 360 are connected to inputs to FPU 380. Outputs from the FPU 390 are connected to lines 363 in the DLC1 364 and lines 362 in the DLC0 360.

The one or more dedicated lines can be driven by the previous corresponding one or more dedicated lines as well as driving the next corresponding one or more dedicated lines, which would extend the distance of the dedicated lines. In effect, one set of dedicated lines can be connected ("stitched") to another set of dedicated lines, as may be called for by a particular programmable logic device, for concatenating different sets of dedicated lines together that extend across different logic and routing blocks.

For additional information on the circuit and operation of the programmable logic fabric, see U.S. patent application Ser. No. 11/344,694 entitled "Programmable Logic Systems and Methods Employing Configurable Floating Point Units", filed on 1 Feb. 2006, now U.S. Patent No. 7,814,136; U.S. patent application Ser. No. 11/036,109 entitled "Programmable Logic and Routing Blocks with Dedicated lines", filed on 14 Jan. 2005, now U.S. Pat. No. 7,176,717; U.S. patent application Ser. No. 11/044,386 entitled "Programmable Logic Cells with Local Connections", filed on 27 Jan. 2005, now U.S. Pat. Nos. 7,605,605, 7,728,623; U.S. patent application Ser. No. 11/066,336 entitled "Dedicated Logic Cells Employing Configurable Logic and Dedicated Logic Functions", filed on 23 Feb. 2005, now U.S. Pat. Nos. 7,358,765, 7,439,768, 7,414,431; and U.S. patent application Ser. No. 11/065,019 entitled "Dedicated Logic Cells Employing Sequential Logic and Control Logic Functions", filed on 23 Feb. 2005, now U.S. Pat. Nos. 7,368,941, 7,417,456, 7,414, 432; all owned by the assignee of this application and incorporated by reference as if fully set forth herein.

FIG. 5 is an architectural diagram illustrating the signal processing engine 110 comprising a signal processing unit (SPU) 311 coupled to a bus-based dedicated connection box 301. The signal processing unit 311 includes a floating point unit/multiplier/accumulator unit (FPU/MAC unit) 210, dual port random access memories (RAM) 220, 222, and multiple register files RF0 230, RF1 232, RF2 234 and RF3 236. The FPU/MAC unit 210 is coupled to the bus-based dedicated connection box 301 via a first bus 241 from the FPU/MAC unit 311 to the bus-based dedicated connection box 301 and a bus 242 from the bus-based dedicated connection box 301 to the FPU/MAC unit 210. Each of the first bus 241 and the second bus 242 is m-bit wide, for example, 48 bits, or 2n-bit wide, where n is equal to 24. The dual port memories 220, 222 are coupled to the bus-based dedicated connection box 301 via a bus 243 and a bus 244, respectively. The register files RF0 230 are coupled to the bus-based dedicated connection box 301 via a bus 245, the register files RF1 232 are coupled to the bus-based dedicated connection box 301 via a bus 246, the register files RF2 234 are coupled to the bus-based dedicated connection box 301 via a bus 247, and the register files RF3 236 are coupled to the bus-based dedicated connection box 301 via a bus 248. Each of the buses 243-248 is n-bit wide, for example, 24 bits.

Two general types of bus widths are utilized in transferring information between the signal processing unit 311 and the bus-based dedicated connection box 301. The communication between the FPU/MAC unit 210 and the bus-based dedicated connection box 310 has an m-bit wide bus, which is also referred to as a wide bus. The wide bus of the buses 241, 242 is a 42-bit bus in this embodiment. The communication between dual port memories 220, 222, the register files RF0 230, RF1 232, RF2 234, RF3 236 and the bus-based dedicated connection box 301 has a n-bit wide bus, which is also referred to as a narrow bus. The narrow bus of the buses 243-248 is a 24-bit bus in this embodiment.

The signal processing element 110 incorporates the FPU/MAC unit 210 for computation, dual port memories 220, 222 and the bus-based dedicated connection box 311 for performing digital signal processing operations of various widths. The FPU/MAC unit 210 operates as a computation unit in the signal processing unit 311. The register files RF0 230, RF1 232, RF2 234, RF3 236 function as storage units in the signal processing unit 311. Each of the dual port memories 220, 222 can be implemented as a random access memory or other type of suitable memory.

Embodiments of the FPU/MAC 210 can be configured to perform a wide variety of operations including an extended single precision floating point unit, a 36-bit integer multiply accumulate (MAC), two 18-bit integer MACs, or four 9×9 multiplies. Unsigned and signed multiplies for 32 and 16 bit operations can be performed using the programmable logic fabric 120 and one or more dedicated connection boxes. Each of the dual port memories (or RAM) 220, 222 includes, for example, a 24 kilobit dual port block memory. Each dual port memory 220 or 222 has an independent read or write port, where each port can be independently configured from x4 widths to x24 widths. Byte-wide read and write enable signals are provided for the memory data ports. A suitable 24 kilobit dual port memory mapping pinout is shown in Table 1.

TABLE 1

| | |
|---|---|
| IJ_CA[23:0] | RAM control signals |
| IJ_CA[23:0] | Data pins for port A |
| ZJ_A[23:0] | Data pins for port A |
| IJ_CLKA | Clock for port A |
| IJ_CB[23:0] | RAM control signals |
| IJ_B[23:0] | Data pins for port A |
| ZA_B[23:0] | Data pins for port B |
| IJ_CLKB | Clock for port B |
| IJ_ACLR | Asynchronous Clear |

The pins from the dual port memory 220 or 222 connect to, for example, two columns of logic and routing blocks in the programmable logic fabric 120. The pins are connected in such a way that the data and address pins are able to access internal local connections efficiently. Table 2 illustrates an example of the various modes of operations for dual port memory pinout and pin mappings.

TABLE 2

| RAM Pinout | 4K×4 | 4K×6 | 2K×8 | 2K×9 | 2K×12 | 1K×16 | 1K×18 | 1K×24 | FIFO |
|---|---|---|---|---|---|---|---|---|---|
| | | | | Port A Mapping | | | | | Port A - Write Port |
| U_CA[23:16] | CEB,WEB, NC,WEMB | CEA,WEA, NC,WEMA | CEA,WEA, NC,WEMA | CEA,WEA, NC,WEMA | CEA,WEA, NC,WEMA | CEA,WEA, WEMA[1:0] | CEA,WEA, WEMA[1:0] | CEA,WEA, WEMA[2:1] | |
| U_CA[15:8] | {ZSEL_BAB[15]}, {RST_S_BAB[14]}, {SWT_BAB[13]}, AB[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | {ZSEL_AAA[15]}, {RST_S_AAA[14]}, {SWT_AAA[13]}, AA[12:8] | |
| U_CA[7:0] | AB[7:0] | AA[7:0] | AA[7:0] | AA[7:0] | AA[7:0] | AA[7:0] | AA[7:0] | AA[7:0] | NC,NC,NC,NC NC,NC,RST_SRD_EN |
| U_A[23:16] | | | | | | | DA[17:16] | DA[23:16] | DI[23:16] |
| U_A[15:8] | | | | | DA[11:8] | DA[15:8] | DA[15:8] | DA[15:8] | DA[15:8] |
| U_A[7:0] | DA[3:0] | DA[5:0] | DA[7:0] | DA[8] DA[7:0] | DA[7:0] | DA[7:0] | DA[7:0] | DA[7:0] | DI[7:0] |
| ZJ_A[23:16] | | | | | | | QA[17:16] | QA[23:16] | WR_WORD_CNT[7:0] |
| ZJ_A[15:8] | | | | | | QA[15:8] | QA[15:8] | QA[15:8] | RD_WORD_CNT[7:0] |
| +5SOVEL,UDFL | | | | | | | | | {OVFL,UDFL, WR_ACK,VALID, |
| ZJ_A[7:0] | QA[3:0] | QA[5:0] | QA[7:0] | QA[8] QA[7:0] | QA[7:0] | QA[7:0] | QA[7:0] | QA[7:0] | PROG_EMPTY,EMPTY PROG_FULL,FULL,1 |

| RAM Pinout | 4K×4 | 4K×6 | 2K×8 | 2K×9 | 2K×12 | 1K×16 | 1K×18 | 1K×24 | |
|---|---|---|---|---|---|---|---|---|---|
| | | | | Port B Mapping | | | | | Port B - Read Port |
| U_CB[23:16] | CEB,WEB, NC,WEMB | CEB,WEB, NC,WEMB | CEB,WEB, NC,WEMB | CEB,WEB, NC,WEMB | CEB,WEB, NC,WEMB | CEB,WEB, WEMB[1:0] | CEB,WEB, WEMB[1:0] | CEB,WEB, WEMB[3:2] | |
| U_CB[15:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | {ZSEL_BAB[15]}, {RST_S_BAB[14]}, {SWT_BAB[13]}, AB[12:8] | |
| U_CB[7:0] | AB[7:0] | AB[7:0] | AB[7:0] | AB[7:0] | AB[7:0] | AB[7:0] | AB[7:0] | AB[7:0] | NC,NC,NC,NC NC,NC,NC,WR_EN |
| U_B[23:16] | | | | | | | DB[17:16] | DB[23:16] | |
| U_B[15:8] | | | | | DB[11:8] | DB[15:8] | DB[15:8] | DB[15:8] | |
| U_B[7:0] | DB[3:0] | DB[5:0] | DB[7:0] | DB[8] DB[7:0] | DB[7:0] | DB[7:0] | DB[7:0] | DB[7:0] | |
| ZJ_B[23:16] | | | | | | | QB[17:16] | QB[23:16] | DO[23:16] |
| ZJ_B[15:8] | | | | | | QB[15:8] | QB[15:8] | QB[15:8] | DO[15:8] |
| ZJ_B[7:0] | QB[3:0] | QB[5:0] | QB[7:0] | QB[8] QB[7:0] | QB[7:0] | QB[7:0] | QB[7:0] | QB[7:0] | DO[7:0] |

Embodiments of the register files 230, 232, 234, 236 include a 768-bits 2-port register file that has an independent read and write port. Each port can be independently configured from x8 widths to x24 widths. Byte-wide read and write enable signals are provided for the memory data ports. An exemplary RAM pinout of general mapping is shown in Table 3.

TABLE 3

| | |
|---|---|
| IR_C[23:0] | RAM Control Signals |
| IR[23:0] | Write Data Inputs |
| IR_CLKA | Write Clock A |
| ZR[23:0] | Data Output Pins |
| IR_CLKB | Read Clock B |
| IR_ACLR | Asynchronous Clear |

The RAM pins are connected to Logic and Routing Blocks (LRBs) in such a way that the data and address pins are able to access the internal local connections efficiently. The following tables explain the different modes of register files.

The pins from the 2-port register files 230, 232, 234, 236 connect to, for example, logic and routing blocks in the programmable logic fabric 120 in such a way that the data and address pins are able to access internal local connections efficiently. Table 4 illustrates an example of the various modes of operation for dual port memory pinout and pin mappings.

the signal processing units 311-316 is connected to a respective one of the bus-based dedicated connection boxes 301-306.

The first bus-based dedicated connection 301 receives a first bus-base input from the bus 321, a second bus-base input via the bus 325 from to the fourth bus-based dedicated connection box 304, a third bus-base input via the bus 354 from the second bus-based dedicated connection box, and generates a first bus-based output via the bus 322 to the fourth bus-based dedicated connection box 304, a second bus-based output via the bus 326, and a third bus-based output via the bus 351 to the second bus-based dedicated connection box 302. The first signal processing unit 311 is coupled to the first bus-based dedicated connection box 301 via a bus 307. The bus coupling between the signal processing unit 311 and the bus-based dedicated connection box 301 can be implemented with a single bus or multiple number of buses.

The second bus-based dedicated connection 302 receives a first bus-based input via the bus 351 from the first bus-based dedicated connection box 301, a second bus-based input via the bus 331, a third bus-based input via the bus 353 from the third bus-based dedicated connection box 303, a fourth bus-based input via the bus 355 from the fifth bus-based dedicated connection box 305, and generates a first bus-based output via the bus 352 to the third bus-based dedicated connection box 303, a second bus-based output via the bus 332 to the fifth bus-based dedicated connection box 305, a third bus-based

TABLE 4

| Register File Modes- Read & Write Port Mapping (Independently Configurable) | | | | | | | |
|---|---|---|---|---|---|---|---|
| | FFO | 32 × 24 | 32 × 18 | 32 × 16 | 64 × 12 | 64 × 9 | 64 × 8 |
| Read Data Mapping | | | | | | | |
| IR[23:16] | DI[23:16] | DI[23:16] | DI[17:16] | | | | |
| IR[15:8] | DI[5:8] | DI[5:8] | DI[5:8] | DI[5:8] | DI[11:8] | DI[8] | |
| IR[7:0] | DI[7:0] | DI[7:0] | DI[7:0] | DI[7:0] | DI[7:0] | DI[7:0] | DI[7:0] |
| Control Mapping | | | | | | | |
| IR_C[23:20] | | NC,WEM[2:0] | NC,WEM[1:0] | NC,WEM[1:0] | NC,NC,NC,WEM | NC,NC,NC,WEM | NC,NC,NC,WEM |
| IR_C[19:16] | | NC,NC,NC,WA[4] | NC,NC,NC,WA[4] | NC,NC,NC,WA[4] | NC,NC,WA[5:4] | NC,NC,WA[5:4] | NC,NC,WA[5:4] |
| IR_C[15:12] | | WA[3:0] | WA[3:0] | WA[3:0] | WA[3:0] | WA[3:0] | WA[3:0] |
| IR_C[11:8] | | WE,CEW,CER RST_S | WE,CEW,CER RST_S | WE,CEW,CER RST_S | WE,CEW,CER RST_S | WE,CEW,CER RST_S | WE,CEW,CER RST_S |
| IR_C [7:4] | | ZSEL_ANC, NC,RA[4] | ZSEL_ANC, NC,RA[4] | ZSEL_ANC, NC,RA[5:4] | ZSEL_ANC, NC,RA[5:4] | ZSEL_ANC, RA[5:4] | ZSEL_ANC, RA[5:4] |
| IR_C[3:0] | | RA[30] | RA[30] | RA[30] | RA[30] | RA[30] | RA[30] |
| Write Data Mapping | | | | | | | |
| | 32 × 24 | 32 × 18 | 32 × 16 | 64 × 12 | 64 × 9 | 64 × 8 | |
| ZR[23:16] | {DO[23], FULL}, {DO[22], EMPTY}, DO[21:16] | DO[23:16] | DO[17:16] | | | | |
| ZR[15:8] | DO[15:8] | DO[15:8] | DO[15:8] | DO[15:8] | DO[11:8] | DO[8] | |
| ZR[7:0] | DO[7:0] | DO[7:0] | DO[7:0] | DO[7:0] | DO[7:0] | DO[7:0] | DO[7:0] |

FIG. 6 is a block diagram illustrating a two-dimensional view of a bus architecture 300 including multiple bus-based dedicated connection boxes 301-306 and signal process units 311-316 (SPUs). Each of the bas-based dedicated connection boxes 301-306 facilitate configurable connections between different buses that are inputs and outputs from a particular base-based dedicated connection box. The bus-based dedicated connection boxes 301-306 are interconnected with various buses 321-326, 331-336, 341-346 and 351-358. Each of output via the bus 354 to the first bus-based dedicated connection box 301, a fourth bus-based output via the bus 336. The second signal processing unit 312 is coupled to the second bus-based dedicated connection box 302.

The third bus-based dedicated connection 303 receives a first bus-based input via the bus 352 from the second bus-based dedicated connection box 302, a second bus-based input via the based 341, a third bus-based input via the bus 345 from the sixth bus-based dedicated connection box 306, and generates a first bus-based output via the bus 346, a second bus-based output via the bus 345 to the sixth bus-based dedicated connection box 306. The third signal processing unit 313 is coupled to the third bus-based dedicated connection box 303.

The fourth bus-based dedicated connection 304 receives a first bus-based input via the bus 322 from the first bus-based dedicated connection box 301, a second bus-based input via the bus 358 from the fifth bus-based dedicated connection box 305, a third bus-based input via the bus 324, and generates a first bus-based output via the bus 323, a second bus-based output via the bus 325. The fourth signal processing unit 314 is coupled to the fourth bus-based dedicated connection box 304.

The fifth bus-based dedicated connection 305 receives a first bus-based input via the bus 355 from the fourth bus-based dedicated connection box 304, a second bus-based input via the bus 332 from the bus-based dedicated connection box 302, a third bus-based input via the bus 357 from the sixth bus-based dedicated connection box 306, a fourth bus-based input via the bus 334, and generates a first bus-based output via the bus 355 to the sixth bus-based dedicated connection box 306, a second bus-based output via the bus 333, a third bus-based output via the bus 358 to the fourth bus-based dedicated connection box 304, a fourth bus-based output via the bus 335 to the second bus-based dedicated connection box 302. The fifth signal processing unit 315 is coupled to the fifth bus-based dedicated connection box 305.

The sixth bus-based dedicated connection 306 receives a first bus-based input via the bus 356 from the fifth bus-based dedicated connection box 305, a second bus-based input via the bus 342 from the third bus-based dedicated connection box 303, a third bus-based input via the bus 344, and generates a first bus-based output via the bus 343, a second bus-based output via the bus 345 to the third bus-based dedicated connection box 303. The sixth signal processing unit 316 is coupled to the sixth bus-based dedicated connection box 306.

FIG. 7 is a block diagram illustrating a two-dimensional view of the bus-based dedicated connection box 301 for routing one or more bus-based inputs to one or more bus-based outputs. The bus-based dedicated connection box 301 received one or more bus-based inputs and generates one or more bus-based outputs to one or more among the four compass directions, a north N compass direction 410, a south S compass direction 420, a west W compass direction 430 and an east E compass direction 440. Although the width of a bus in the bus-based dedicated connection box 301 is shown as m-bit, other bit numbers for a bus, or a combination of buses, can be selected for use in the bus-based dedicated connection box 301.

In the south compass direction 420, buses 421, 422, 423 are entering the bus-based connection box 430 from the south compass direction 420. Buses 424, 425, 426 are exiting the bus-based connection box 301 toward the south compass direction 420.

In the west compass direction 430, buses 431, 432, 433 are entering the bus-based connection box 301 from the west compass direction 430. Buses 434, 435, 436 are exiting the bus-based connection box 301 toward the west compass direction 430. Buses 437, 438, 439 are entering the bus-based connection box 301 from the programmable logic fabric 120. Buses 481, 482, 483 are exiting the bus-based connection box 301 toward the programmable fabric logic 120.

In the north compass direction 410, buses 411, 412, 413 are entering the bus-based connection box 410 from the north compass direction 410. Buses 414, 415, 416 are exiting the bus-based connection box 301 toward the north compass direction 410. The bus-based output 414 receives one of the possible bus-based inputs by transferring the bus-based input 431 through a bus 450 to the bus-based output 414, transferring the bus-based input 437 through a bus 451 to the bus-based output 414, transferring the bus-based input 423 through a bus 452 to the bus-based output 414, or transferring a bus-based input 441 through a bus 454 to the bus-based output 414.

In the east compass direction 440, buses 441, 442, 443 are entering the bus-based connection box 301 from the east compass direction 440. Buses 444, 445, 446 are exiting the bus-based connection box 301 toward the east compass direction 440. Buses 447, 448, 449 are entering the bus-based connection box 301 from the FPU/MAC 210. Buses 491, 492, 493 are exiting the bus-based connection box 301 toward the FPU/MAC 210.

The bus-based output 419 receives one of the possible bus-based inputs by transferring the bus-based input 443 through a bus 460 to the bus-based output 419, transferring the bus-based input 432 through a bus 461 to the bus-based output 419, transferring the bus-based input 462 through a bus 462 to the bus-based output 419, or transferring a bus-based input 422 through a bus 463 to the bus-based output 419.

FIG. 8 is a circuit diagram illustrating a multiplexer 500 for routing bus-based connections with selectable configurable bits. The multiplexer 500 receives a plurality of bus-based inputs A 510, B 512, C 514 and D 516, each of which is a bus width of m, for example, 48 bits. The multiplexer 500 includes configuration bits S0 520, S1 522, which select which one of the bus-based inputs A 510, B 512, C 514 and D 516 to connect to an output Y 530, which has m-wide bus. For example, the multiplexer 500, disposed inside the bus-based dedicated connection 301, can be used to select from among one of the incoming bus-based inputs 431, 437, 423, 441 to the bus-based output 414, depending on the selection combination of the configuration bits S0 520, S1 522.

FIG. 9 is a simplified circuit diagram illustrating the bus-based dedicated connection box 301 that includes a multiple number of multipliers 600, 630, 660 for routing bus-based inputs to bus-based outputs with configuration bits 520, 522. The selection as to which bus input, such as bus A, bus B, bus C, or bus D is selected for routing to an output bus is determined by two select bits, S0 520 and S1 521. Table 5 below summarizes a truth table on the selection of select bits and a corresponding output bus.

TABLE 5

| S1 | S0 | Bus |
|---|---|---|
| 0 | 0 | A |
| 0 | 1 | B |
| 1 | 0 | C |
| 1 | 1 | D |

Suppose the two selection bits S0 520 and S1 522 are set as follows: S0=0 and S1=0. The first selection bit S0 520 is equal to a logic 0 at an input of an inverter 680. The inverter 680 generates an output of 1. An inverter 682 receives an input of 1 from the inverter 680 and generates an output of 0. The second selection bit S1 522 is equal to a logic 0 at an input of an inverter 690. The inverter 690 generates an output of 1. An inverter 692 receives an input of 1 from the inverter 690 and generates an output of 0.

The inverter 680 generates an output of 1 for the selection bit S0 520, and triggers a transistor 610 to turn on in passing an input 601 A0. The inverter 690 generates an output of 1 for selection bit S1 522, and triggers a transistor 614 to turn on in passing the A0 through the transistor 614. An inverter 710 receives an input of A0 from the transistor 614 and generates an inverted output Y[0] to the bus A. If the value of A0 is a binary 0, then the output will be a binary 1. If the value of A0 is a binary 1, then the output will be a binary 0.

If selection bit S0 520 is equal to 0 and selection bit S1 522 is equal to 1, then input bus B will be selected. If selection bit S0 520 is equal to 1 and selection bit S1 522 is equal to 0, then input bus C will be selected. If selection bit S0 520 is equal to 1 and selection bit S1 522 is equal to 1, then input bus D will be selected.

FIG. 10 is a circuit diagram 700 illustrating an application of the signal processing engine for processing a finite impulse response (FIR) with single precision. The circuit 700 comprises a series of signal process engines cascaded in a delayed chain that are coupled to fabric 120, which is further coupled to pads 710, 712. The output of the final impulse response is represented by the symbol Y(n), and the input of the finite impulse response is represented by X(n).

Signal processing engines 720, 730, 740, 750 are cascaded in a delay chain. The first signal processing engine 720, which includes the signal processing unit 311 and the bus-based dedicated connection box 301, receives an input X(n) from the pad 710 through the fabric 120. The signal processing unit 311 has a first FPU/MADD 722 for performing a multiply operation and a second FPU/MAC 724 for performing an add operation. The first FPU/MAC 722 multiplies a constant value $C_0$ 726 with an input value $X_0$ 727. A first delay circuit 721 is disposed before a signal reaches the first FPU/MADD 722. A second delay circuit 723 is connected between the first FPU/MADD 722 and the second FPU/MADD 724. A third delay circuit 725 is disposed after the second FPU/MADD 725.

The second signal processing engine 730, which includes the signal processing unit 312 and the bus-based dedicated connection box 302, receives an input $X_0$ 727 from the first signal processing engine 720. The signal processing unit 312 has a first FPU/MADD 732 for performing a multiply operation and a second FPU/MADD 734 for performing an add operation. The first FPU/MADD 732 multiplies a constant value $C_1$ 736 with an input value $X_1$ 737. A first delay circuit 731 is disposed before a signal reaches the first FPU/MADD 732. A second delay circuit 733 is connected between the first FPU/MADD 732 and the second FPU/MADD 734. A third delay circuit 735 is disposed after the second FPU/MADD 735.

The third signal processing engine 740, which includes the signal processing unit 313 and the bus-based dedicated connection box 303, receives an input $X_1$ 737 from the second signal processing engine 730. The signal processing unit 313 has a first FPU/MADD 742 for performing a multiply operation and a second FPU/MADD 744 for performing an add operation. The first FPU/MADD 742 multiplies a constant value $C_2$ 746 with an input value $X_2$ 747. A first delay circuit 741 is disposed before a signal reaches the first FPU/MADD 742. A second delay circuit 743 is connected between the first FPU/MADD 742 and the second FPU/MADD 744. A third delay circuit 745 is disposed after the second FPU/MADD 745.

The fourth signal processing engine 750, which includes the signal processing unit 316 and the bus-based dedicated connection box 306, receives an input $X_2$ 747 from the third signal processing engine 740. The signal processing unit 316 has a first FPU/MADD 752 for performing a multiply operation and a second FPU/MADD 754 for performing an add operation. The first FPU/MADD 752 multiplies a constant value $C_1$ 756 with an input value $X_1$ 757. A first delay circuit 751 is disposed before a signal reaches the first FPU/MADD 752. A second delay circuit 753 is connected between the first FPU/MADD 752 and the second FPU/MADD 754. A third delay circuit 755 is disposed after the second FPU/MADD 755. The output for the finite impulse response can be represented by the following equation:

$$Y(n) = C_0 X_0 + C_1 X_1 + C_2 X_2 + C_3 X_3$$

where each parameter $C_0$, $C_1$, $C_2$, $C_3$ represents a constant coefficient or pre-calculated constant value.

A second exemplary application of the signal processing engine for processing an infinite impulse response is shown in a circuit diagram 800 in FIG. 11.

FIG. 12 is a block diagram illustrating a third exemplary application of the signal processing engine for processing a complex multiply-add operation with a complex multiply-add logic 900, which can be implemented in a signal processing engine. In this example, the complex multiply-add logic 900 receives a signal $A_R$ 912 from the programmable logic fabric 120, a signal $A_I$ 910 from the programmable logic fabric 120, a signal $B_R$ 960, a signal $B_I$ 940, a signal $C_R$ 920 from a signal processing engine and a signal $C_I$ 922 from a signal processing engine. Each of the parameters $\bar{A}$, $\bar{B}$, $\bar{C}$ has a real component and an imaginary component, which can be represented mathematically in the following three equations:

$$\bar{A} = A_R + jA_I \qquad \text{Eq. (1)}$$

where the symbol $A_R$ denotes a real component, and the symbol $jA_I$ denotes an imaginary component. The parameter $\bar{B}$ is defined as follows:

$$\bar{B} = B_R + jB_I \qquad \text{Eq. (2)}$$

where the symbol $B_R$ denotes a real component, and the symbol $jB_I$ denotes an imaginary component. The parameter $\bar{C}$ is defined as follows:

$$\bar{C} = C_R + jC_I \qquad \text{Eq. (3)}$$

where the symbol $C_R$ denotes a real component, and the symbol $jC_I$ denotes an imaginary component.

The complex multiply-add circuit 900 performs a multiply operation and an add operation of the three parameters $\bar{A}$, $\bar{B}$, $\bar{C}$, as represented by the following equation:

$$SUM = \bar{A} \times \bar{B} + \bar{C} \qquad \text{Eq. (4)}$$

The calculation of the multiply-operation for Equation 4 can be expanded as shown below:

$$SUM = (A_R + jA_I) \times (B_R + jB_I) + (C_R + jC_I) = (A_R \times B_R - A_I \times B_I + C_R) + j(A_R \times B_I + A_I \times B_R + C_I)$$

The signal processing engine 110, which includes a signal processing unit and a bus-based connection box, performs the computations in the multiply-add operation of $\bar{A}$, $\bar{B}$, $\bar{C}$, to generate an output $SUM$ of $S_R$ and $S_I$, which equates to $(A_R \times B_R - A_I \times B_I + C_R)$ for the parameter $S_R$ and $(A_R \times B_I + A_I \times B_R + C_I)$ for the parameter $S_I$.

In this embodiment, the complex multiply-add logic 900 comprises four signal processing units and bus-based dedicated connection boxes, the signal processing unit 312 and the bus-based dedicated connection box 302, the signal processing unit 311 and the bus-based dedicated connection box 301, the signal processing unit 315 and the bus-based dedicated connection box 305, and the signal processing unit 314 and the bus-based dedicated connection box 304. The signal processing unit 312 and the bus-based dedicated connection box 302 receive an input 910 $A_I$, an input $C_R$ 920 from a signal processing engine, and the input $B_I$ 940, computes a term of $-A_I B_I + C_R$, and generates an output term $-A_I B_I + C_R$ 942. The signal processing unit 315 and the bus-based dedicated connection box 305 receives an input $C_I$ 922 from a signal processing engine, an input of BR 950, an input $A_I$ 910 from the signal process unit 312 and the bus-based dedicated connection box 302, computes a term of $A_I B_R+C_I$, and generates an output of $A_I B_R+C_I$ 962 and an output $B_R$ 950. The signal processing unit 311 and the bus-based dedicated connection box 301 receives the input $A_R$ 912 from the programmable logic fabric 120, an input of $-A_I B_I+C_R$, an input $B_I$ 940, and an input $B_R$ 950, and computes a term of $A_R B_R-A_I B_I+C_R$ where an FPU serves as both a multiplier and an adder. The signal processing unit 311 and the bus-based dedicated connection box 301 generates an output $B_I$ 940, an output $A_R$ 912, and an output 930 to a signal processing engine. The signal processing unit 314 and the bus-based dedicated connection box 304 receive an input $B_I$ 970, an input $A_R$ 972, a $B_R$ 960, an input of $A_I B_R+C_R$ 962, and generates an output 932 to a signal processing engine.

The applications described above are intended as sample illustrations. The present invention is applicable to a wide array of high end signal processing applications including radar/sonar, medical imaging, synthetic aperture radar, professional video broadcast and encoding and high end image processing.

FIGS. 13A-13B are block diagrams illustrating a fourth exemplary application of the signal processing engine for processing a radix-2 butterfly. The inputs of X(k+1) 1010 and X(k) 1020 are represented in the following two equations.

$$X(k+1)=X_R(k+1)+jX_I(k+1)$$

$$X(k)=X_R(k)+jX_I(k)$$

The outputs of Y(k+1) 1012 and Y(k) 1022 of the radix 2-butterfly are shown in the following two equations.

$$Y(k+1)=Y_R(k+1)+jX_I(k+1)$$

$$Y(k)=Y_R(k)+jY_I(k)$$

Therefore, the computation of Y(k+1) is described below:

$$Y(k+1)=W_N^k \cdot X(k)+X(k+1)=(C+jS)[X_R(k)+jX_I(k)]+X_R(k+1)+jX_I(k+1)\}=\{CX_R(k)-SX_I(k)+X_R(k+1)\}+jY_R \{(k+1)\}+j\{CX_I(k)+SX_R(k)+X_I(k+1)\}/Y_I(k+1)\}$$

FIG. 13B is a block diagram illustrating a system 1000 of the fourth exemplary application of the signal processing engine for processing a radix-2 butterfly. The system 1000 includes the signal processing unit 313 and the bus-based dedicated connection box 303, the signal processing unit 312 and the connection box and the bus-based dedicated connection box 302, the signal processing unit 311 and the connection box and the bus-based dedicated connection box 301, the signal processing unit 316 and the connection box and the bus-based dedicated connection box 306, the signal processing unit 315 and the connection box and the bus-based dedicated connection box 305, and the signal processing unit 314 and the connection box and the bus-based dedicated connection box 304. The signal processing unit 313 and the bus-based dedicated connection box 303, which are coupled to a random access memory 1032 for storing a variable C, receive an input of $X_R(k)$ 1031, an input of $X_R(k+1)$ 1035 from the signal processing unit 312 and the bus-based dedicated connection box 302, compute the term of $f_{00}$ 1030=$X_R(k+1)+X_R$ (k)C, and generate an output $f_{00}$ 1033 to the signal processing unit 312 and the bus-based dedicated connection box 302, an output of $X_R(k)$ 1034 to the signal processing unit 312 and the bus-based dedicated connection box 302, and an output of C 1036 to the signal processing unit 316 and the connection box and the bus-based dedicated connection box 306.

The signal processing unit 312 and the bus-based dedicated connection box 302, which are coupled to a random access memory 1032 for storing a variable C, receive an input of $f_{00}$ 1033, an input of $X_R(k)$ 1034, an input of $X_R(k+1)$ 1044 from the signal processing unit 311 and the connection box and the bus-based dedicated connection box 301, an input $X_I(k)$ 1073 from the signal processing unit 315 and the connection box and the bus-based dedicated connection box 305, compute the term of $f_{01}$ 1040=$Y_R(k+1)=f_{00}-X_I(k)S$, and generate an output of $Y_R(k+1)$ 1042 to the signal processing unit 311 and the connection box and the bus-based dedicated connection box 301, an output of $X_R(k)$ 1071 to the signal processing unit 315 and the connection box and the bus-based dedicated connection box 305, and an output S 1072 to the signal processing unit 315 and the connection box and the bus-based dedicated connection box 305.

The signal processing unit 311 and the bus-based dedicated connection box 301 receive an input of $Y_R(k+1)$ 1042 from the signal processing unit 312 and the connection box and the bus-based dedicated connection box 302, an input of $X_R(k+1)$ 1043 from the signal processing unit 312 and the connection box and the bus-based dedicated connection box 302, computes the term of $f_{02}$ 1050=$Y_R(k) 2X_R(k+1)-Y_R(k+1)$, and generates an output of $Y_R(k)$ 1051.

The signal processing unit 316 and the bus-based dedicated connection box 306, which are coupled to a random access memory 1062, receive an input of $X_I(k)$ 1061, an input of C 1036 from the signal processing unit 313 and the bus-based dedicated connection box 303, an input of $X_I(k+1)$ 1065 from the signal processing unit 315 and the bus-based dedicated connection box 305, compute the term of $f_{10}$ 1060=$X_I(k+1)+X_I(k)C$, and generate an output of $X_I(k)$ 1063 to the signal processing unit 315 and the bus-based dedicated connection box 305, and an output of $f_{10}$ 1064 to the signal processing unit 315 and the bus-based dedicated connection box 305.

The signal processing unit 315 and the bus-based dedicated connection box 305 receive an input of $X_I(k)$ 1063 from the signal processing unit 316 and the bus-based dedicated connection box 306, an input of $f_{10}$ 1063 from the signal processing unit 316 and the bus-based dedicated connection box 306, an input of S 1072 from the signal processing unit 312 and the bus-based dedicated connection box 302, an input of $X_I(k)$ 1073 from the signal processing unit 315 and the bus-based dedicated connection box 305, an input of $X_I(k+1)$ 314 from the signal processing unit 316 and the bus-based dedicated connection box 304, compute the term of $f_{11}$ 1070=$Y_I(k+1)$ =$f_{10}+X_R(k)S$, and generate an output of $X_I(k+1)$ 1065 to the signal processing unit 316 and the bus-based dedicated connection box 306, an output of $X_I(k)$ 073 to the signal processing unit 312 and the bus-based dedicated connection box 302, and an output of $Y_I(k+1)$ 1074 to the signal processing unit 314 and the bus-based dedicated connection box 304.

The signal processing unit 314 and the bus-based dedicated connection box 304 receive an input of $Y_I(k+1)$ 1074 from the signal processing unit 315 and the bus-based dedicated connection box 305, an input of $X_I(k+1)$ 1075, compute the term $f_{02}$ 1080=$Y_I(k)=2X_I(k+1)-Y_I(k+1)$, generate an output of $X_I(k+1)$ 1076 to the signal processing unit 315 and the bus-based dedicated connection box 305, and generate an output of $Y_I(k)$ 1081.

FIG. 14 is a flow diagram illustrating the process 1100 executed in a configurable integrated circuit employing signal processing engines for serial computations. At step 1110, the first signal processing unit 311 receives an input A and performs a first computation to generate a bus-based output B. The bus-based dedicated connection box 301 routes 1120 the bus-based input B from a first source compass direction to a bus-based output C in a first destination compass direction. At step 1130, the second signal processing unit 312 receives the input C and performs a second computation to generate a bus-based output D. The bus-based dedicated connection box 302 routes 1140 the bus-based input D from a second source compass direction to a bus-based output E in a second destination compass direction. At step 1150, the third signal processing unit 313 receives the input E and performs a third computation to generate a bus-based output F. The bus-based dedicated connection box 303 routes 1160 the bus-based input F from a third source compass direction to a bus-based output G in a third destination compass direction to generate a bus-based output H. The first, second, third source compass directions, and the first, second, third destination compass directions can be any compass direction including a north compass direction, a south compass direction, a west compass direction and an east compass direction.

FIG. 15 is a flow diagram illustrating the process 1200 executed in a configurable integrated circuit employing signal processing engines for parallel computations. Steps 1210, 1212 occur in parallel with steps 1220, 1222. At step 1210, the first signal processing unit 311 receives an input A and performs a first computation to generate a bus-based output B. The first bus-based dedicated connection box 302 routes 1212 the bus-based input B from a first source compass direction to a bus-based output C in a first destination compass direction. At step 1230, the third signal processing unit 313 receives an input D and performs a second computation to generate a bus-based output E. The third bus-based dedicated connection box 313 routes 1222 the bus-based input E from a second source compass direction to a bus-based output F in a second destination compass direction. At step 1220, the second signal processing unit 312 receives two bus-based inputs C, F from the first and third signal process units 311, 313 and performs a third computation to generate bus-based output G. The second bus-based dedicated connection box 312 routes 1230 the bus-based input G from a third source compass direction to a bus-based output H in a third destination compass direction.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A programmable logic integrated system, comprising:
a logic and routing block having a plurality of dedicated logic cells, each dedicated logic cell having a first logic and routing cell and a second logic and routing cell;
a first configurable dedicated connection circuit having a plurality of bus-based inputs, a plurality of bus-based outputs, and a multiplexer, the multiplexer having configuration bits for routing a first bus-based input in the plurality of bus-based inputs via a first bus to a first bus-based output in the plurality of bus-based outputs;
one or more first dedicated lines connecting from the first logic and routing cell in the first dedicated logic cell of the logic and routing block to the first bus-based input in the first configurable dedicated connection circuit; and
one or more second dedicated lines connecting from the first bus-based output in the first configurable dedicated connection circuit to the first logic and routing cell in the first dedicated logic cell of the logic and routing block.

2. The system as recited in claim 1, further comprising a second configurable dedicated connection circuit, coupled to the first configurable dedicated connection circuit, having a plurality of bus-based inputs, a plurality of bus-based outputs, and a multiplexer, the multiplexer having configuration bits for routing a first input-based bus in the plurality of dedicated bus-based inputs via a bus to a first bus-based output in the plurality of bus-based outputs.

3. The system as recited in claim 2, further comprising a first signal processing unit, coupled to the first dedicated connection circuit, for serving as a first functional computing circuit.

4. The system as recited in claim 3, further comprising a second signal processing unit, coupled to the second dedicated connection circuit, for serving as a second functional computing circuit.

5. The system as recited in claim 1, wherein the first bus-based input in the plurality of bus-based inputs is coupled to the first bus-based output in the plurality of bus-based outputs via the first bus in a first compass direction.

6. The system as recited in claim 5, wherein the first bus-based input in the plurality of bus-based inputs is coupled to a second bus-based output in the plurality of bus-based outputs via a second bus in a second compass direction.

7. The system as recited in claim 1, wherein the first compass direction comprises a north compass direction, a south compass direction, an east compass direction, or a west compass direction.

8. The system as recited in claim 6, wherein the second compass direction comprises a north compass direction, a south compass direction, an east compass direction, or a west compass direction.

9. The system as recited in claim 6, wherein the first compass direction and the second compass direction are the same.

10. The system as recited in claim 6, wherein the first compass direction and the second compass direction are different.

11. The system as recited in claim 6, wherein the plurality of bus-based inputs having a bus-based input with a first bus width, the plurality of bus-based outputs having a bus-based output with a second bus width, the first bus width in the bus-based input being the same size width as the second bus width in the bus-based output.

12. The system as recited in claim 6, wherein the first bus-based input having a first bus width and the first bus-based output having a second bus width, the first bus width in the first bus-based input being a different size width as the second bus width in the first bus-based output.

13. The system as recited in claim 6, wherein the first bus-based input in the plurality of bus-based inputs having a bus width of 24-bit, 32-bit, 48-bit, or 64-bit.

14. The system as recited in claim 6, wherein the first bus-based output in the plurality of bus-based outputs having a bus width of 24-bit, 32-bit, 48-bit, or 64-bit.

15. The bus-based system of claim 6, wherein the plurality of input buses comprise a second bus-based input, the multiplexer routing both the first bus-based input via first bus and the second bus-based input buses via a second bus from the first compass direction to the first bus-based output in the second compass direction, each of the first and second bus-based inputs buses having a narrow bus width, the first bus-based output having a wide bus width.

16. The system as recited in claim 15, wherein the narrow bus width in the first and second bus-based inputs is 24-bit wide, and the wide bus in the first bus-based output is 48-bit wide.

* * * * *